United States Patent
Plochowietz et al.

(10) Patent No.: US 11,148,941 B2
(45) Date of Patent: Oct. 19, 2021

(54) METHOD OF CONTROLLING PLACEMENT OF MICRO-OBJECTS

(71) Applicant: Palo Alto Research Center Incorporated, Palo Alto, CA (US)

(72) Inventors: Anne Plochowietz, Palo Alto, CA (US); Eugene M. Chow, Palo Alto, CA (US); Jengping Lu, Fremont, CA (US); Julie A. Bert, East Palo Alto, CA (US); David K. Biegelsen, Portola Valley, CA (US); Bradley Rupp, San Francisco, CA (US); Sourobh Raychaudhuri, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 242 days.

(21) Appl. No.: 16/237,316

(22) Filed: Dec. 31, 2018

(65) Prior Publication Data
US 2020/0207615 A1    Jul. 2, 2020

(51) Int. Cl.
| | |
|---|---|
| *H01S 4/00* | (2006.01) |
| *B81C 3/00* | (2006.01) |
| *B81C 1/00* | (2006.01) |
| B82Y 30/00 | (2011.01) |
| B82Y 40/00 | (2011.01) |

(52) U.S. Cl.
CPC .......... *B81C 3/004* (2013.01); *B81C 1/00031* (2013.01); *B81B 2203/04* (2013.01); *B81B 2207/056* (2013.01); *B81C 2201/0149* (2013.01); *B82Y 30/00* (2013.01); *B82Y 40/00* (2013.01); *Y10T 29/49002* (2015.01)

(58) Field of Classification Search
CPC ....... Y10T 428/24372; Y10T 29/49002; Y10T 29/4913; Y10T 29/49131; H01L 21/67271; H01L 2933/0066; H01L 25/0655; H01L 25/50; B81C 3/004
USPC ............... 29/592.1, 593, 832, 833, 834, 836
See application file for complete search history.

(56) References Cited

U.S. PATENT DOCUMENTS 10,558,204 B2 * 2/2020 Matei ............... G05B 19/41885

FOREIGN PATENT DOCUMENTS

EP          3296824 A1     3/2018

OTHER PUBLICATIONS

Extended European Search Report dated May 15, 2020 for European Patent Application No. 19219921.4.

* cited by examiner

*Primary Examiner* — Thiem D Phan
(74) *Attorney, Agent, or Firm* — Womble Bond Dickinson (US) LLP

(57) ABSTRACT

Disclosed are methods and systems of controlling the placement of micro-objects on the surface of a micro-assembler. Control patterns may be used to cause phototransistors or electrodes of the micro-assembler to generate dielectrophoretic (DEP) and electrophoretic (EP) forces which may be used to manipulate, move, position, or orient one or more micro-objects on the surface of the micro-assembler.

13 Claims, 54 Drawing Sheets

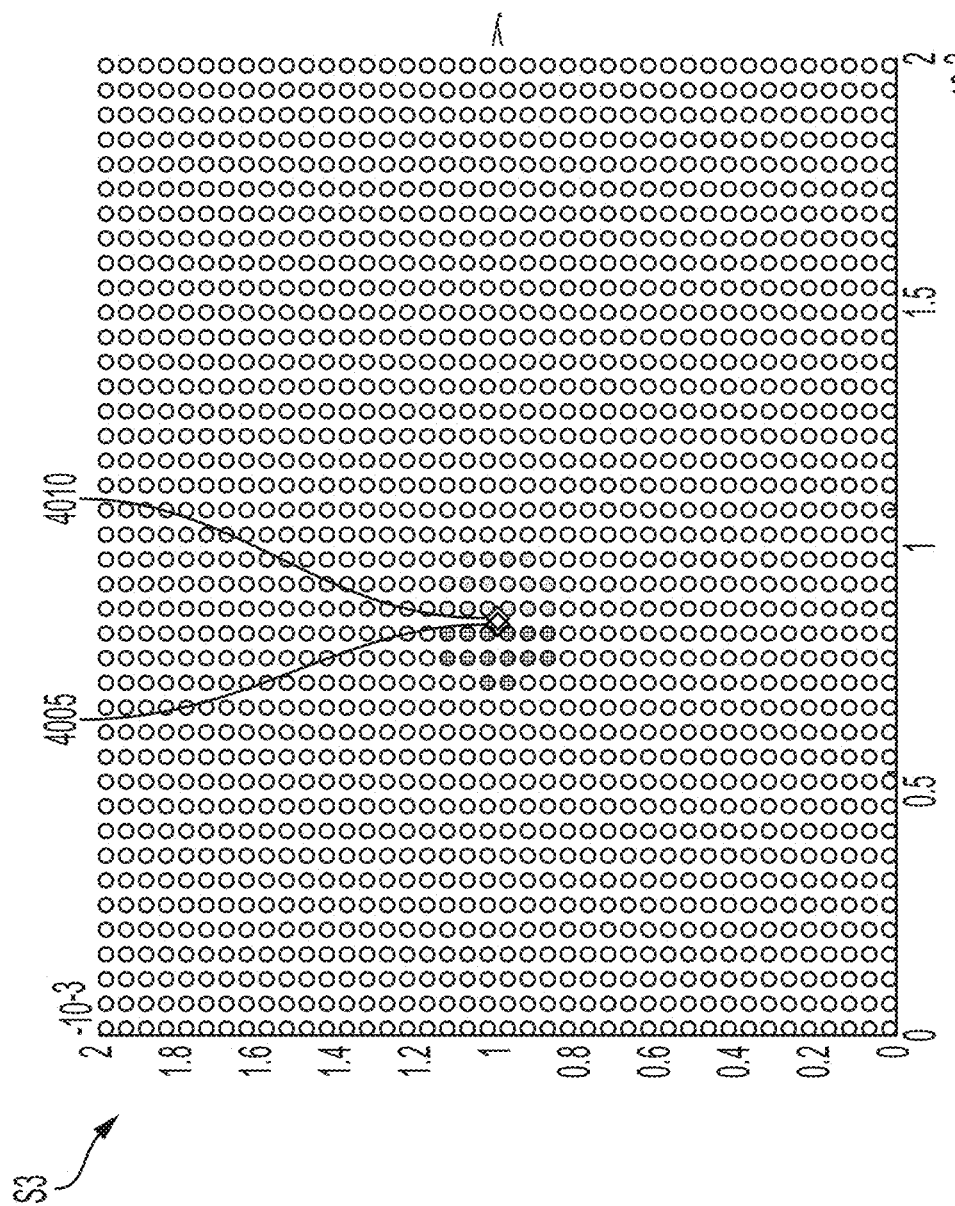

METHOD OF CONTROLLING PLACEMENT OF MICRO-OBJECTS

STATEMENT REGARDING FEDERALLY SPONSORED RESEARCH AND DEVELOPMENT

This invention was made with government support under Contract No. FA8650-15-C-7544 DARPA-A2P-Assembler awarded by the Defense Advanced Research Projects Agency. The Government has certain rights in this invention.

TECHNICAL FIELD

Implementations of the present disclosure relate to controlling the placement of one or more micro-objects on a surface.

BACKGROUND

Micro-objects may be small objects or particles that may be used for various purposes in the manufacture and construction of various devices. For example a micro-object may be an object that ranges in size from 1 micrometer to 500 micrometers, although other sizes may be possible. The micro-objects may also be charge encoded micro-objects or magnetic field pattern encoded micro-objects. For example, a micro-object may have a positive charge or may be charged with a specific pattern.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIGS. 40A-40C illustrate how applied voltage pattern can manipulate a micro-object to arrive at a target location, in accordance with some embodiments of the present disclosure.

DETAILED DESCRIPTION

As discussed above, micro-objects may be small objects or particles that may be used for various purposes in the manufacture and construction of various devices. Placement of the micro-objects into the proper position and orientation may be difficult due to the small size of the micro-objects. For example, forming a set of micro-objects into a specific shape or pattern may be difficult due to their small size. In another example, selecting a set of micro-objects from a large pool or reservoir of micro-objects may also be difficult.

The examples, implementations, and embodiments described herein allow micro-objects to be placed along the surface of a micro-assembler using an array of phototransistors. The phototransistors, when exposed to light, may be used to switch one or more of a positive voltage, a negative voltage, and an AC voltage, to charge capacitors on the surface of the micro-assembler that may generate one or more of dielectrophoretic (DEP) and electrophoretic (EP) forces. The DEP and EP forces may be used to manipulate single micro-objects or groups of micro-objects that may comprise functionally identical or distinct micro-objects. This may allow the micro-assembler to more precisely and more quickly manipulate micro-objects, and place them or orient them in specific locations, shapes, or patterns. Control patterns which may be formed by an optical image may be used to control the phototransistors or other devices that may generate an electric field (e.g., electrodes, transistors, phototransistors, capacitors, etc.). Control patterns may also indicate a voltage pattern for at least a portion of the micro-assembler. Utilizing a light emitting device to generate optical image control patterns or voltage patterns may allow a computing device to automatically form or place micro-objects into shapes or patterns. User input may also be used to manually move or position one or more micro-object. A camera may be used to view the micro-assembler surface and micro-object position and orientation. Other devices may be used to detect the positions and orientations of micro-objects on the micro-assembler surface.

Figure 1:
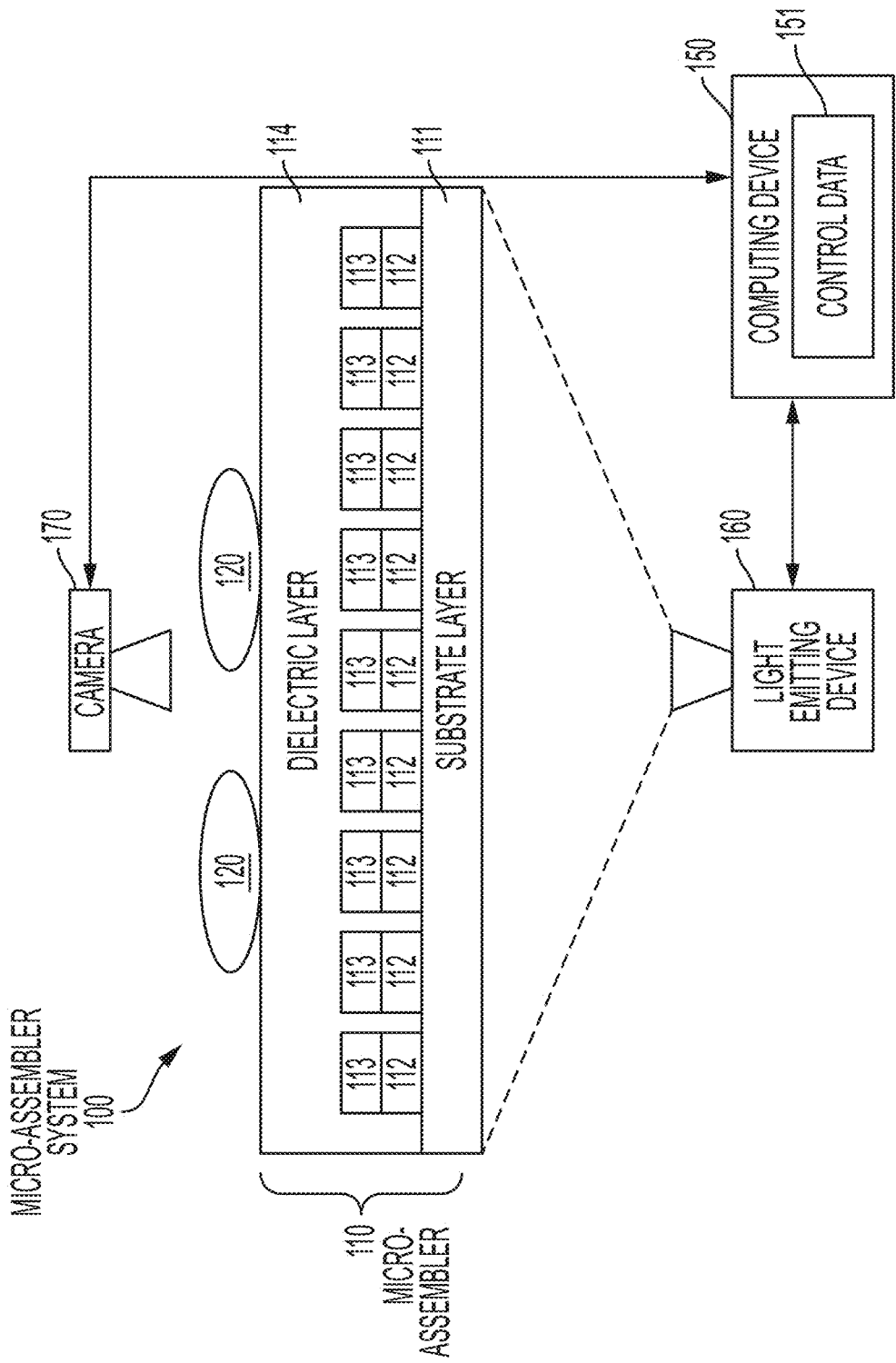
FIG. 1 is a schematic diagram of depicting an embodiment of a micro-assembler system for controlling placement of micro-objects, in accordance with some embodiments of the present disclosure.

FIG. 1 is a schematic diagram of depicting an embodiment of a micro-assembler system 100 for controlling placement of micro-objects 120, in accordance with some embodiments of the present disclosure. The micro-assembler system 100 includes a micro-assembler 110, a computing device 150, a light emitting device 160, and a camera 170. The micro-assembler system may be used to move, hold in place, or control the placement (e.g., control one or more of the position or orientation) of the micro-objects 120. In other embodiments, a device that may measure electric fields, magnetic fields, capacitances, etc., may be used in addition to or in place of camera 170.

In one embodiment, the computing device 150 may be any suitable type of computing device or machine that includes one or more programmable processors (e.g., a multi-core processor, one or more central processing units (CPUs), etc.). For example, a computing device 150 may be one or more server computers, desktop computers, laptop computers, tablet computers, smartphones, set-top boxes, gaming consoles, personal digital assistants (PDAs), etc. In some examples, a computing device may comprise a single machine or may include multiple interconnected machines (e.g., multiple server computers configured in a cluster). In another embodiment, the light emitting device 160 may be a device that is capable of emitting or transmitting a light pattern. The light may be visible light (e.g., white light), collimated light, or non-visible light (e.g., infrared (IR) light, ultraviolet (UV) light, etc.). For example, a light emitting device 160 may be a red LED or laser, a green LED or laser, a UV LED or laser, an IR LED or laser, a broadband halogen, fluorescent or halogen lamp, etc. The patterning device could be a digital projector (DLP) or liquid crystal.

The micro-assembler 110 includes a substrate layer 111, phototransistors 112, capacitors 113, and a dielectric layer 114. The substrate layer 111 may be a layer of material where the phototransistors 112 may be placed. In one embodiment, the substrate layer 111 may be a glass substrate. In another embodiment, the substrate layer 111 may be transparent or semi-transparent in the wavelength range of the light emitting device.

The phototransistors 112 may be located on a top surface of the substrate layer 111. The capacitors 113 may be located on top of or beside the phototransistors 112. The phototransistors 112 and the capacitors 113 may be located within the dielectric layer 114. The dielectric layer 114 may be made of a material that is an electrical insulator. The material may also be polarized by an applied electric field. The micro-objects 120 may be located or deposited on a top surface of the dielectric layer 114. The top surface of the dielectric layer 114 may also be a surface of the micro-assembler 110.

Figure 2:
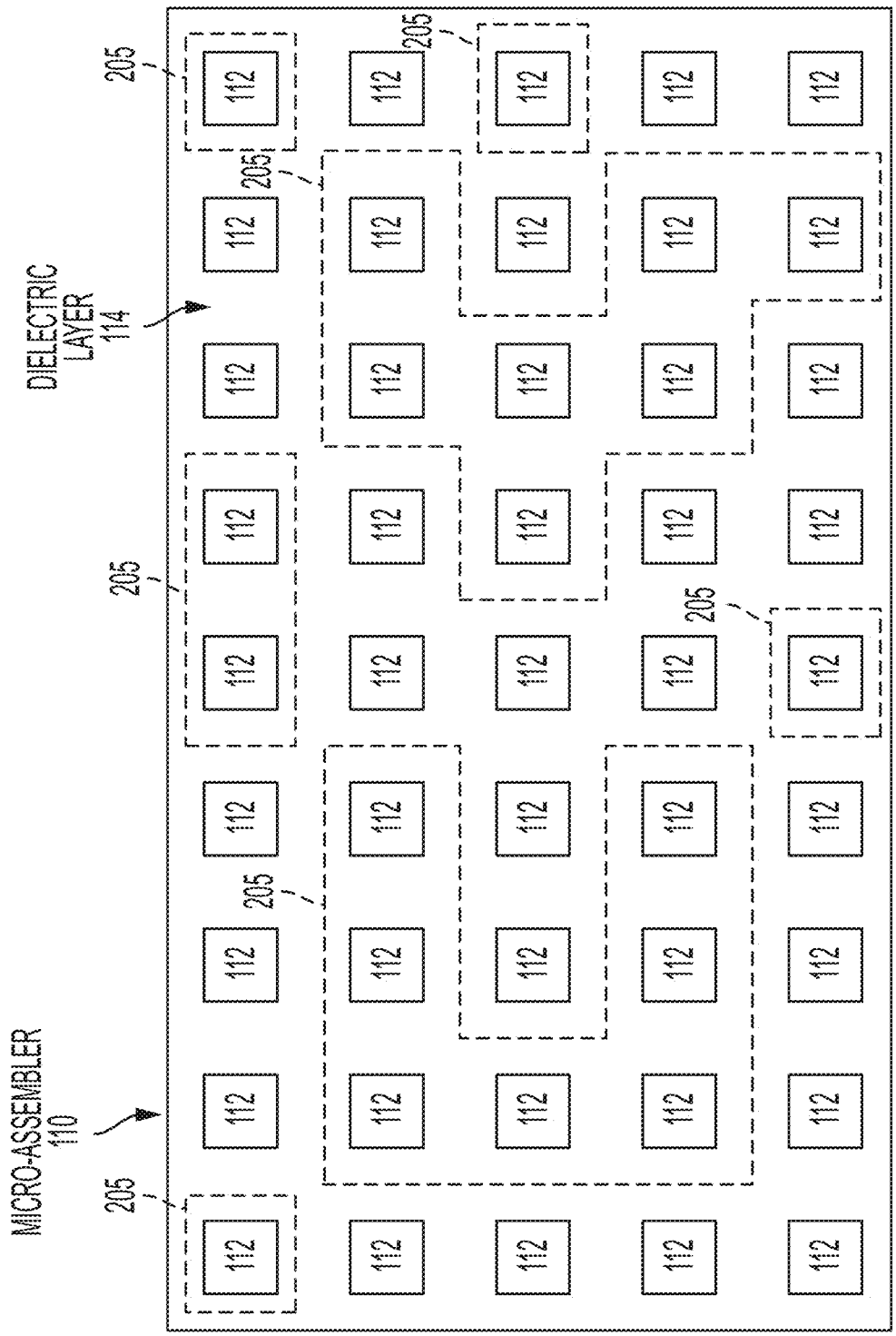
FIG. 2 is a diagram depicting a view of an underside of a micro-assembler, in accordance with some embodiments of the present disclosure.

In one embodiment, a phototransistor 112 may be a device, such as a semiconductor device, that may use light (e.g., visible light, non-visible light, etc.) to switch an electric current. A phototransistor 112 may also be referred to as a photodiode or a photoconductor. Each phototransistor 112 may be coupled to a capacitor 113. The electric current switched by the phototransistors 112 may be stored in capacitors 113. A capacitor 113 may be a device that is capable of storing electrical energy in an electric field. The phototransistors 112 may be arranged in on the substrate in an M×N matrix or an array, where M and N are two arbitrary numbers. For example, the phototransistors 112 may form a two-dimensional (2D) array as illustrated in FIG. 2. Each phototransistor 112 (or each group comprising one phototransistor 112 and one capacitor 113) may be referred to as a pixel.

In one embodiment, the light emitting device 160 may shine light on one or more of the phototransistors 112. As discussed above, when a phototransistor 112 is exposed to light, the phototransistor 112 may switch an electric current which is stored in the capacitor 113. This may cause a negative or a positive voltage to be applied to one or more of the phototransistor 112 or the capacitor 113. In addition, switching the electric current (by shining light on a phototransistor 112) may create or apply an alternating current (AC) voltage at the phototransistor 112 or the capacitor 113. One or more of the negative voltages, positive voltages, and the AC voltage switched by the phototransistors 112 and stored on the capacitor 113 may also generate one or more of dielectrophoretic (DEP) and electrophoretic (EP) forces which may act upon the micro-objects 120. The DEP and EP forces that are exerted on the micro-objects 120 may cause the micro-objects 120 to move around the surface of the micro-assembler 110 (e.g., a top surface of the micro-assembler 110, a surface of the dielectric layer 114). Thus, the dielectrophoretic (DEP) and electrophoretic (EP) forces may be used to control the placement of micro-objects 120 on the surface of the micro-assembler 110, as discussed in more detail below.

In one embodiment, a plurality of micro-objects 120 may be deposited onto the surface of the micro-assembler 110. For example, a reservoir of tens, hundreds, thousands, tens of thousands, etc., of micro-objects may be deposited onto the surface of the micro-assembler 110. The placement of a set of the micro-objects 120 on the surface of the micro-assembler 110 may be controlled using the phototransistors 112 and capacitors 113. For example, the light emitting device 160 may emit or transmit light to fall on some of the phototransistors 112 to switch an electric current. The electric current may result in one or more of negative voltages, positive voltages, or AC voltage. The negative voltages, positive voltages, and the AC voltage generated on the capacitors 113 by the phototransistors 112 may exert DEP or EP forces on the set of micro-objects 120 which may be used to move the set of micro-objects 120, or change one or more of the positions or orientations of the set of micro-objects 120. The set of micro-objects 120 can include one or more micro-objects. For example the set of micro-objects 120 may include one micro-object 120, fifteen micro-objects 120, a hundred micro-objects 120, etc. The set of micro-objects may be functionally identical or distinct. For example the set of micro-objects may include 10 silica spheres and 100 gallium arsenide chips.

In one embodiment, the micro-assembler 110 (or the micro-assembler system 100) may control the placement of the set of micro-objects 120 by moving the set of micro-objects across the surface of the micro-assembler 110 relative to one or more of a reference structure or a second set of micro-objects. For example, micro-assembler 110 may move a set of micro-objects relative to one of the edges of the micro-assembler 110, as discussed in more detail below.

In one embodiment, the micro-assembler 110 (or the micro-assembler system 100) may control the placement of the set of micro-objects 120 by concentrating the set of micro-objects. For example, the micro-assembler 110 may push the micro-objects 120 in the set of micro-objects 120 closer to each other to form a cluster (e.g., to pack the micro-objects 120 together). This may reduce the distance between micro-objects and consequently the surface area (e.g., the size of an area on the surface of the micro-assembler 110) occupied by the set of micro-objects 120. In another embodiment, the micro-assembler 110 (or the micro-assembler system 100) may control the placement of the set of micro-objects 120 by deconcentrating the set of micro-objects. For example, the micro-assembler 110 may push the micro-objects 120 in the set of micro-objects 120 away from each other to spread out the micro-objects 120. This may increase the distance between micro-objects and consequently the surface area occupied by the set of micro-objects 120.

In one embodiment, the micro-assembler 110 (or the micro-assembler system 100) may control the placement of the set of micro-objects 120 by controlling a second placement of a second set of set of micro-objects on the surface of the micro-assembler using the two-dimensional array of photoconductors, simultaneous with controlling the placement of the set of micro-objects. For example, the micro-assembler 110 may move, change the position of, or change the orientation of multiple sets of micro-objects 120 at the same time. The micro-assembler 110 may simultaneously control the placement of multiple sets of micro-objects 120 by using the light emitting device 160 to shine light at different sets of phototransistors 112.

In one embodiment, the micro-assembler 110 (or the micro-assembler system 100) may control the placement of the set of micro-objects 120 by controlling one or more of a position or orientation of each micro-object in the set of micro-objects in a 2-dimensional plane parallel to the surface of the surface of the micro-assembler 110. For example, the micro-assembler 110 may move the set of micro-objects 120 to an X-Y-Z location (e.g., to a position) relative to the surface of the micro-assembler 110 (e.g., a position on the surface of the micro-assembler 110, a position above the surface of the micro-assembler 110, etc.). In another example, the micro-assembler 110 may rotate a micro-object 120 clockwise or counter-clockwise (e.g., may change the orientation of the micro object).

In one embodiment, the micro-assembler 110 (or the micro-assembler system 100) may control the placement of the set of micro-objects 120 by controlling one or more of a position or orientation of a first micro-object of the set of micro-objects in three dimensions relative to the surface of the micro-assembler 110. For example, a micro-object 120 may have a cuboid shape (e.g., the shape of a rectangular prism). The micro-assembler 110 may shift or flip the micro-object 120 onto a difference face. The micro-assembler 110 may also lift a single micro-object or set of micro-objects off the 2D surface of the micro-assembler 110.

In one embodiment, the micro-assembler 110 (or the micro-assembler system 100) may control the placement of the set of micro-objects 120 by distributing the micro-objects 120 (e.g., the reservoir of micro-objects 120) to random locations on the surface of the micro-assembler. For example, the light-emitting device 160 may emit light to random phototransistors 112 creating a random voltage pattern on the capacitors 113. This may cause the phototransistors 112 and capacitors 113 to exert DEP or EP forces which may move the micro-objects 120 to random locations. Distributing the micro-objects 120 to random locations may allow the micro-assembler 110 to disperse the micro-objects 120 more evenly across the surface of the micro-assembler 110.

In one embodiment, the micro-assembler 110 (or the micro-assembler system 100) may control the placement of the set of micro-objects 120 by forming one or more sets of micro-objects 120 into a pattern on the surface of the micro-assembler. For example, the micro-assembler 110 may form a first set of micro-objects 120 into the shaper of the letter "H" and may form a second set of micro-objects 120 into the shape of the letter "I." In another example, the micro-assembler 110 may form a set of micro-objects into a geometric shape (e.g., a triangle, square, rectangle, octagon, etc.).

In one embodiment, the micro-assembler 110 (or the micro-assembler system 100) may control the placement of the set of micro-objects 120 by controlling a sub-set of micro-objects 120 within the set of micro-objects 120. For example, twenty micro-objects 120 (e.g., a set of micro-objects 120) may be formed into a circle shape. Then four of the twenty micro-objects (e.g., sub-set of the set of micro-objects 120) may be moved into the center of the circle shape to form a square shape in the center of the circle shape.

In one embodiment, the micro-assembler 110 (or the micro-assembler system 100) may control the placement of the set of micro-objects 120 by holding the set of micro-objects 120 in place on the surface of the micro-assembler 110. For example, the phototransistors 112 and capacitors 113 may cause DEP and EP forces to be exerted on the set of micro-objects 120 which prevent the set of micro-objects 120 from moving. The set of micro-objects 120 may be held in place at a position relative to a reference structure or another set of micro-objects 120. For example, the set of micro-objects 120 may be held in place at a position relative to an edge of the micro-assembler 110. In another example, the set of micro-objects 120 may be held in a place at a location that is a certain distance away from another set of micro-objects 120. The set of micro-objects 120 may also be held in place at an orientation relative to a reference structure or another set of micro-objects 120. For example, the set of micro-objects 120 may be held in place such that the left edges of the set of micro-objects 120 are parallel the left edge of the micro-assembler 110. In another embodiment, the set of micro-objects 120 may be held in place with enough force to withstand shear and drag forces that may be generated by fluid flow, electroosmotic flow, vibrations, or DEP or EP forces generated by sources other than the micro-assembler 110. For example, a liquid such as dielectric fluid, oil may be sprayed onto the surface of the micro-assembler 110 to clean the micro-objects 120. The set of micro-objects 120 may be held in place with enough force to withstand shear and drag forces caused by the flow of the oil across the surface of the micro-assembler 110.

As discussed above, the light emitting device 160 (which emits light on the phototransistors 112 to generate the DEP and EP forces) may be controlled by the computing device 150. For example, the computing device 150 may instruct or cause the light emitting device 160 to emit light at some of the phototransistors 112. In one embodiment, the computing device 150 may to instruct the light emitting device 160 to emit light based on the control data 151.

In one embodiment, the control data 151 may indicate one or more control patterns that may be applied to the micro-assembler 110. A control pattern may indicate a voltage pattern for the micro-assembler 110. For example, the control data 151 may indicate control patterns which may indicate which phototransistors 112 should receive light from the light emitting device 160. Each control pattern may include a set of X-Y positions and an orientation angle that may indicate which phototransistors 112 should receive light from the light emitting device 160 (or vice versa). The control pattern may be any size from as small as a single phototransistor pixel 112/113 to the full size of the micro-assembler 110. The phototransistors 112 which are to receive light from the light emitting device 160 may form one or more patterns on the micro-assembler 110, as discussed in more detail below. In another example, the control pattern may indicate what portions of the micro-assembler 110 should generate an electric field. The micro-assembler 110 may include an array of electrodes and the control pattern may indicate which of the electrodes should generate an electric field.

In one embodiment, the computing device 150 may instruct or cause the light emitting device 160 to emit light to the phototransistors 112 based on a control pattern. For example, if a control pattern indicates that a particular phototransistor 112 at an X-Y location on the micro-assembler 110 should receive light from the light emitting device 160, the computing device may instruct the light emitting device 160 to emit light to the particular phototransistor 112 at the X-Y location. In another embodiment, the computing device 150 may cause one or more electrodes, transistors, etc., to generate an electric field based on the control pattern. For example, the control pattern may indicate the X-Y coordinates or locations of certain electrodes and the computing device 150 may connect the certain electrodes to a voltage source by controlling one or more switches, based on the control pattern. Causing the electrodes, transistors, phototransistors, etc., to generate an electric field may allow the computing device 150 to generate the voltage pattern indicated by the control pattern.

In another embodiment, the computing device 150 may instruct or cause the light emitting device 160 to emit light to the phototransistors 112 based on multiple control patterns simultaneously. For example two, four, ten, or some other appropriate number of control patterns, each having a different size, shape, position and orientation may be used simultaneously. In a further embodiment, the computing device 150 may cause one or more electrodes, transistors, etc., to generate an electric field based on multiple control patterns simultaneously.

In one embodiment, the computing device 150 may cycle through multiple control patterns sequentially. Control patterns that are part of a cycle may share a common position and orientation, but may indicate different phototransistors 112 or may cause different electrodes, transistors, etc., to generate an electric field. For example, the control data 151 may indicate a sequence of control patterns in an order and a timing for the ordered control patterns (e.g., how long to use a control pattern, how long to wait between using different control patterns, etc.). Each control pattern may indicate different sets or groups of phototransistors 112 that should receive light from the light emitting device 150. The control data 151 may use a first control pattern to cause the light emitting device 160 to emit light at a first group of phototransistors 112, may use a second control pattern to cause the light emitting device 160 to emit light at a second group of phototransistors 112, etc. This process may create dynamic (e.g., varying or changing) EP and DEP forces. Control patterns that are part of a cycle may also be applied to different positions or may have different orientations. For example, a first control pattern may have a first center position and a first orientation and a second control pattern may have a second center position (that may be offset from the first center position) and a second orientation (that may be rotated from the second orientation). In some embodiments, the computing device 150 may cycle through the multiple control patterns without analyzing the positions, locations, orientations, etc., of the micro-objects 120. For example, the computing device 150 may not receive information about the positions, locations, orientations, etc., of the micro-objects 120 or generate feedback, but may cycle through the control patterns based on a pre-determined order and a pre-determined timing between the control patterns (e.g., use the first control pattern for five seconds, then cycle to the next control pattern for ten seconds, etc.). This may be referred to as an open loop.

In one embodiment, the computing device 150 may generate or identify a set of control patterns based on one or more of video and images received from the camera 170 or other devices that may detected the positions, locations, or orientations of the micro-objects 120. For example, the camera 170 may capture multiple images (e.g., photos, etc.) of the micro-objects 120 and their position and/or orientation on the surface of the micro-assembler 110. Based on the images of the micro-objects 120, the computing device 150 may determine whether a set of micro-objects 120 are in the correct position, the correct orientation, the correct pattern, etc. For example, the control data 151 may indicate that a set of micro-objects 120 should form an "X" shape at the bottom left corner of the micro-assembler 110. If computing device 150 analyzes the one or more images from the camera 170 and determines that one or more micro-objects are out of position (e.g., are not within the "X" shape), the computing device 150 may determine that the one or more micro-objects 120 should be moved such that they are in the proper position within the "X" shape. The computing device 150 may generate additional control patterns or may identify other (existing) control patterns that may be used to move the one or more micro-objects 120 into the proper position. The computing device 150 may instruct the light emitting device 160 to emit light to certain phototransistors 112 or may cause certain electrodes, transistors, etc., to generate an electric field (i.e., may use one or more control patterns to generate DEP and EP forces to move the one or more micro-objects 120). For example, the computing device 150 may (automatically) determine a path across the surface of the micro-assembler for the one or more micro-objects 120 to move the one or more micro-objects 120 into the proper position. The computing device 150 may create or identify one or more control patterns that define which phototransistors 112 the light emitting device 160 should illuminate to move the one or more micro-objects 120 into the proper position. For example, the computing device 150 may use multiple control patterns in a sequence to move the micro-objects. In another example, the computing device 150 may use one control pattern but may move the center position or the orientation of the control pattern (e.g., may apply the same control pattern to different portions of the micro-assembler 110). By moving the control pattern along or around the path to exert DEP and EP forces on the one or more micro-objects 120 the computing device 150 can move them along the path into the proper position.

In one embodiment, a user may provide user input (e.g., via an input device such as a mouse or a touch screen, via a graphical user interface (GUI), etc.). For example, the user may provide user input to provide one or more control patterns indicating which phototransistors 112 should receive light from the light emitting device 160. This may allow the user to control the position and orientation of one or more micro-objects 120 by inputting or providing one or more control patterns, or by indicating which existing control patterns should be used.

FIG. 2 is a diagram depicting a view of an underside of a micro-assembler 110 (illustrated in FIG. 1), in accordance with some embodiments of the present disclosure. As discussed above, the micro-assembler 110 may include a transparent or semi-transparent substrate layer 111. The phototransistors 112 may be visible through the substrate layer 111 when viewing the underside of the micro-assembler 110. The capacitors 113 may or may not be visible when viewing the underside of the micro-assembler 110. Also as discussed above, the phototransistors 112 (and the capacitors 113) may be located within a dielectric layer 114. As discussed above, control patterns may be used to define which phototransistors 112 should receive light from a light emitting device. As illustrated in FIG. 2, multiple control patterns 205 may indicate that the phototransistors 112 that are enclosed within the dashed regions or shapes should receive light from the light emitting device. Each of the control patterns 205 may indicate a voltage pattern for a portion of the micro-assembler 110, as discussed above. The control patterns 205 (e.g., the set of control patterns 205) may be used simultaneously. For example, each of the control patterns 205 may be used simultaneously to cause different sets of phototransistors 112 (or different electrodes) to generate an electric field simultaneously. Although the patterns 205 illustrated in FIG. 2 may indicate the phototransistors 112 that should receive light (e.g., the phototransistors 112 that should generate an electric field), a control pattern may also indicate which phototransistors 112 should not receive light. For example, a control pattern may include a four by four square of phototransistors 112 and may indicate that the left half of the four by four square of phototransistors 112 should receive light and the right half of the four by four square of phototransistors 112 should not receive light.

As illustrated in FIG. 2 (and in other figures of the present disclosure), the control patterns 206 may resemble two-dimensional bitmaps (e.g., two-dimensional bitmaps that are used in computer graphics, such as video games). Thus, the control patterns 206 may also be referred to as sprites (e.g., two-dimensional bitmaps used in computer graphics). Similar to sprites, the control patterns 206 may be applied across the micro-assembler 110 (e.g., moved across the micro-assembler 110). For example, the C-shaped control pattern 206 (e.g., sprite) may be moved towards the right of the micro-assembler 110. In addition, a control pattern 206 may be moved across the micro-assembler 110 while other control patterns (e.g., a background control pattern) remain stationary. For example, a background control pattern may be used to hold a reservoir of micro-objects 120 in place while the C-shaped control pattern 206 (e.g., sprite) is used to move the micro-objects 205 around the surface of the micro-assembler 110. In some embodiments, a control pattern that may be moved around the micro-assembler 110 may also be referred to as a local control pattern.

Note that while FIGS. 1 and 2 describe a phototransistor based microassembler hardware system which modulates the electric force field from an array of electrodes, this invention also pertains to other similar hardware systems where a force field is pixelated. For example, the electrodes could be virtual, meaning they only exist while the light is on as is used in optoelectrofluidic systems utilizing an unpatterned photoconductor layer and a transparent electrode (as illustrated in "Optoelectronic Tweezers for Manipulation of Cells and Nanowires", by Ming C. Wu, et al., Electron Devices Meeting 2007. IEDM 2007. IEEE International, pp. 847-850, 2007.). In another example the force generating pixels could be from electrical addressed electrodes, such as from an active matrix integrated circuit. Other examples of addressable pixelated force fields could be based on magnetic or acoustic forces. A force generating pixel may refer to a component or device that may be capable of generating a force that may be exerted on one or more micro-objects.

Figure 3:
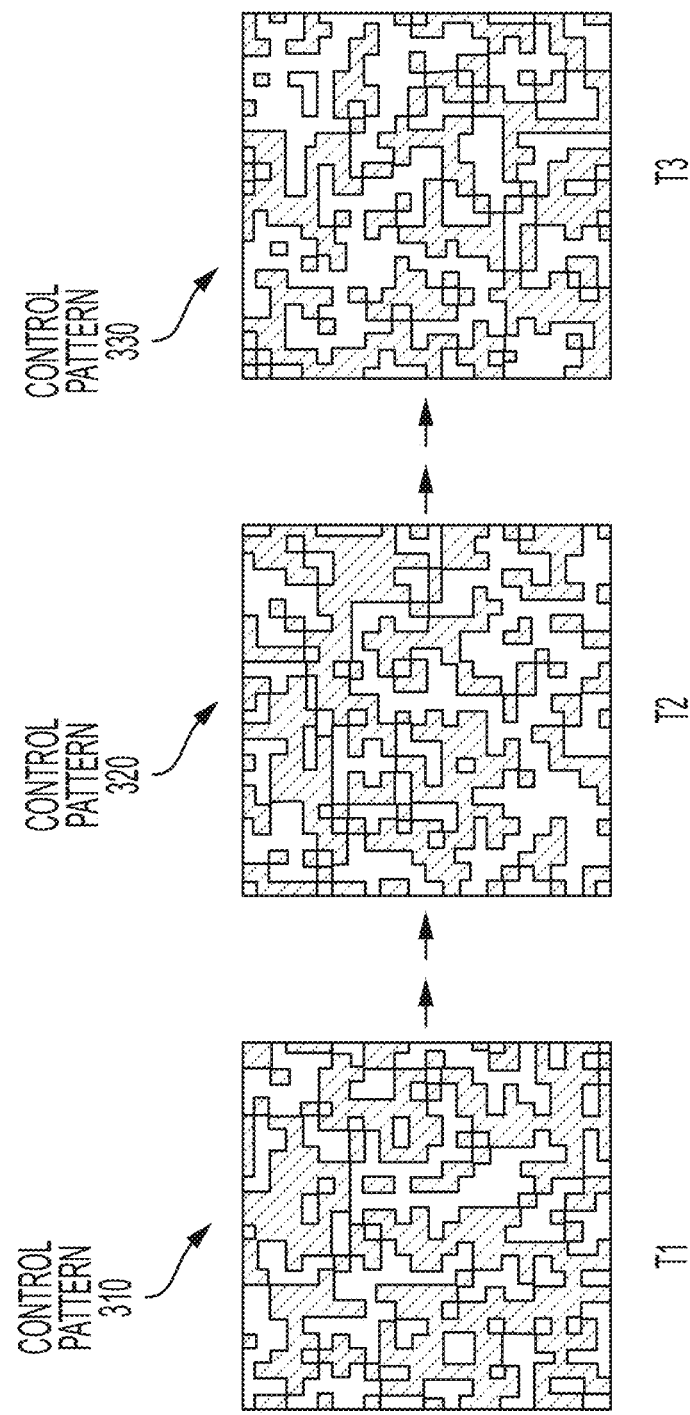
FIG. 3 is a diagram depicting example control patterns that may be applied to a micro-assembler, in accordance with some embodiments of the present disclosure.

FIG. 3 is a diagram depicting example control patterns 310, 320, and 330 that may be applied to a micro-assembler (e.g., micro-assembler 110 illustrated in FIGS. 1 and 2), in accordance with some embodiments of the present disclosure. As discussed above, a control pattern may indicate which phototransistors (in a 2D array of phototransistors) should receive light from a light emitting device and which phototransistors should not receive light from the light emitting device. This may cause the phototransistors to generate one or more of positive voltages, negative voltages, and AC voltages. Each control pattern 310, 320, and 330 may indicate whether a positive voltage or a negative voltage is generated by the phototransistors in the micro-assembler. The darker squares or regions in the control patterns 310, 320, and 330 may indicate that a positive voltage is generated by the phototransistors in the darker squares or regions. The lighter squares or regions in the control patterns 310, 320, and 330 may indicate that a negative voltage is generated by the phototransistors in the lighter squares or regions.

As discussed above, a computing device may cycle through different control patterns at different times to control a light emitting device. For example, at time T1, the computing device may use control pattern 310 to determine whether to emit light to different phototransistors to generate positive and negative voltages according to the control pattern 310. For example, at time T2, the computing device may use control pattern 320 to determine whether to emit light to different phototransistors to generate positive and negative voltages according to the control pattern 320. For example, at time T3, the computing device may use control pattern 310 to determine whether to emit light to different phototransistors to generate positive and negative voltages according to the control pattern 330. In one embodiment, the control patterns 310, 320, and 330 may be used to disperse or spread out micro-objects randomly across the surface of the micro-assembler.

Figure 4B:
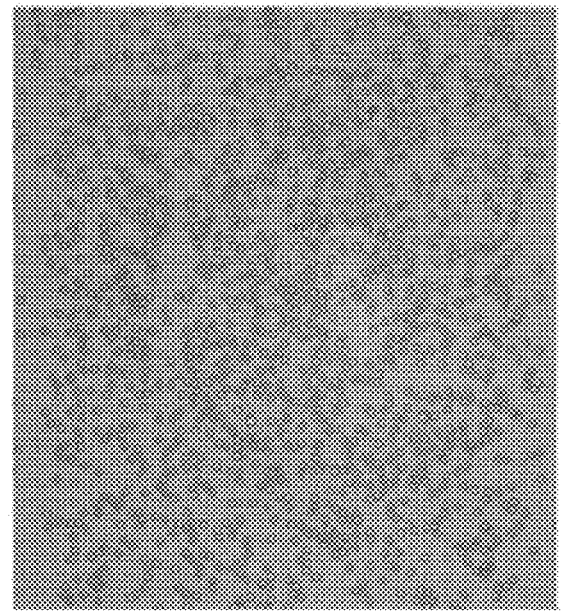
FIG. 4B is a diagram depicting a view of a lab experiment result of a micro-assembler and micro-objects, in accordance with some embodiments of the present disclosure.
Figure 4A:
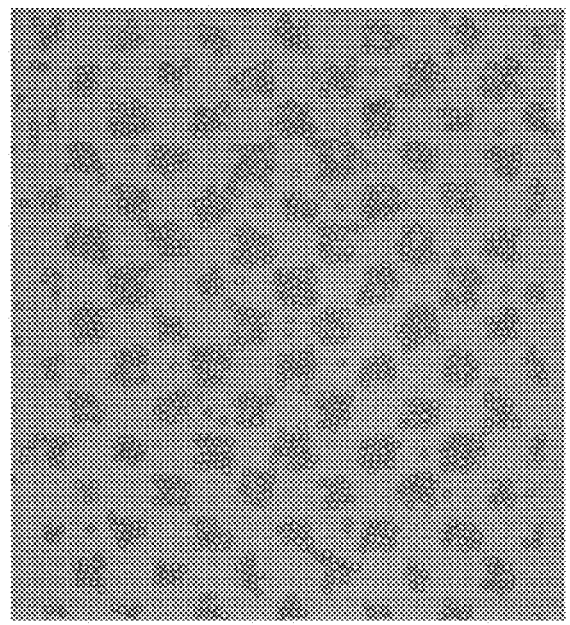
FIG. 4A is a diagram depicting a view of a lab experiment result of a micro-assembler and micro-objects, in accordance with some embodiments of the present disclosure.

FIG. 4A is a diagram depicting a view of a micro-assembler and micro-objects, in accordance with some embodiments of the present disclosure. The phototransistors of the micro-assembler are depicted as small squares in FIG. 4A. The micro-objects are depicted using small circles in FIG. 4A. As discussed above, one or more control patterns may be used to disperse or spread out micro-objects randomly across the surface of the micro-assembler. FIG. 4A may depict the positions and orientations of the micro-objects after the micro-objects have been randomly dispersed or spread out across the surface of the micro assembler.

FIG. 4B is a diagram depicting a view of a micro-assembler and micro-objects, in accordance with some embodiments of the present disclosure. The phototransistors of the micro-assembler are depicted as small squares in FIG. 4B. The micro-objects are depicted using small circles in FIG. 4B. As discussed above, sets of micro-objects may be positioned or oriented on the surface of the micro-assembler. The sets of micro-objects may be positioned or oriented relative to each other and relative to a reference structure (e.g., an edge of a micro-assembler). FIG. 4B depicts sets of micro objects that are arranged in a checkerboard pattern.

Figures 5A, 5B:
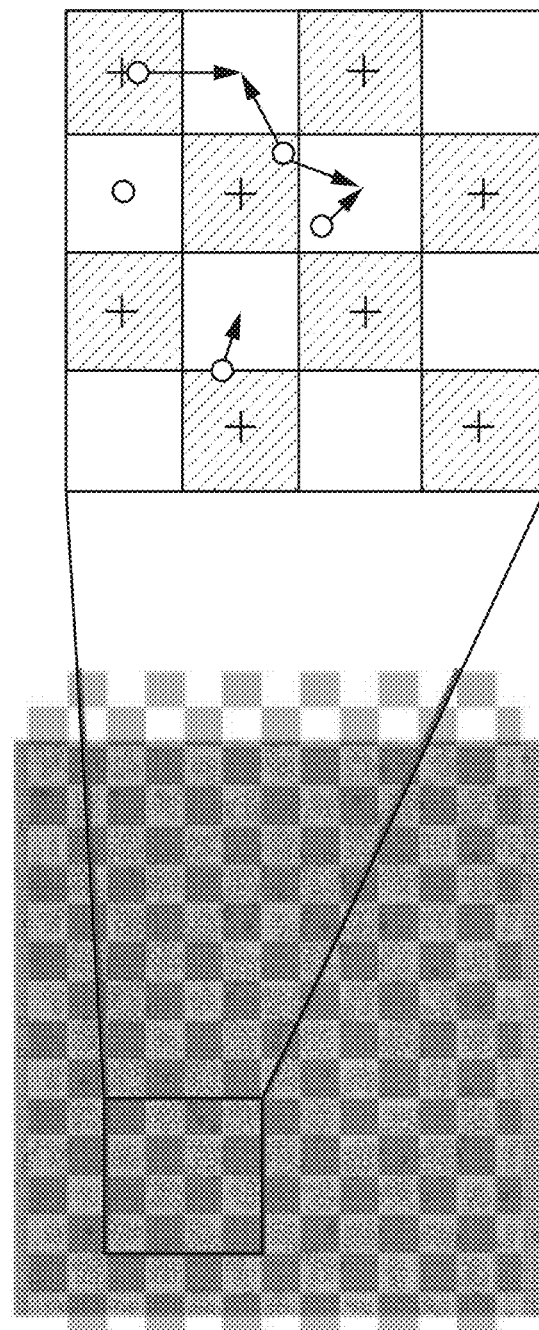
FIG. 5A is a diagram depicting a view of a micro-assembler and micro-objects, in accordance with some embodiments of the present disclosure.
FIG. 5B is a diagram depicting a portion of the micro-assembler and micro-objects illustrated in FIG. 5A, in accordance with some embodiments of the present disclosure.

FIG. 5A is a diagram depicting a view of a micro-assembler and micro-objects, in accordance with some embodiments of the present disclosure. The phototransistors of the micro-assembler are depicted as small squares in FIG. 5A. The micro-objects are depicted using small circles in FIG. 5A. As discussed above, sets of micro-objects may be positioned or oriented on the surface of the micro-assembler. The sets of micro objects that are arranged in a checkerboard pattern. As illustrated in FIG. 5A, phototransistors may be divided into groups (e.g., blocks of BxB phototransistors) which may be used to form the checkerboard pattern. A positive voltage may be generated by the phototransistors located in the darker regions of the micro-assembler (e.g., the phototransistors located in the darker squares) and an AC voltage may be generated by the phototransistors located in the lighter regions of the micro-assembler (e.g., the phototransistors located in the lighter squares).

FIG. 5B is a diagram depicting a portion of the micro-assembler and micro-objects illustrated in FIG. 5A, in accordance with some embodiments of the present disclosure. As discussed above, a positive voltage may be generated by the phototransistors located in the darker regions of the micro-assembler (e.g., the phototransistors located in the darker squares) and an AC voltage may be generated by the phototransistors located in the lighter regions of the micro-assembler (e.g., the phototransistors located in the lighter or white squares). This may cause the micro-objects to move towards the lighter regions of the micro-assembler. For example, the micro-objects, which are represented as smaller circles in FIG. 5B may be positively charged and may be repelled (by DEP or EP forces) away from the dark regions of the micro-assembler (which are generating a positive voltage) towards the white or lighter regions of the micro-assembler (which may be generating an AC voltage). The movement of the micro-objects may be depicted by the arrows illustrated in FIG. 5B. The white or lighter regions of the micro-assembler may hold the micro-objects in place within the white or lighter regions. The white or lighter regions of the micro-assembler may be referred to as an AC trap.

Figure 6:
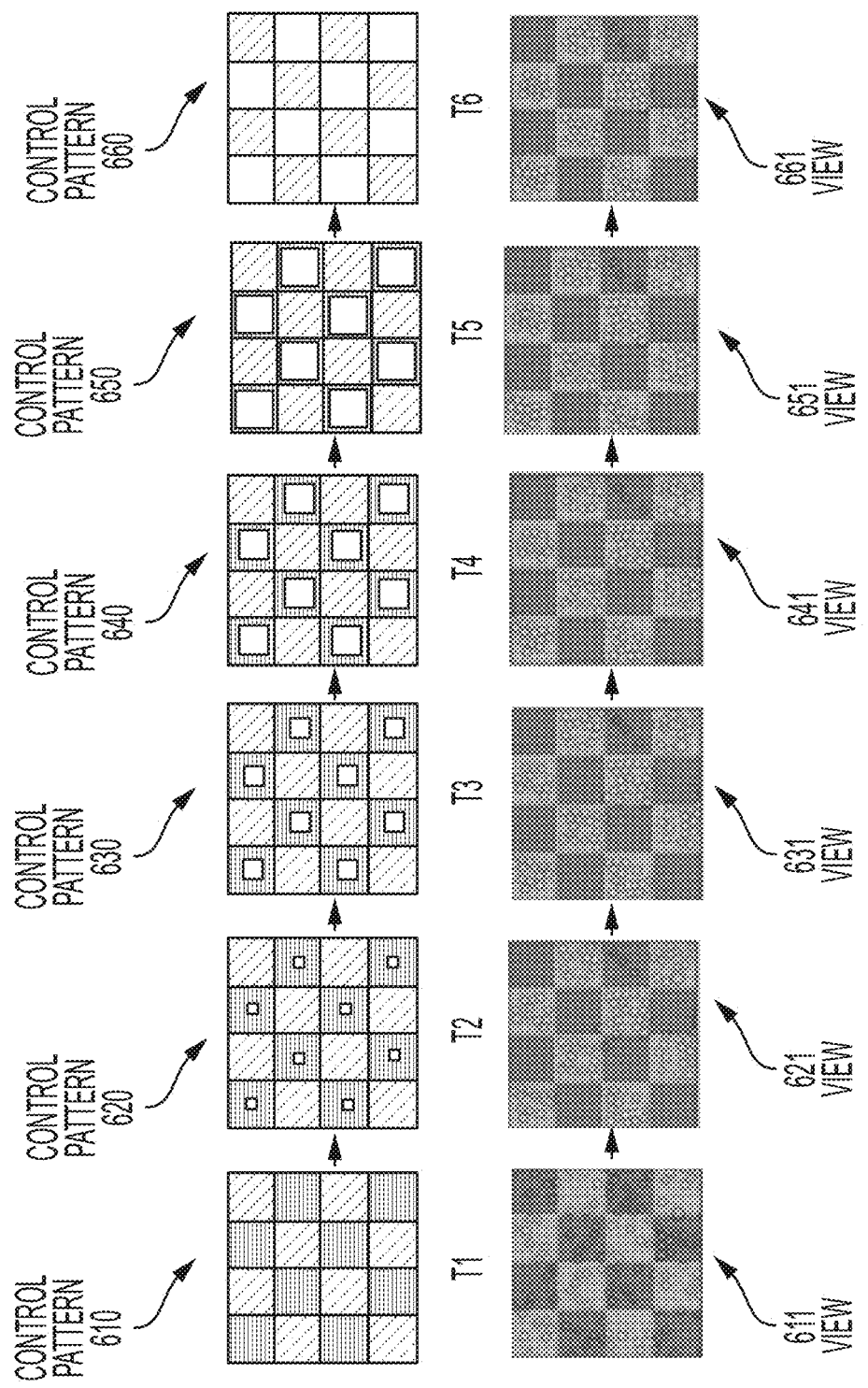
FIG. 6 is a diagram depicting example control patterns that may be applied to a portion of micro-assembler, in accordance with some embodiments of the present disclosure.

FIG. 6 is a diagram depicting example control patterns 610 through 660 that may be applied to a portion of micro-assembler (e.g., micro-assembler 110 illustrated in FIGS. 1 and 2), in accordance with some embodiments of the present disclosure. FIG. 6 also illustrates views 611 through 661 of a portion of the micro-assembler. The black regions (e.g., darkest regions) of the control patterns 610 through 660 may indicate regions where the phototransistors do not generate a voltage. The grey regions of the control patterns 610 through 660 may indicate regions where the phototransistors generate a positive voltage. The white regions of the control patterns 610 through 660 may indicate regions where the phototransistors generate an AC voltage. In view 611 through 661, the small squares may be phototransistors and the small circles may be micro-objects. As illustrated in FIG. 6, each region includes a 6×6 array of phototransistors.

As discussed above, different control patterns may be applied to the micro-assembler at different times. Control pattern 610 may be applied to the micro-assembler at time T1, control pattern 620 may be applied to the micro-assembler at time T2, control pattern 630 may be applied to the micro-assembler at time T3, control pattern 640 may be applied to the micro-assembler at time T4, control pattern 650 may be applied to the micro-assembler at time T5, and control pattern 660 may be applied to the micro-assembler at time T6.

In control pattern 610, only positive voltages or no voltage is generated by the phototransistors in the black and grey regions. In control pattern 620, portions of the regions that were not charged are now generating an AC voltage. For example, the center of each square region that was not previously charged is now generating an AC voltage. In control patterns 640 through 660, the portions of the regions that were not charged (in control pattern 610) increase in size (from the center of each region) until the whole region is generating an AC voltage in control pattern 660. Views 611 through 621 illustrate the micro-objects moving towards the regions of the micro-assembler that are generating the AC voltage (e.g., the white regions illustrated in control patterns 610 through 660). Views 631 through 661 illustrate the micro-objects coalescing, grouping up, bunching up, packing into, etc., the regions that are generate the AC voltage.

Figure 7:
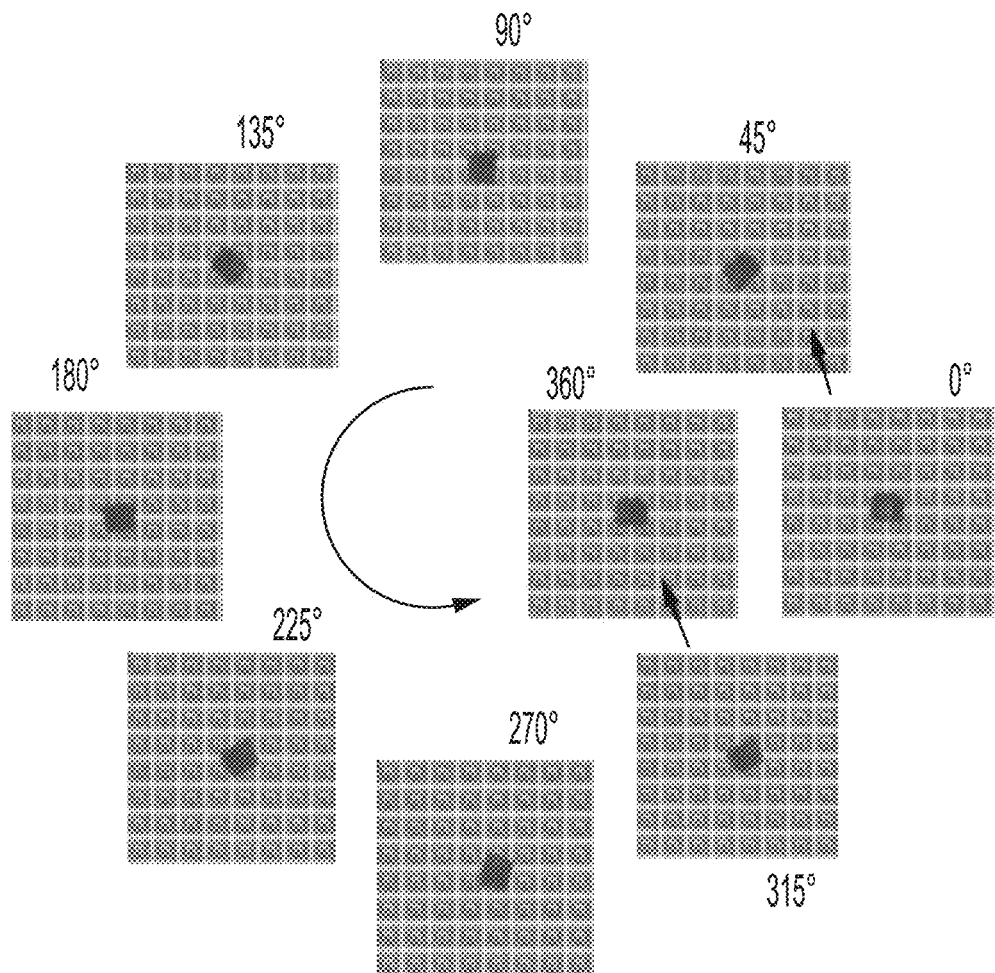
FIG. 7 is a diagram depicting a portion of a lab experiment result of a micro-assembler and a micro-object, in accordance with some embodiments of the present disclosure.

FIG. 7 is a diagram depicting a portion of the micro-assembler and a micro-object, in accordance with some embodiments of the present disclosure. The micro-object is represented as a dark (e.g., black) quadrilateral shapes (e.g., a rectangle, a square, etc.) on the surface of the micro-assembler. Each of the smaller gray squares represents a phototransistor of the micro-assembler. As illustrated in FIG. 7, the orientation of the micro-object may be changed. The micro-object is rotated counter-clockwise from 0 degrees, to 45 degrees, to 90 degrees, to 135 degrees, to 180 degrees, to 225 degrees, to 270 degrees, to 315 degrees, and finally to 360 degrees.

In one embodiment, the micro-object may be referred to as a chiplet. A chiplet may a micro-object that includes one or more straight edges or sides. Because chiplets have straight edges or sides, the chiplets may be aligned with each other on their sides, as discussed in more detail below. For example, the right side or edge of a first square-shaped chiplet may be aligned (e.g., positioned parallel) with the left side or edge of a second square-shaped chiplet.

Figure 8A:
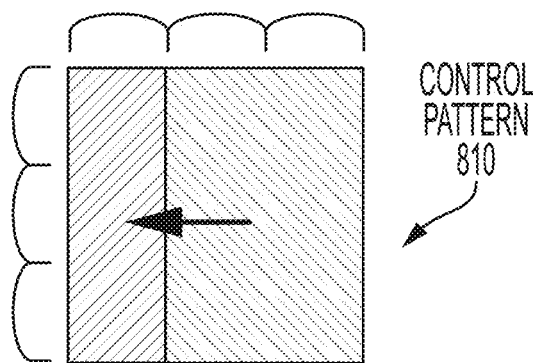
FIG. 8A is a diagram depicting example control patterns that may be applied to a portion of a micro-assembler, in accordance with some embodiments of the present disclosure.

FIG. 8A is a diagram depicting example control patterns 810 that may be applied to a portion of a micro-assembler (e.g., micro-assembler 110 illustrated in FIGS. 1 and 2), in accordance with some embodiments of the present disclosure. The portion of the micro-assembler may include a 3×3 array of phototransistors. The diagonal solid hashed region may include phototransistors that are generating a charge that pulls a micro-object towards the diagonal solid hashed region. The diagonal dotted hashed areas may include phototransistors that are not generating a charge. As illustrated in FIG. 8A, a micro-object may be pulled towards the diagonal solid hashed region as illustrated by the shaded arrow. The control pattern 810 may be used to move a micro-object in a certain direction. The position or orientation of the control pattern 810 may be moved to move the micro-object in different directions. For example moving control pattern 810 to the left may cause the micro-object to move left.

Figure 8B:
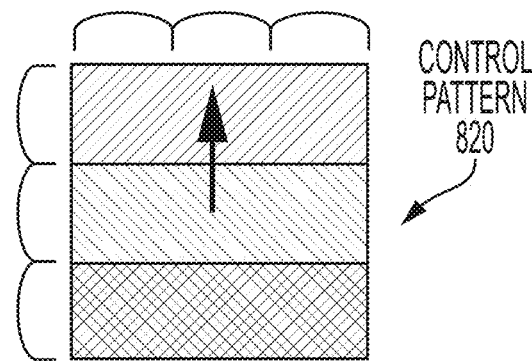
FIG. 8B is a diagram depicting example control patterns that may be applied to a portion of a micro-assembler, in accordance with some embodiments of the present disclosure.

FIG. 8B is a diagram depicting example control patterns 820 that may be applied to a portion of a micro-assembler (e.g., micro-assembler 110 illustrated in FIGS. 1 and 2), in accordance with some embodiments of the present disclosure. The portion of the micro-assembler may include a 3×3 array of phototransistors. The diagonal solid hashed region may include phototransistors that are generating a charge that pulls a micro-object towards the diagonal solid hashed region. The diagonal dotted hashed areas may include phototransistors that are not generating a charge. The cross hashed regions may include phototransistors that are generating a charge the pushes the micro-object away from the cross hashed region. As illustrated in FIG. 8B, a micro-object may be pulled towards the diagonal solid hashed region and pushed away from the cross hashed region as illustrated by the shaded arrow. The control pattern 820 may be used to move (e.g., unstick) a micro-object that may be stuck at a location on the surface of the micro-assembler.

Figure 8C:
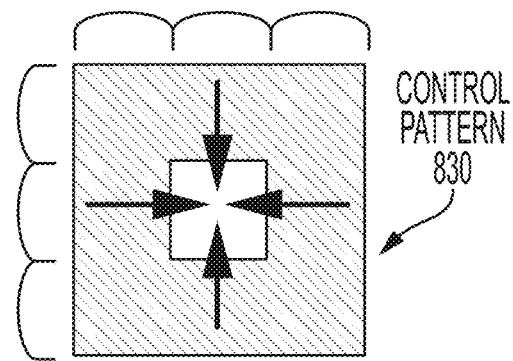
FIG. 8C is a diagram depicting example control patterns that may be applied to a portion of a micro-assembler, in accordance with some embodiments of the present disclosure.

FIG. 8C is a diagram depicting example control patterns 830 that may be applied to a portion of a micro-assembler (e.g., micro-assembler 110 illustrated in FIGS. 1 and 2), in accordance with some embodiments of the present disclosure. The portion of the micro-assembler may include a 3×3 array of phototransistors. The diagonal dotted hashed areas may include phototransistors that are not generating a charge. The white region may include phototransistors that are generating an AC voltage. As illustrated in FIG. 8C, a micro-object held in place within the white region, as illustrated by the shaded arrows. The control pattern 830 may be used to hold or keep a micro-object at a particular location on the surface of the micro-assembler.

In some embodiments, the control patterns 810, 820, and 830 illustrated in FIG. 8A through 8C may be referred to as sprites or local control pattern. A sprite or a local control pattern may be a control pattern that may be moved across the surface of a micro-assembler (e.g., micro-assembler 110 illustrated in FIGS. 1 and 2, micro-assembler 1310 illustrated in FIG. 13, etc.). For example, the control patterns 810 may be applied to different sets of electrodes/phototransistors over time, where each set of electrodes/phototransistors is offset from the previous set of electrodes/phototransistors (e.g., offset by one or more rows and/or columns). This may result in the control pattern 810 being moved (e.g., applied) across the micro-assembler.

Figure 9A:
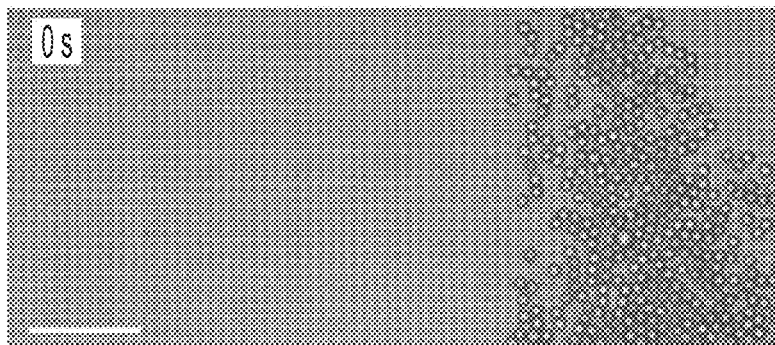
FIG. 9A is a diagram depicting a portion of a lab experiment result of a micro-assembler and a plurality of micro-objects, in accordance with some embodiments of the present disclosure.

FIG. 9A is a diagram depicting a portion of the micro-assembler and a plurality of micro-objects, in accordance with some embodiments of the present disclosure. As illustrated in FIG. 9A, a plurality of micro-objects (e.g., a reservoir of micro-objects) is located on the right side of the portion of the micro-assembler.

Figure 9B:
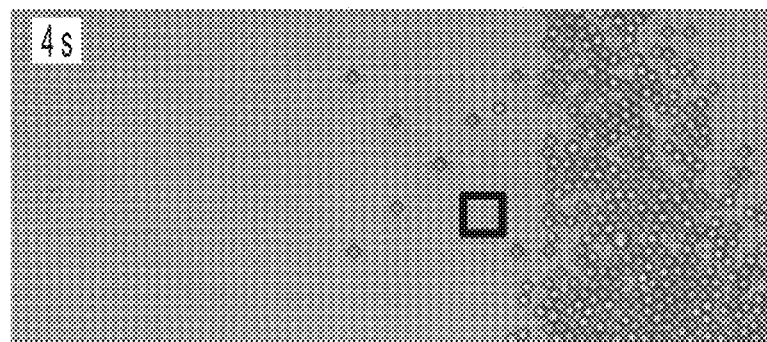
FIG. 9B is a diagram depicting a portion of a lab experiment result of a micro-assembler and a plurality of micro-objects, in accordance with some embodiments of the present disclosure.

FIG. 9B is a diagram depicting a portion of the micro-assembler and a plurality of micro-objects, in accordance with some embodiments of the present disclosure. As illustrated in FIG. 9B, a plurality of micro-objects (e.g., a reservoir of micro-objects) is located on the right side of the portion of the micro-assembler. The set of micro-objects is being moved towards the left side of the portion of the micro-assembler using a set of control patterns simultaneously. For example, a first control pattern may be used to hold the micro-objects on the right side in place (e.g., to prevent them from moving). A second control pattern (or a set of control patterns) may be used to move the set of micro-objects toward the left side. As illustrated in FIG. 9B, the set of micro-objects forms an "X" shape. Also as illustrated in FIG. 9B, the "X" shape is missing a micro-object, as indicated by the large solid square. For example, one micro-object is not in the proper position to allow the set of micro-objects to form the "X" shape.

Figure 9C:
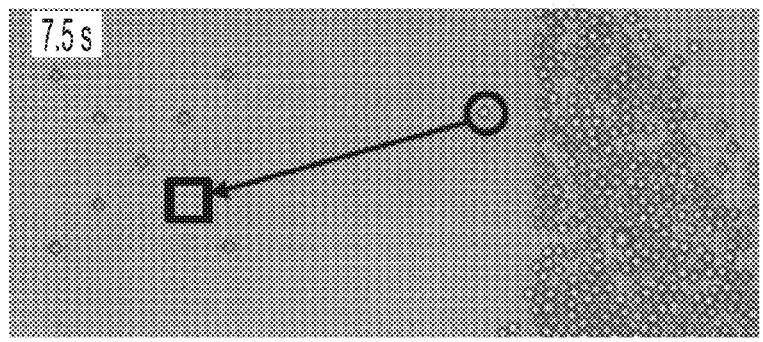
FIG. 9C is a diagram depicting a portion of a lab experiment result of a micro-assembler and a plurality of micro-objects, in accordance with some embodiments of the present disclosure.

FIG. 9C is a diagram depicting a portion of the micro-assembler and a plurality of micro-objects, in accordance with some embodiments of the present disclosure. As illustrated in FIG. 9C, a plurality of micro-objects (e.g., a reservoir of micro-objects) is located on the right side of the portion of the micro-assembler. The set of micro-objects has been moved to the left side of the portion of the micro-assembler. As discussed above, the set of micro-objects forms an "X" shape and one micro-object is not in the proper position to allow the set of micro-objects to form the "X" shape. The micro-object indicated by the solid circle may be moved towards the proper position in the "X" shape (indicated by the solid square and the arrow) using various control patterns, as discussed above. For example, a computing device may cycle through one or more control patterns to cause the micro-object in the solid circle to move towards the location indicated by the solid square. The computing device may use the one or more control patterns simultaneously with another control pattern that may be used to hold the micro-objects on the right side in place (e.g., to prevent them from moving), as discussed above.

Figure 10:
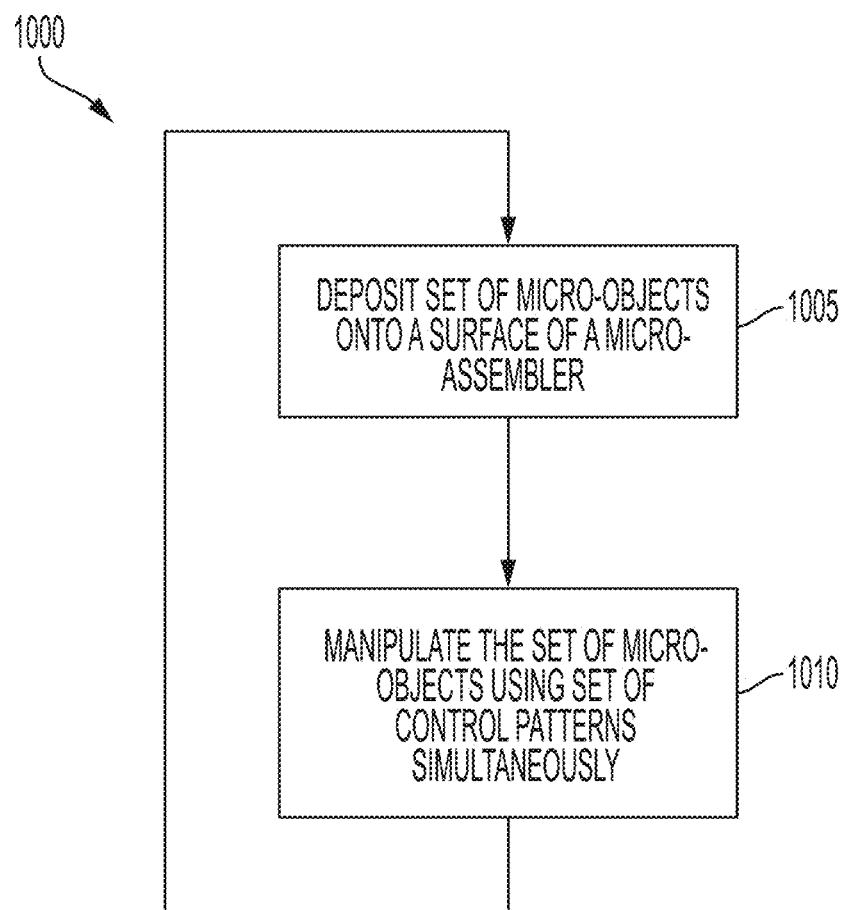
FIG. 10 is a flow diagram depicting a method for controlling the placement of the set of micro-objects on the surface of the micro-assembler, in accordance with some embodiments of the present disclosure.

FIG. 10 is a flow diagram depicting a method 1000 for controlling the placement of the set of micro-objects on the surface of the micro-assembler, in accordance with some embodiments of the present disclosure. Method 1000 may be performed by processing logic that may comprise hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 400 may be performed by a computing device (e.g., computing device 150 illustrated in FIG. 1) or a processing device (e.g., processing device 602 illustrated in FIG. 6).

Method 1000 begins at block 1005 where a set of micro-objects are deposited onto the surface of the micro-assembler. For example, a reservoir of micro-objects may be deposited onto the surface of the micro-assembler, as discussed above. At block 1010, the method 1000 may manipulate the set of micro-objects on the surface of the micro-assembler using a set of control patterns (e.g., control patterns 205 illustrated in FIG. 2 or discussed herein in conjunction with other figures). As discussed above, a control pattern may indicate a voltage pattern for at least a portion of a micro-assembler (e.g., a two-dimensional array of phototransistors, electrodes, transistors, etc.). For example, the method 1000 may cause light be emitted at some of the phototransistors to generate one or more of a positive voltage, a negative voltage, and an AC voltage, as discussed above. The positive voltage, the negative voltage, and the AC voltage patterns indicated or defined by the control patterns (e.g., control patterns 205 illustrated in FIG. 2 or discussed herein in conjunction with other figures) may be used to concentrate, spread out, move, orient, or hold micro-objects in place, as discussed above. The blocks 1005 and 1010 of figure may be repeated multiple times. For example, the blocks 1005 and 1010 may be repeated until there are no mover micro-objects to deposit onto the surface of the micro-assembler.

Figure 11:
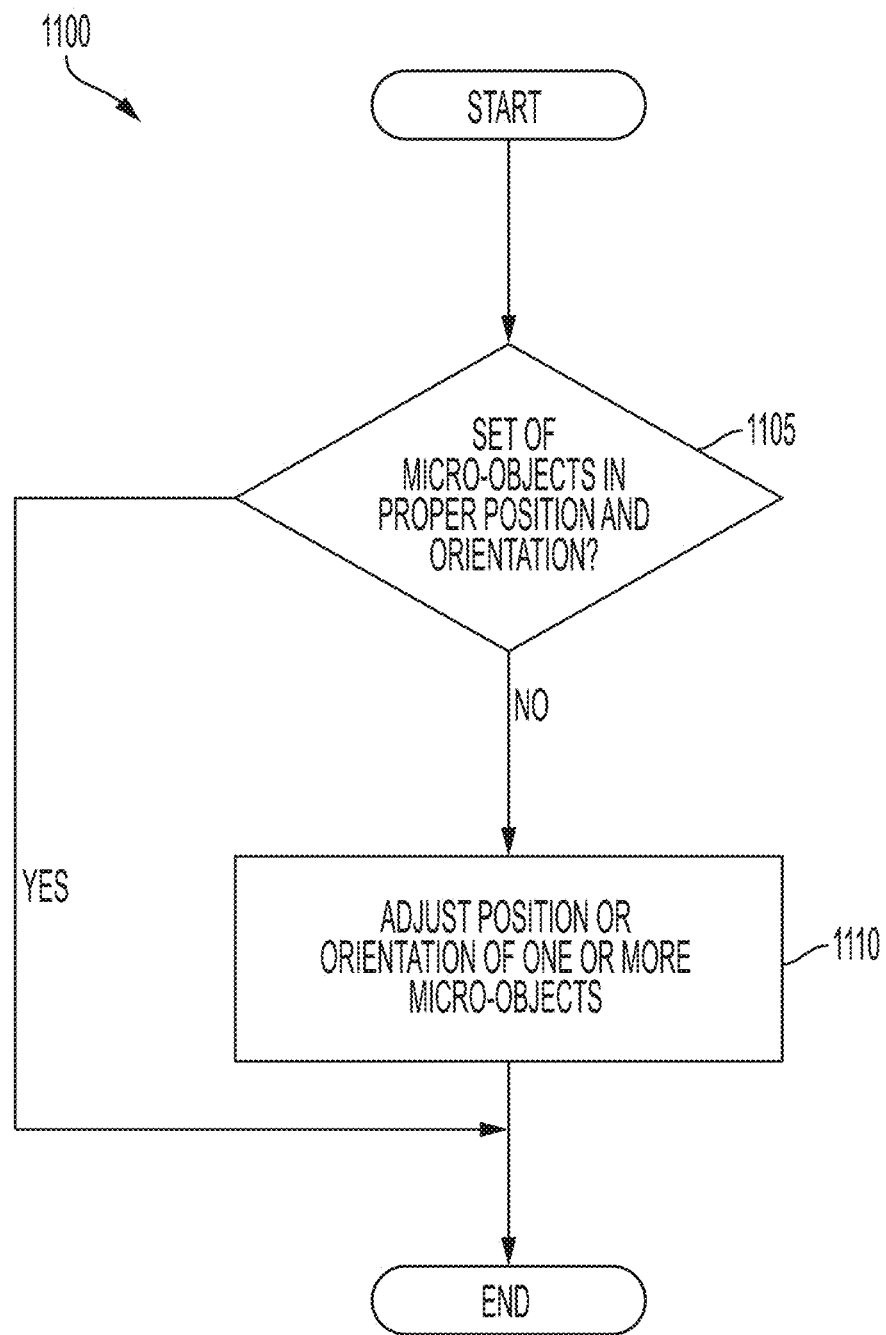
FIG. 11 is a flow diagram depicting a method for controlling the placement of the set of micro-objects on the surface of the micro-assembler, in accordance with some embodiments of the present disclosure.

FIG. 11 is a flow diagram depicting a method 1100 for controlling the placement of the set of micro-objects on the surface of the micro-assembler, in accordance with some embodiments of the present disclosure. Method 1100 may be performed by processing logic that may comprise hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 400 may be performed by a computing device (e.g., computing device 150 illustrated in FIG. 1) or a processing device (e.g., processing device 602 illustrated in FIG. 6).

Method 1100 begins at block 1105 where the method 1100 determines whether the set of micro-objects is in the proper position and orientation. For example, the method 1100 may use a camera to capture images or video of the set of micro-objects to determine if the micro-objects are in the proper position and orientation, as discussed above. In another example, the method 1100 may receive user input indicating that one or more micro-objects are not in the proper position or orientation (e.g., the method 1100 may receive user input indicating one or more control patterns). If the set of micro-objects is in the proper position and orientation, the method 1100 ends. If the set of micro-objects is not in the proper position or orientation, the method 1100 proceeds to block 1110 where the method 1100 may use one or more control patterns (e.g., control patterns 205 illustrated in FIG. 2 or discussed herein in conjunction with other figures) to adjust the position or orientation of one or more micro-objects, as discussed above. For example, the method 1100 may use the control patterns illustrated in FIGS. 8A through 8C to move one or more micro-objects along the surface of the micro-assembler. In another example, the method 1100 may generate one or more control patterns, identify one or more existing control patterns, or receive (via user input) one or more control patterns to adjust the position or orientation of one or more micro-objects based on user input, as discussed above.

Figure 12:
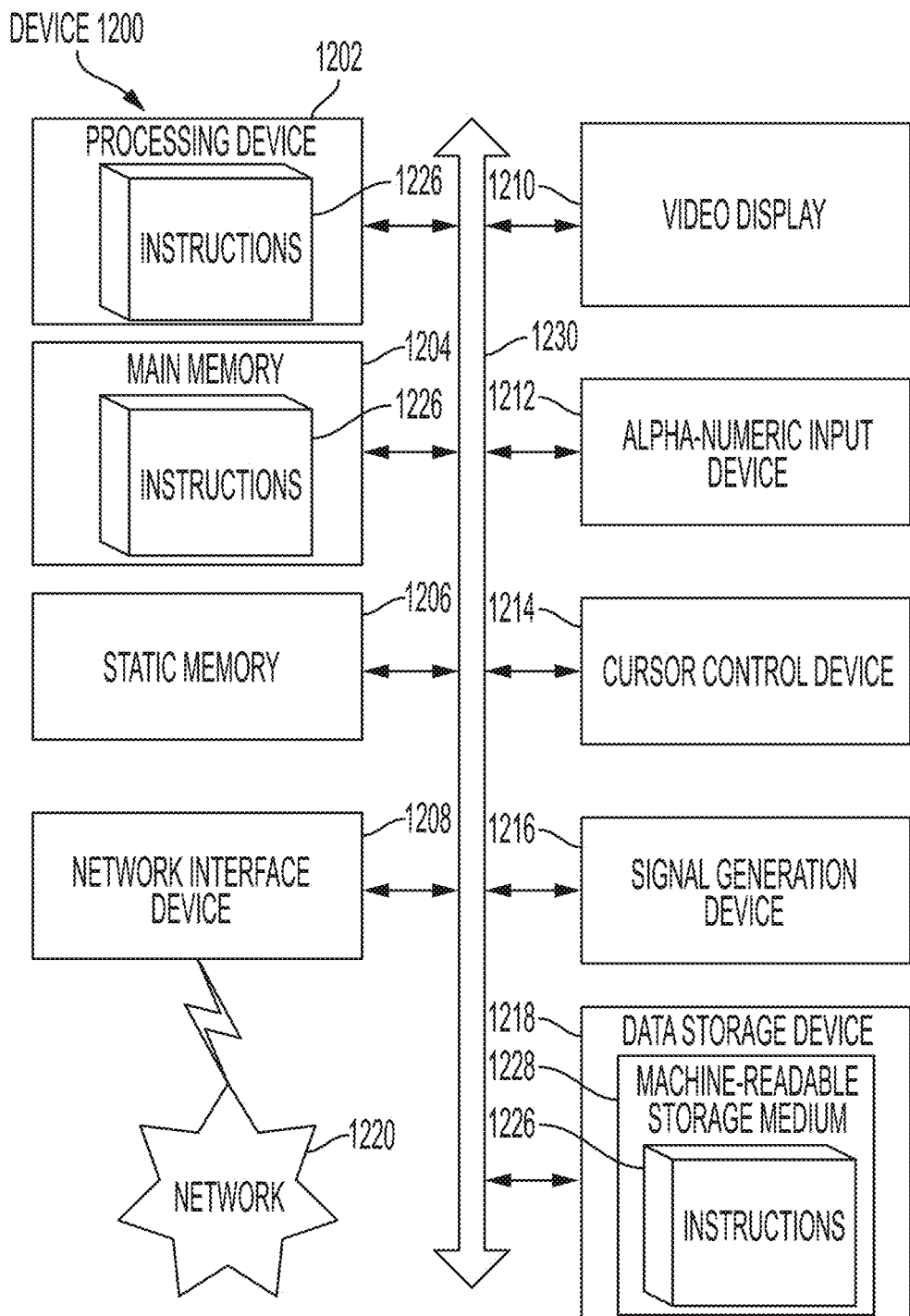
FIG. 12 is a block diagram depicting an example device that may perform one or more of the operations described herein, in accordance with some embodiments.

FIG. 12 is a block diagram depicting an example device 1200 that may perform one or more of the operations described herein, in accordance with some embodiments. Device 1200 may be connected to other devices in a LAN, an intranet, an extranet, and/or the Internet. The device may operate in the capacity of a server machine in client-server network environment or in the capacity of a client in a peer-to-peer network environment. The device may be an electronic or computing device (such as a personal computer (PC), a tablet computer, a PDA, a smartphone, a set-top box (STB), a server computer, etc.), a network device (such as a router, switch or bridge), or any machine capable of executing a set of instructions (sequential or otherwise) that specify actions to be taken by that machine. Further, while only a single device is illustrated, the term "device" shall also be taken to include any collection of devices that individually or jointly execute a set (or multiple sets) of instructions to perform the methods discussed herein.

The example device 1200 may include a processing device 1202 (e.g., a general purpose processor, a PLD, etc.), a main memory 1204 (e.g., synchronous dynamic random access memory (DRAM), read-only memory (ROM)), a static memory 1206 (e.g., flash memory and a data storage device 1218), which may communicate with each other via a bus 1230.

Processing device 1202 may be provided by one or more general-purpose processing devices such as a microprocessor, central processing unit, or the like. In an illustrative example, processing device 1202 may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 1202 may also comprise one or more special-purpose processing devices such as an application specific integrated circuit (ASIC), a field programmable gate array (FPGA), a digital signal processor (DSP), network processor, or the like. The processing device 1202 may be configured to execute the operations described herein, in accordance with one or more aspects of the present disclosure, for performing the operations and steps discussed herein.

Device 1200 may further include a network interface device 1208 which may communicate with a network 1220. The device 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse) and an acoustic signal generation device 1216 (e.g., a speaker). In one embodiment, video display unit 1210, alphanumeric input device 1212, and cursor control device 1214 may be combined into a single component or device (e.g., an LCD touch screen).

Data storage device 1218 may include a computer-readable storage medium 1228 on which may be stored one or more sets of instructions, e.g., instructions for carrying out the operations described herein, in accordance with one or more aspects of the present disclosure. Instructions implementing instructions 1226 for causing or instructing a light emitting device to emit light may also reside, completely or at least partially, within main memory 1204 and/or within processing device 1202 during execution thereof by device 1200, main memory 1204 and processing device 1202 also constituting computer-readable media. The instructions may further be transmitted or received over a network 1220 via network interface device 1208.

While computer-readable storage medium 1228 is shown in an illustrative example to be a single medium, the term "computer-readable storage medium" should be taken to include a single medium or multiple media (e.g., a centralized or distributed database and/or associated caches and servers) that store the one or more sets of instructions. The term "computer-readable storage medium" shall also be taken to include any medium that is capable of storing, encoding or carrying a set of instructions for execution by the machine and that cause the machine to perform the methods described herein. The term "computer-readable storage medium" shall accordingly be taken to include, but not be limited to, solid-state memories, optical media and magnetic media.

Figure 13:
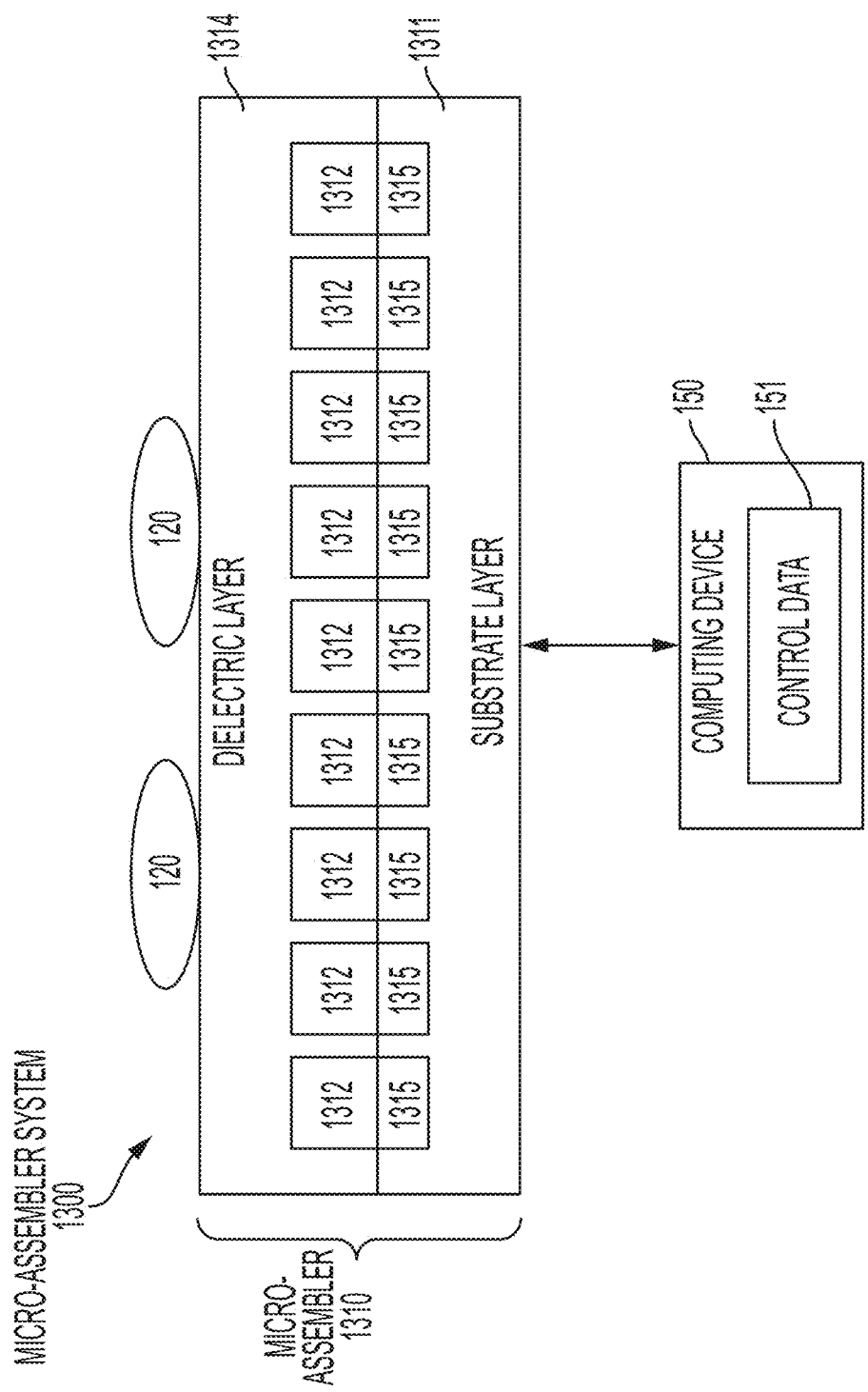
FIG. 13 is a schematic diagram of depicting an embodiment of a micro-assembler system for controlling placement of micro-objects, in accordance with some embodiments of the present disclosure.

FIG. 13 is a schematic diagram of depicting an embodiment of a micro-assembler system 1300 for controlling placement of micro-objects 120, in accordance with some embodiments of the present disclosure. The micro-assembler system 1300 includes a micro-assembler 110 and a computing device 150. The micro-assembler system may be used to move, hold in place, or control the placement (e.g., control one or more of the position or orientation) of the micro-objects 120.

In one embodiment, the computing device 150 may be any suitable type of computing device or machine that includes one or more programmable processors (e.g., one or more server computers, desktop computers, laptop computers, tablet computers, smartphones, set-top boxes, gaming consoles, personal digital assistants (PDAs), etc. In some examples, a computing device may comprise a single machine or may include multiple interconnected machines.

The micro-assembler 1310 includes a substrate layer 1311, electrodes 1312, and a dielectric layer 1314. The substrate layer 1311 may be a layer of material where the electrodes 1312 may be placed. In one embodiment, the substrate layer 1311 may be a glass substrate. In another embodiment, the substrate layer 1311 may be transparent, semi-transparent, opaque, etc. A plurality of switches 1315 may be located within the substrate. Each switch 1315 is coupled (e.g., electrically coupled) to an electrode 1312. The switches 1315 may be used to couple and/or decouple the electrodes from voltage sources. This may allow the electrodes 1312 to generate a charge, an electric field, and/or a magnetic field. In some embodiments, a switch 1315 may be coupled to multiple electrodes 1312. Although switches 1315 are illustrated in FIG. 13, other components, devices, circuits, etc., may be used to couple the electrodes 1312 to and/or decouple the electrodes 1312 from a voltage source.

The electrodes 1312 may be located on a top surface of the substrate layer 1311. The electrodes 1312 may also be located within the dielectric layer 1314. The dielectric layer 1314 may be made of a material that is an electrical insulator. The material may also be polarized by an applied electric field. The micro-objects 120 may be located or deposited on a top surface of the dielectric layer 1314. The top surface of the dielectric layer 1314 may also be a surface of the micro-assembler 1310.

In one embodiment, an electrode 1312 may be a device, component, wire, pin, trace, line, etc., that may generate a charge, an electric field and/or a magnetic field. The electrodes 1312 may be arranged in on the substrate in an M×N matrix or an array, where M and N are two arbitrary numbers. For example, the electrodes 1312 may form a two-dimensional (2D) array as illustrated in FIG. 2. Each electrode 1312 may be referred to as a pixel.

As discussed above, when an electrode 1312 is coupled to a voltage source (via a switch 1315), an electric current may flow through the electrode 1312. This may cause a negative or a positive voltage to be applied to one or more of the electrode 1312. In addition, coupling an electrode 1312 to the voltage source may create or apply an alternating current (AC) voltage at the electrode 1312. One or more of the negative voltages, positive voltages, and the AC voltage may generate one or more DEP and EP forces which may act upon the micro-objects 120. The DEP and EP forces that are exerted on the micro-objects 120 may cause the micro-objects 120 to move around the surface of the micro-assembler 1310 (e.g., a top surface of the micro-assembler 1310, a surface of the dielectric layer 1314). Thus, the DEP and EP forces may be used to control the placement of micro-objects 120 on the surface of the micro-assembler 1310, as discussed above.

In one embodiment, a plurality of micro-objects 120 may be deposited onto the surface of the micro-assembler 1310. The placement of a set of the micro-objects 120 on the surface of the micro-assembler 1310 may be controlled using the electrodes 1312. For example, the computing device 150 may control some of the switches 1315 to couple the electrodes 1312 to an electric current. The electric current may result in one or more of negative voltages, positive voltages, or AC voltage. The negative voltages, positive voltages, and the AC voltage generated by the electrodes 1312 may exert DEP or EP forces on the set of micro-objects 120 which may be used to move the set of micro-objects 120, or change one or more of the positions or orientations of the set of micro-objects 120. The set of micro-objects 120 can include one or more micro-objects, as discussed above. The set of micro-objects may be functionally identical or distinct.

In one embodiment, the micro-assembler 1310 (or the micro-assembler system 1300) may control the placement of the set of micro-objects 120 by moving the set of micro-objects across the surface of the micro-assembler 1310 relative to one or more of a reference structure or a second set of micro-objects. In another embodiment, the micro-assembler 1310 (or the micro-assembler system 1300) may control the placement of the set of micro-objects 120 by concentrating the set of micro-objects, as discussed above. In a further embodiment, the micro-assembler 1310 (or the micro-assembler system 1300) may control the placement of the set of micro-objects 120 by deconcentrating the set of micro-objects, as discussed above.

In one embodiment, the micro-assembler 1310 (or the micro-assembler system 1300) may control the placement of the set of micro-objects 120 by controlling a second placement of a second set of set of micro-objects on the surface of the micro-assembler using the two-dimensional array of photoconductors, simultaneous with controlling the placement of the set of micro-objects, as discussed above. The micro-assembler 1310 may simultaneously control the placement of multiple sets of micro-objects 120 by controlling the switches 1315 to couple and/or decouple different sets of electrodes 1312 with a voltage source. In another embodiment, the micro-assembler 1310 (or the micro-assembler system 1300) may control the placement of the set of micro-objects 120 by controlling one or more of a position or orientation of each micro-object in the set of micro-objects in a 2-dimensional plane parallel to the surface of the surface of the micro-assembler 1310, as discussed above. In a further embodiment, the micro-assembler 1310 (or the micro-assembler system 1300) may control the placement of the set of micro-objects 120 by controlling one or more of a position or orientation of a first micro-object of the set of micro-objects in three dimensions relative to the surface of the micro-assembler 1310, as discussed above.

In one embodiment, the micro-assembler 1310 (or the micro-assembler system 1300) may control the placement of the set of micro-objects 120 by distributing the micro-objects 120 (e.g., the reservoir of micro-objects 120) to random locations on the surface of the micro-assembler, as discussed above. In another embodiment, the micro-assembler 1310 (or the micro-assembler system 1300) may control the placement of the set of micro-objects 120 by forming one or more sets of micro-objects 120 into a pattern on the surface of the micro-assembler, as discussed above. In a further embodiment, the micro-assembler 1310 (or the micro-assembler system 1300) may control the placement of the set of micro-objects 120 by controlling a sub-set of micro-objects 120 within the set of micro-objects 120, as discussed above.

In one embodiment, the micro-assembler 1310 (or the micro-assembler system 1300) may control the placement of the set of micro-objects 120 by holding the set of micro-objects 120 in place on the surface of the micro-assembler 1310, as discussed above. In another embodiment, the set of micro-objects 120 may be held in place with enough force to withstand shear and drag forces that may be generated by fluid flow, electroosmotic flow, vibrations, or DEP or EP forces generated by sources other than the micro-assembler 1310, as discussed above.

As discussed above, the switches 1315 may be controlled by the computing device 150. For example, the computing device 150 may activate or close one or more switches 1315 to couple one or more electrodes 1312 to a voltage source. In another example, the computing device 150 may deactivate or open one or more switches 1315 to decouple one or more electrodes 1312 from the voltage source. In one embodiment, the computing device 150 may to instruct control the switches 1315 based on the control data 151.

In one embodiment, the control data 151 may indicate one or more control patterns that may be applied to the micro-assembler 1310. A control pattern may indicate a voltage pattern for the micro-assembler 1310. For example, the control data 151 may indicate control patterns which may indicate which electrodes 1312 should be coupled to the voltage source. Each control pattern may include a set of X-Y positions and an orientation angle that may indicate which electrodes 1312 should be coupled to the voltage source. The control pattern may be any size from as small as a single electrode 1312 to the full size of the micro-assembler 1310. The electrodes 1312 which are coupled to the voltage source may form one or more patterns on the micro-assembler 1310, as discussed above. In another example, the control pattern may indicate what portions of the micro-assembler 1310 should generate an electric field. For example, the control pattern may indicate which of the electrodes 1312 should generate an electric field. As discussed above, a control pattern may also be referred to as a sprite.

In one embodiment, the computing device 150 may cause one or more electrodes, transistors, etc., to generate one or more electric fields and/or one or more magnetic fields based on the control pattern. For example, the control pattern may indicate the X-Y coordinates or locations of certain electrodes 1312 and the computing device 150 may connect the certain electrodes to a voltage source by controlling one or more switches 1315, based on the control pattern. Causing the electrodes 1312 to generate an electric field may allow the computing device 150 to generate the voltage pattern indicated by the control pattern.

In another embodiment, the computing device 150 may couple different sets of electrodes 1312 to a voltage source based on multiple control patterns simultaneously. For example two, four, ten, or some other appropriate number of control patterns, each having different size, shape, position and orientation may be used simultaneously.

In one embodiment, the computing device 150 may cycle through multiple control patterns sequentially. Control patterns that are part of a cycle may share a common position and orientation, but may indicate different electrodes 1312 or may cause different electrodes 132, to generate an electric field, as discussed above. Each control pattern may indicate different sets or groups of electrodes 1312 that should be coupled to the voltage source. The control data 151 may use a first control pattern to control a first set switches 1315 to couple a first set of electrodes 1312 to a voltage source, may use a second control pattern to control a second set switches 1315 to couple a second set of electrodes 1312 to the voltage source, etc. This process may create dynamic (e.g., varying or changing) EP and DEP forces. Control patterns that are part of a cycle may also be applied to different positions or may have different orientations. In some embodiments, the computing device 150 may cycle through the multiple control patterns without analyzing the positions, locations, orientations, etc., of the micro-objects 120, as discussed above. This may be referred to as an open loop.

In one embodiment, a user may provide user input to create, define, generate, modify, update, etc., control patterns. This may allow the user to control the position and orientation of one or more micro-objects 120 by inputting or providing one or more control patterns, or by indicating which existing control patterns should be used (e.g., which control patterns should be used in what order).

Figure 14:
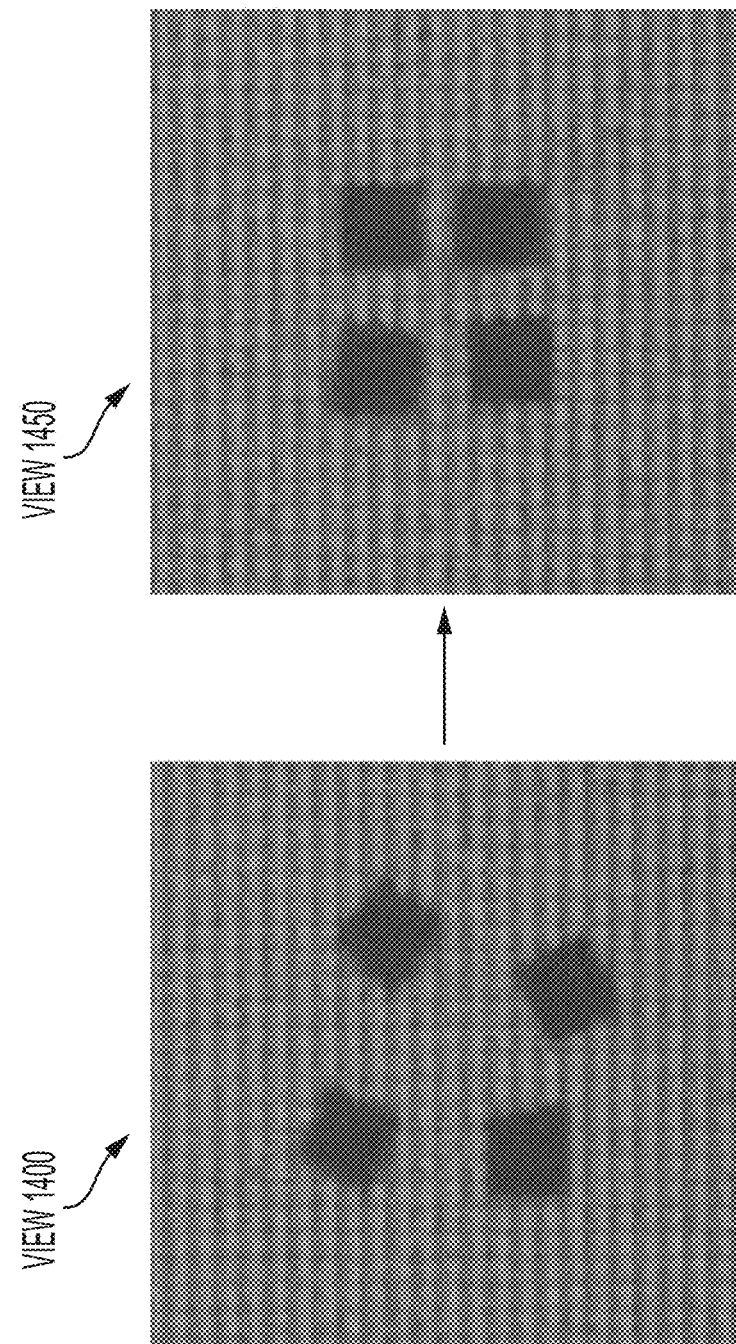
FIG. 14 is a diagram depicting views of a portion of a lab experiment result of a micro-assembler and a set of micro-objects, in accordance with some embodiments of the present disclosure.

FIG. 14 is a diagram depicting views 1400 and 1450 of a portion of the micro-assembler (e.g., micro-assembler 110 illustrated in FIGS. 1 and 2) and a set of micro-objects, in accordance with some embodiments of the present disclosure. In one embodiment, the micro-objects illustrated in FIG. 14 may be chiplets. Chiplets may be micro-objects that have at least one straight edge or side (e.g., a triangle, a square, a rectangle, a half-circle, a trapezoid, etc.). The micro-objects are represented as a dark (e.g., black) quadrilateral shapes (e.g., a rectangle, a square, etc.) on the surface of the micro-assembler. Each of the smaller gray squares represents an electrode or transistor of the micro-assembler.

As illustrated in FIG. 14, the orientation of the micro-object may be changed. For example, as illustrated in view 1400, the edges of the micro-objects (e.g., the chiplets) may not be aligned with each other (e.g., may not be parallel to each other). The bottom left micro-object may be aligned with X-axis (e.g., horizontal axis) and the Y-axis (e.g., vertical axis) of the surface of the micro-assembler and the top left, top right, and bottom right micro-objects may not be aligned with one or more of the edges of the bottom left micro-object. In view 1450, the top left, top right, and bottom right micro-objects have been rotated, moved, positioned, etc., such that the one or more of the edges of micro-objects are aligned (e.g., parallel or substantially parallel) with each other. For example, the top left micro-object has been rotated such that the bottom edge of the bottom left micro-object is parallel with the top edge of the bottom left micro-object. In another example, the top right micro-object has been rotated such that the left edge of the bottom left micro-object is parallel with the right edge of the top left micro-object. In a further example, the bottom right micro-object has been rotated such that the left edge of the bottom left micro-object is parallel with the right edge of the bottom left micro-object.

Figure 15:
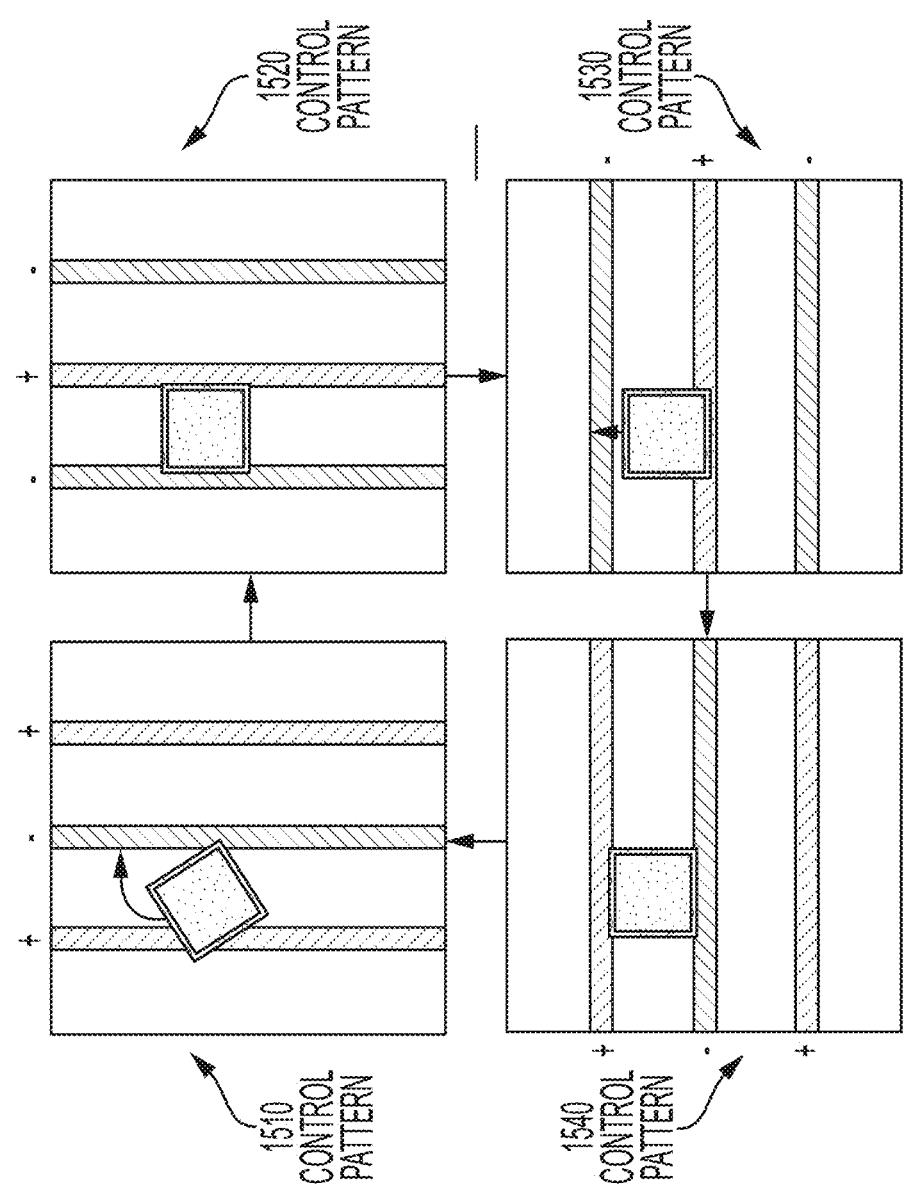
FIG. 15 is a diagram depicting example control patterns that may be applied to a portion of a micro-assembler, in accordance with some embodiments of the present disclosure.

FIG. 15 is a diagram depicting example control patterns 1510, 1520, 1530, and 1540 that may be applied to a portion of a micro-assembler (e.g., micro-assembler 110 illustrated in FIGS. 1 and 2), in accordance with some embodiments of the present disclosure. The portion of the micro-assembler may include rows and columns of electrodes or transistors. The diagonal dotted hashed regions may include electrodes/transistors that are generating a positive voltage. The diagonal solid hashed regions may include electrodes/transistors that are generating a negative voltage. The white regions may include electrodes/transistors that are not generating a voltage. The micro-object may be trapped in the white regions between the diagonal dotted hashed regions and the diagonal solid hashed regions. For example, the micro-object may be trapped in the regions with no voltage that are in between the regions with temporally changing positive voltage and negative voltage.

As illustrated in FIG. 15, a micro-object (e.g., a chiplet) may be rotated clockwise when the control pattern 1510 is applied to the portion of the micro-assembler (as indicated by the arrow originating from the micro-object). The left/right edges of the micro-object may be aligned with the left/right edges of the micro-assembler when the control pattern 1520 is applied to the portion of the micro-assembler. The micro-object may be moved upwards when the control pattern 1530 is applied to the portion of the micro-assembler. The top/bottom edges of the micro-object may be aligned with the top/bottom edges of the micro-assembler when the control pattern 1540 is applied to the portion of the micro-assembler. The control patterns 1510 through 1540 may be applied to the portion of the micro-assembler in closed loop or open-loop. For example, control pattern 1510 may be applied, followed by control pattern 1520, followed by control pattern 1530, followed by control pattern 1540, followed by control pattern 1510, and so on and so forth.

Figure 16:
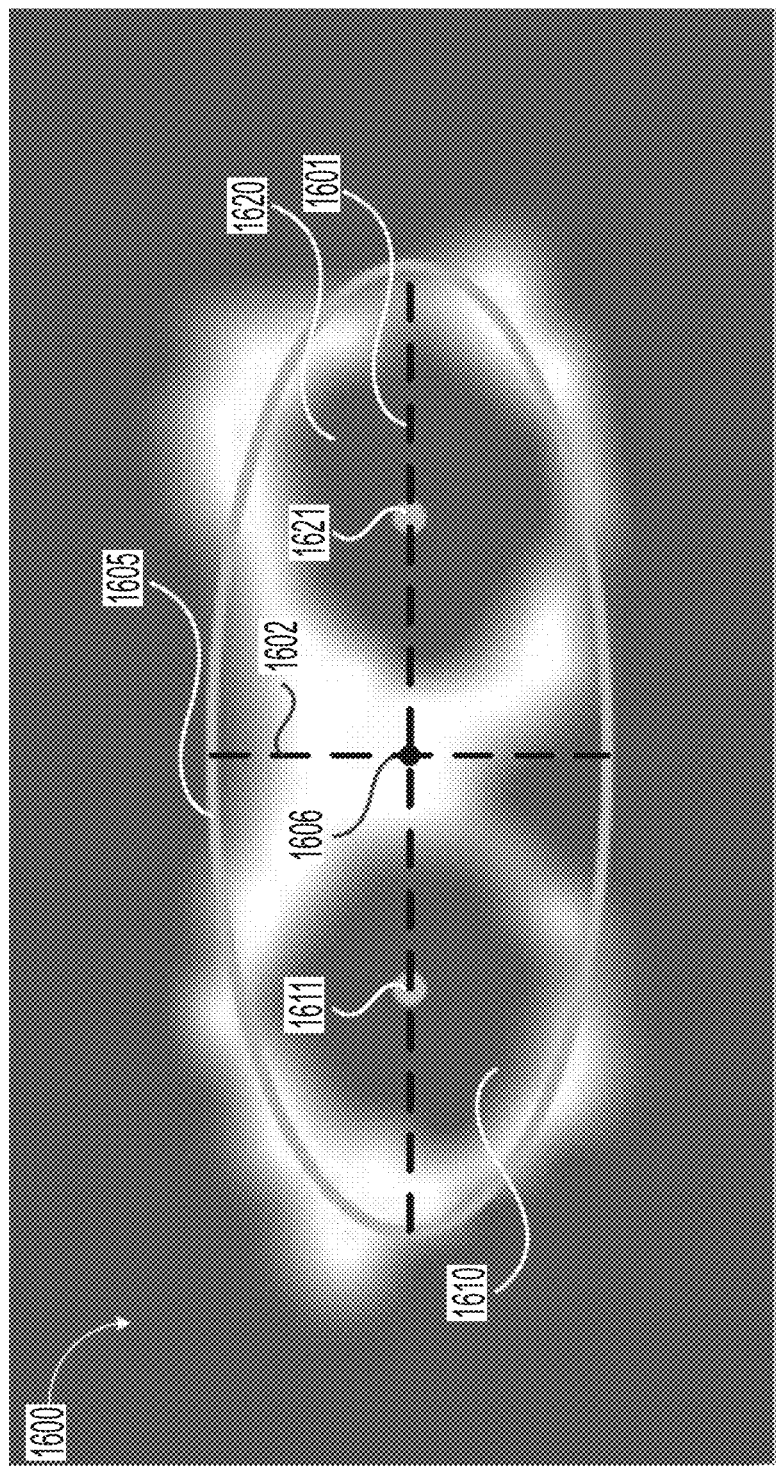
FIG. 16 is a diagram illustrating the detection of multiple micro-objects in a set of micro-objects, in accordance with some embodiments.

FIG. 16 is a diagram illustrating the detection of multiple micro-objects in a set of micro-objects 1600. The set of micro-objects 1600 includes a first micro-object 1610 and a second micro-object 1620. FIG. 16 may illustrate how one or more geometric properties of the set of micro-objects 1600 may be determined by a computing device. The computing device may detect sets of micro-objects that include multiple (e.g., more than two) micro-objects that are in contact with each other (e.g., touching each other) or that are within a threshold distance of each other. For example, the computing device may detect the set of micro-objects 1600.

As illustrated in FIG. 16, an ellipse 1605 (e.g., a geometric shape) is identified or determined for the set of micro-objects 1600. The ellipse 1605 may be positioned such that the boundary of the ellipse 1605 encompasses the first micro-object 1610 and the second micro-object 1620. For example, the ellipse 1600 may be fitted around the first micro-object 1610 and the second micro-object 1620. The ellipse includes a major access 1601 and a minor axis 1602. The position of the first micro-object 1610 and the second micro-object 1620 may be estimated based on the ellipse 1600. For example, the centers of the micro objects 1610 and 1620 may be estimated to be along the major axis 1601. A first focus of the ellipse 1605 may be the center 1611 of the first micro-object 1610. A second focus of the ellipse 1605 may be the center 1621 of the second micro-object 1620. The center 1606 of the ellipse 1605 may be located between the first micro-object 1610 and the second micro-object 1620. Using a Cartesian coordinate system, the center 1606 may have the coordinates (e.g., X-Y coordinates) 0,0. The center 1611 may have the coordinates –C, 0, where –C is the horizontal distance between 1611 and 1606. The center 1621 may have the coordinates C, 0, where C is the horizontal distance between 1606 and 1621.

In one embodiment, identifying the centers of the set of micro-objects 1600, the first micro-object 1610, and the second micro-object 1620 may include identifying points within the ellipse (or other shape) that are uniformly or evenly spaced out within the ellipse (or other shape). For example, if a square is used to encompass four micro-objects, four evenly spaced points within the square may represent estimated locations for the centers of the four micro-objects. In other embodiments, non-deterministic (e.g., random or pseudorandom) points within the ellipse (or other shape) may be selected, identified, determined, etc.

In one embodiment, a set of micro-objects that are in contact with each other may be analyzed. The set of micro-objects may be in contact with each other each micro-object in the set of micro-objects is touching or in contact with at least one other micro-object in the set of micro-objects. In other embodiments, the set of micro-objects may include micro-objects that are within a threshold distance of each other. For example, each micro-object in the set of micro-objects may be within a threshold distance of another micro-object. One or more geometric properties of the set of micro-objects may be determined. For example, a shape (e.g., a geometric shape, an irregular shape, etc.) may be identified such that the shape encompasses the set of micro-objects. A center of the shape (e.g., a center of mass) or centers of micro-objects within the set of micro-objects may be determined. A computing device may divide the set of micro-objects into a first subset of micro-objects and a second-subset of micro-objects based on the one or more geometric properties and one or more control patterns, as discussed in more detail below.

Figure 17:
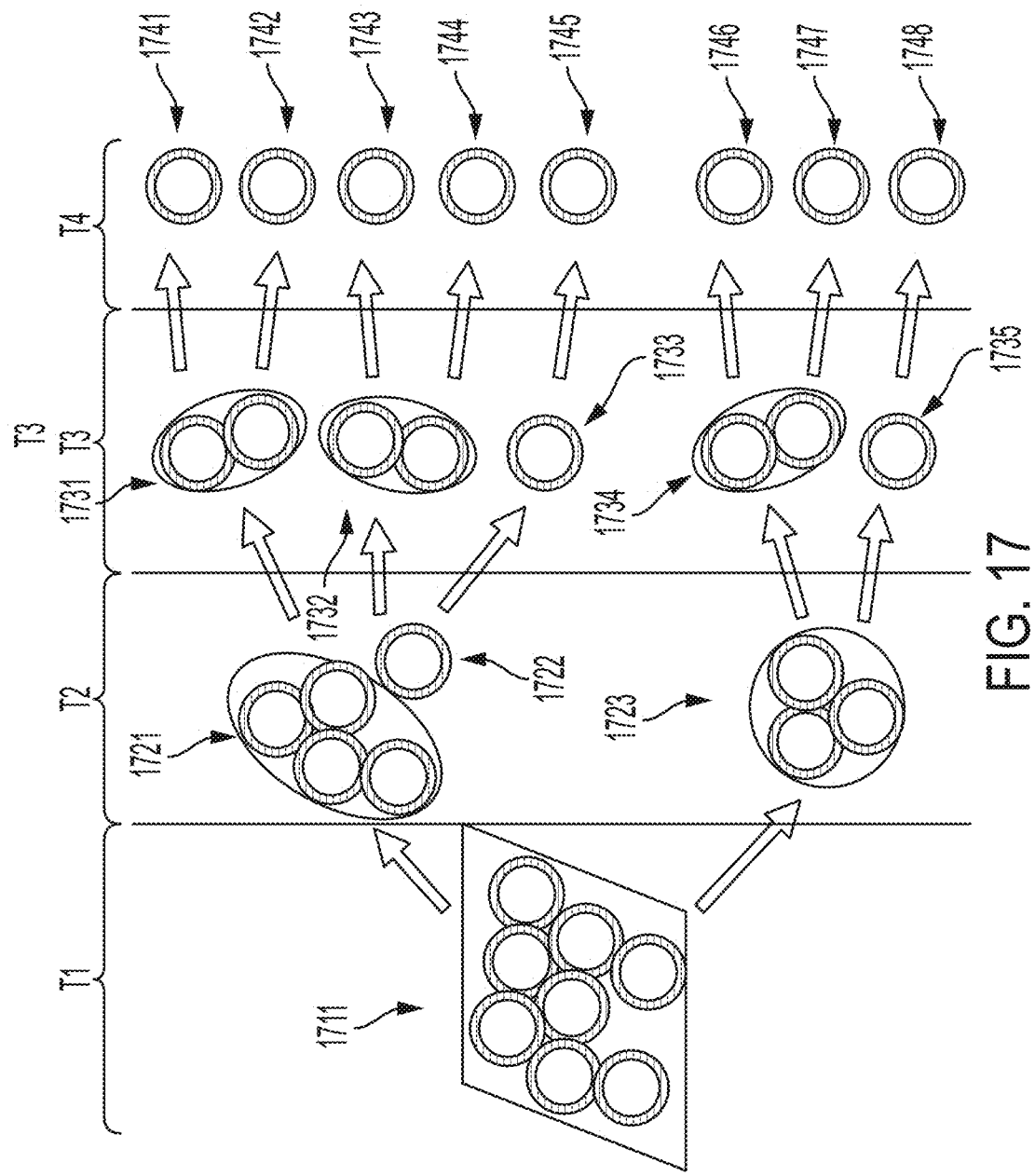
FIG. 17 is a diagram depicting example sets of micro-objects that are separated into smaller sets of micro-objects over a period of time, in accordance with some embodiments.

FIG. 17 is a diagram depicting example sets of micro-objects that are separated into smaller sets (e.g., sub-sets) of micro-objects over a period of time, in accordance with some embodiments. As discussed above, a set of micro-objects that are in contact with each other may be analyzed. One or more geometric properties (e.g., a geometric shape, centers of sets of micro-objects or individual micro-objects, etc.) may be determined. The set of micro objects may be divided into additional sets (e.g., smaller sets or subsets of micro-objects). The operations of analyzing, identifying or determining one or more geometric properties, and dividing may be iteratively repeated until all of the micro-objects are no longer in contact with each other (e.g., no micro-object from in the initial set of micro-objects is in contact with or touching any other micro-object).

In one embodiment, a computing device may analyze a set of micro-objects that are located on a surface of a micro-assembler (e.g., micro-assembler 110 illustrated above). For example, a computing device may analyze an image of a set of micro-objects to determine whether the micro-objects in the set of micro-objects are in contact with each other. A set of micro-objects that are in contact with or touching each other may be referred to as a blob. Detecting a blob may be referred to as blob detection.

As illustrated in FIG. 17, the computing device may detect a set of micro-objects 1711 and may determine that the set of micro-objects 1711 has a general shape of a parallelogram (e.g., may determine a geometric property of the set of micro-objects 1711) at time T1. The micro-objects are represented in FIG. 17 by the bold circles. One or more control patterns may be applied to one or more electrodes of the micro-assembler based on the shape of the set of micro-objects 1711 to divide the set of micro-objects 1711 into multiple sets (e.g., subsets, smaller sets, etc.) of micro-objects. For example, control patterns may be applied to electrodes located/positioned at edges, corners, or non-deterministic locations (e.g., random, pseudorandom locations) around the boundary of the parallelogram.

At time T2, the set of micro-objects 1711 has been divided into a set of micro-objects 1721, a set of micro-objects 1722 (which includes one micro-object), and a set of micro-objects 1723. The computing device may determine geometric properties for the set of micro-objects 1721, the set of micro-objects 1723, and the set of micro-objects 1723. For example, the computing device may determine that the set of micro-objects 1721 has a general shape of an ellipse and the set of micro-objects 1723 has a general shape of a circle. One or more control patterns may be applied to one or more electrodes of the micro-assembler based on the geometric properties of the set of micro-objects 1721 and the set of micro-objects 1723, as discussed above.

At time T3, the set of micro-objects 1721 has been divided into a set of micro-objects 1731 a set of micro-objects 1732, and a set of micro-objects 1733 (which includes one micro-object). The set of micro-objects 1723 has been divided into a set of micro-objects 1734 and a set of micro-objects 1735 (which includes one micro-object). The computing device may determine geometric properties for the sets of micro-objects 1731 through 1735. For example, the computing device may determine that the sets of micro-objects 1731, 1732, and 1734 have a general shape of an ellipse. One or more control patterns may be applied to one or more electrodes of the micro-assembler based on the geometric properties of the sets of micro-objects 1731, 1732, and 1734, as discussed above.

At time T4, the sets of micro-objects 1731, 1732, and 1734 have been divided into sets of micro-objects 1741 through 1748. Each of sets of micro-objects 1741 through 1748 includes one micro-object.

In one embodiment, the computing device may not determine the exact number of micro-objects in the blob (e.g., the group or set of micro-objects that are touching). The computing device may also not determine the exact position or location of the micro-objects within the blob. Instead, the computing device may analyze the set of micro-objects (e.g., analyze an image of the set of micro-objects, analyze data received from other sensors such as magnetic field or electric field sensors) to determine if any blobs that are larger in size then one micro-object are detected. If blobs are detected, the computing device may perform various closed-loop operations, functions, etc., to separate the blobs (e.g., sets, groups, etc.) of micro-objects. Because the analysis of the set of micro-object is reduced (e.g., detecting that the size of a blob is greater than one micro-object rather than detecting an exact number micro-objects and their respective positions) the computing device may be able to analyze the micro-objects more quickly and efficiently. In addition, less complex or less computationally expensive image processing operations, techniques, algorithms, functions, etc., may be used. This allows the computing device to separate a blob of micro-objects more quickly and using less computation or processing power.

Figure 18:
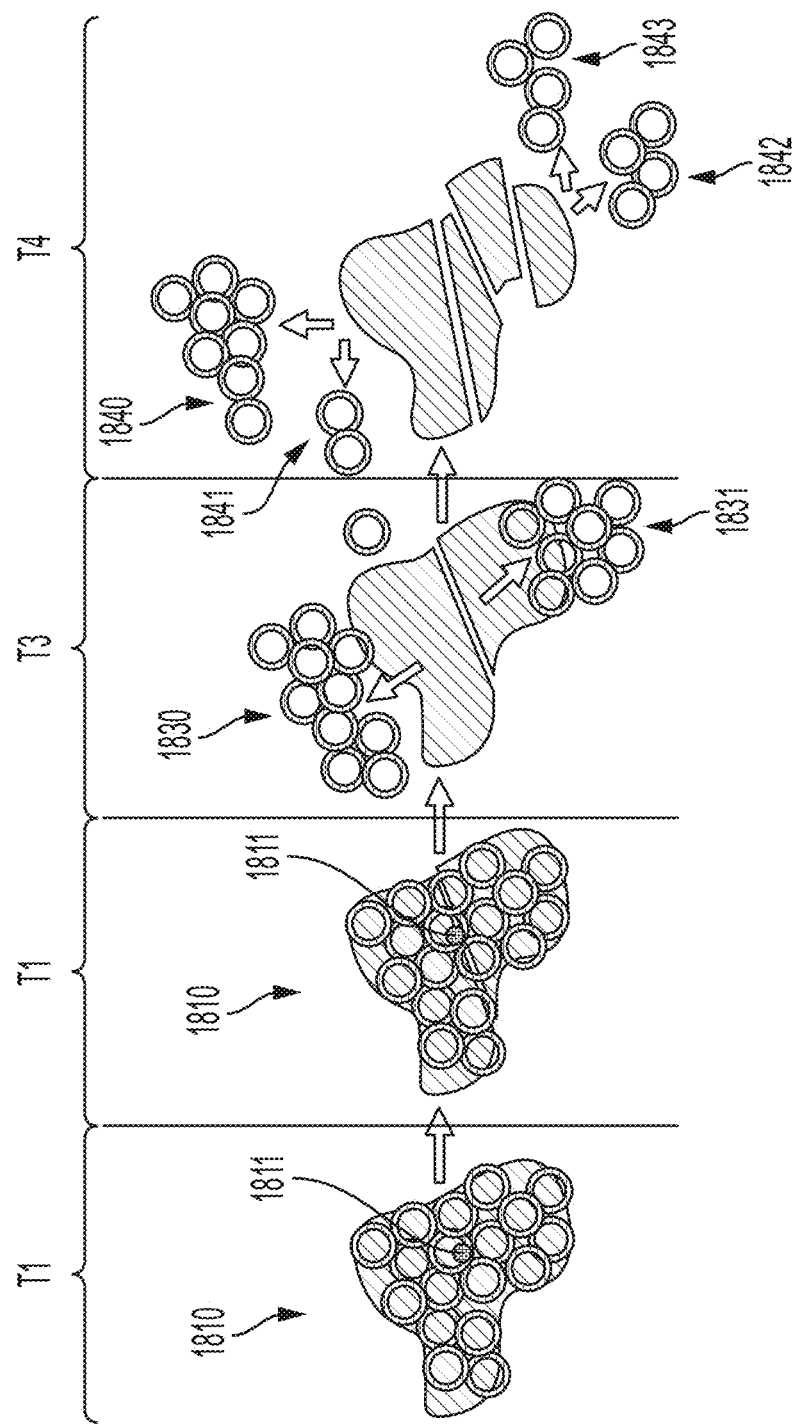
FIG. 18 is a diagram depicting example sets of micro-objects that are separated into smaller sets of micro-objects over a period of time, in accordance with some embodiments.

FIG. 18 is a diagram depicting example sets of micro-objects that are separated into smaller sets (e.g., sub-sets) of micro-objects over a period of time, in accordance with some embodiments. As discussed above, a set of micro-objects that are in contact with each other may be analyzed. One or more geometric properties (e.g., a geometric shape, centers of sets of micro-objects or individual micro-objects, etc.) may be determined. The set of micro objects may be divided into additional sets (e.g., smaller sets or subsets of micro-objects). The operations of analyzing, identifying or determining one or more geometric properties, and dividing may be iteratively repeated until all of the micro-objects are no longer in contact with each other (e.g., no micro-object from in the initial set of micro-objects is in contact with or touching any other micro-object). Sets of micro-objects may be referred to as blobs or micro-object blobs.

As illustrated in FIG. 18, a computing device may analyze a set of micro-objects 1810. The micro-objects are represented in FIG. 18 by the bolded circles. The computing device may determine a center 1811 (e.g., a center of mass, a centroid) of the set of micro-objects 1810 (e.g., a blob) at time T1. The set of micro-objects 1810 may be encompassed by an irregular shape (illustrated by the dark area at time T1). At time T2, the computing device may determine a line, trajectory, etc., that may be used to divide or cut the set of micro-objects 1810. The line may go through the center 1811. The computing device may divide, separate, cut, etc., the set of micro-objects 1810 into two additional sets (e.g., subsets, smaller sets, etc.) use the line. For example, the computing device may identify a second trajectory or second line that is normal to the first line and also goes through the center 1811. The computing device may identify one or more sets of electrodes that are on the second line. At time T3, the computing device may apply control patterns to the one or more sets of electrodes. This may cause the set of micro-objects 1810 to be divided, split, cut, etc., into two sets of micro-objects 1830 and 1831. The above-operations may be repeated at time T4 to divide the set of micro-objects 1830 into sets of micro-objects 1840 and 1841, and to divide the set of micro-objects 1831 into sets of micro-objects 1842 and 1843. Instead of identifying a geometric shape (e.g., fitting the set of micro-objects 1810 to a geometric shape), the computing device may use a center of each set of micro-objects and may identify a line (e.g., a cut line) that may be used to divide each set of micro-objects. This may also increase the speed and reduce the computation/processing power for separating sets of micro-objects.

Figure 19:
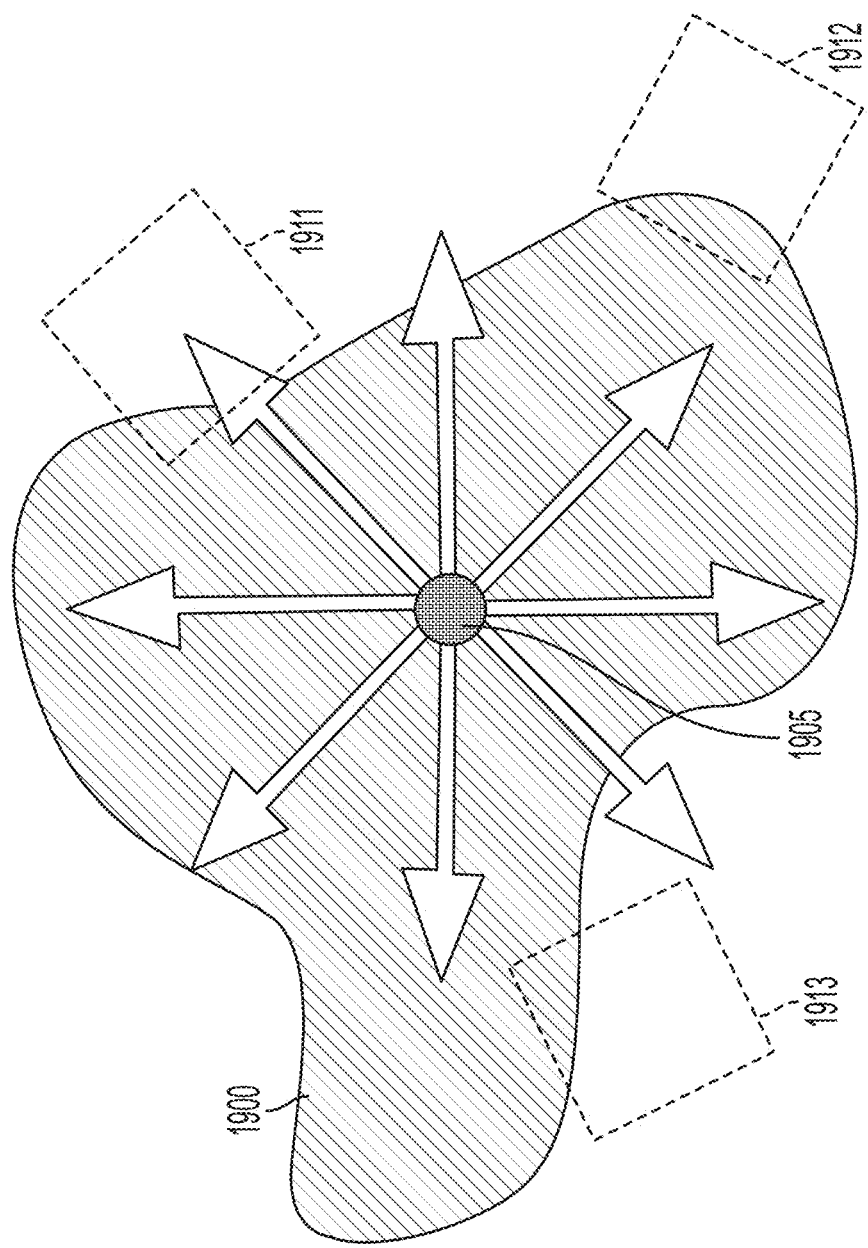
FIG. 19 is a diagram depicting a set of micro-objects, in accordance with some embodiments.

FIG. 19 is a diagram depicting a boundary 1900 for set of micro-objects, in accordance with some embodiments. The boundary 1900 may encompass a set of micro-objects (e.g., a blob) that are touching or within a threshold distance of each other. The boundary 1900 (and the set of micro-objects encompassed by the boundary 1900) may have a center 1905. In one embodiment, control patterns may be applied to one or more sets of electrodes that are along the boundary (e.g., along the periphery) and/or a threshold distance from the boundary may be selected. The control patterns may be applied to the sets of electrodes non-deterministically (e.g., randomly, pseudo-randomly, etc.). In another example, the sets of electrodes may be identified based on the distances between the center and the boundary (e.g., select electrodes that are the furthest away from the center). As illustrated in FIG. 19, electrodes located in the areas 1911, 1912, and 1913 (e.g., regions or portions of a micro-assembler) may be identified or selected.

Figure 20:
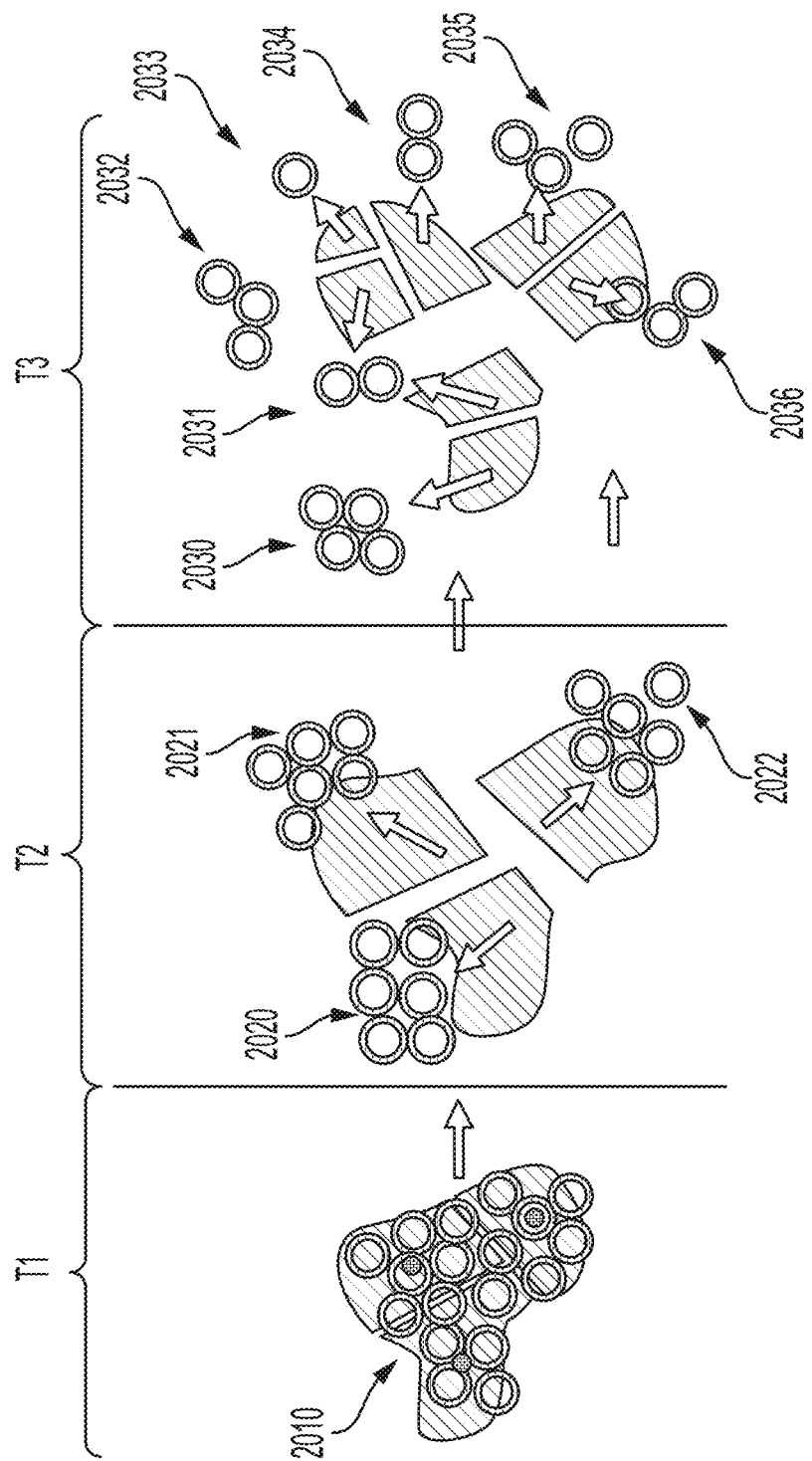
FIG. 20 is a diagram depicting example sets of micro-objects that are separated into smaller sets of micro-objects over a period of time, in accordance with some embodiments.

FIG. 20 is a diagram depicting example sets of micro-objects that are separated into smaller sets (e.g., sub-sets) of micro-objects over a period of time, in accordance with some embodiments. As discussed above, a set of micro-objects that are in contact with each other may be analyzed. One or more geometric properties (e.g., a geometric shape, centers of sets of micro-objects or individual micro-objects, etc.) may be determined. The set of micro objects may be divided into additional sets (e.g., smaller sets or subsets of micro-objects). The operations of analyzing, identifying or determining one or more geometric properties, and dividing may be iteratively repeated until all of the micro-objects are no longer in contact with each other (e.g., no micro-object from in the initial set of micro-objects is in contact with or touching any other micro-object). Sets of micro-objects may be referred to as blobs or micro-object blobs.

As illustrated in FIG. 20, two lines or trajectories (e.g., cut lines) may be used to divide the set of micro-objects 2010. At time T2, set of micro-objects 2010 may be divided into three sets of micro-objects 2020, 2021, and 2022 may be moved in the direction indicated by the three arrows by applying control patterns to three sets of electrodes around set of micro-objects 2010. At time T3, the set of micro-objects 2020 may be divided into sets of micro-objects 2030 and 2031. The set of micro-objects 2021 may be divided in to sets of micro-objects 2032 through 2034. The set of micro-objects 2022 may be divided into sets of micro-objects 2035 and 2036.

Figure 21:
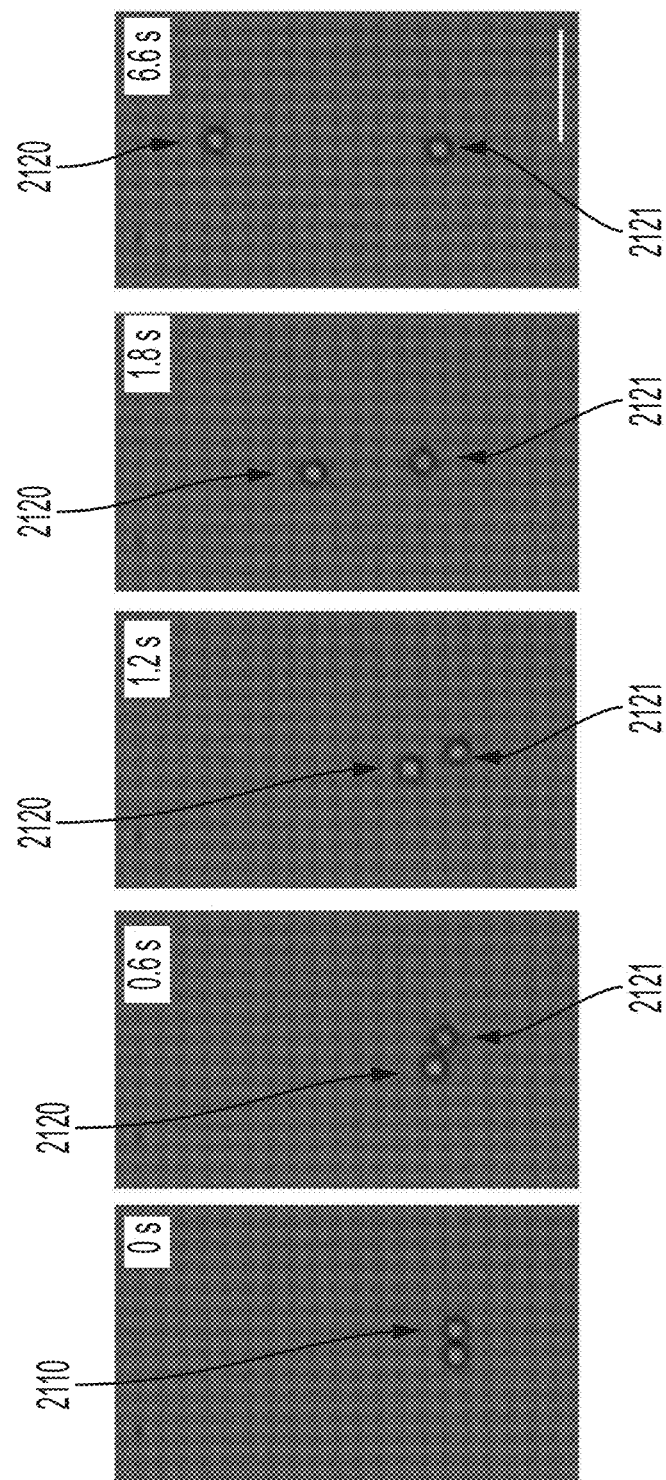
FIG. 21 is a diagram depicting a set of micro-objects in a lab experiment, in accordance with some embodiments.

FIG. 21 is a diagram depicting a set of micro-objects 2110, in accordance with some embodiments. The set of micro-objects 2110 may include two micro-objects that are in contact with or touching each other at a time of 0 seconds. At time 0.6 seconds, the set of micro-objects 2010 may be separated into two sets of one micro-object each, set 2120 and 2121. The set of micro-objects 2010 may be separated using the examples, embodiments, implementations, functions, operations, actions, etc., described herein. At time 1.2 seconds to time 6.0 seconds, the sets 2120 and 2121 may be moved farther apart from each other using various control patterns, as discussed above.

Figure 22:
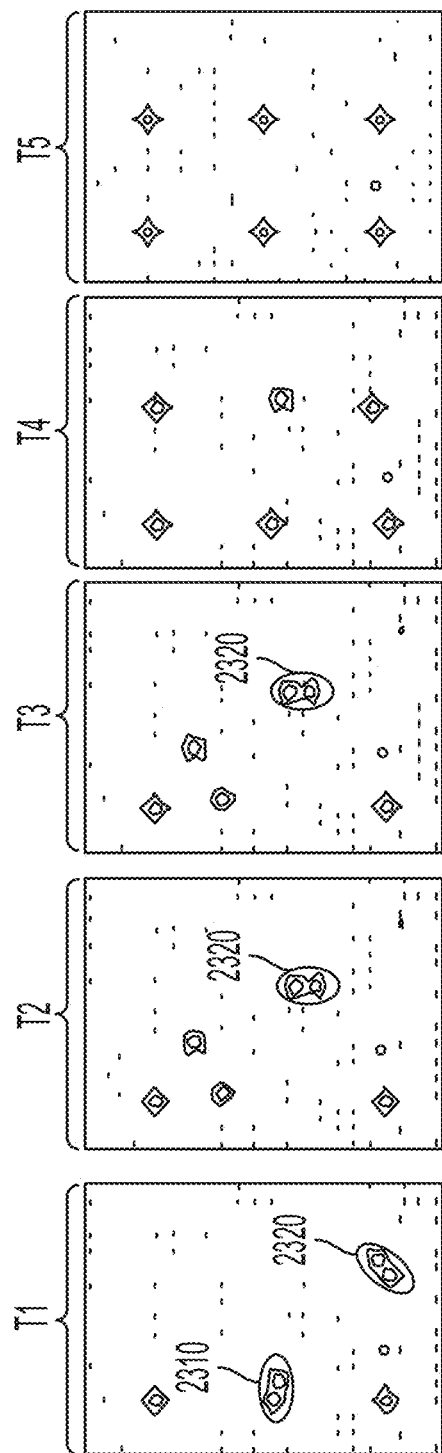
FIG. 22 is a diagram depicting blobs of micro-objects, in accordance with some embodiments.

FIG. 22 is a diagram depicting blobs of micro-objects 2310 and 2320 (e.g., sets of micro-objects), in accordance with some embodiments. At time T1, a computing device may detect the blob of micro-objects 2310. For example, the computing device may use image analysis/processing or may use electric/magnetic field sensors. The computing device may use an ellipse shape to encompass the blob of micro-objects 2310. At block T1, the blob of micro-objects 2310 may be divided two sets of one micro-object each. At time T3, the computing device may detect the blob of micro-objects 2320. The computing device may use an ellipse shape to encompass the blob of micro-objects 2320. At time T4, blob set of micro-objects 3230 may be divided two sets of one micro-object each. At time T5, the micro-objects may be moved to different positions/locations using various control patterns, as discussed above.

Figure 23:
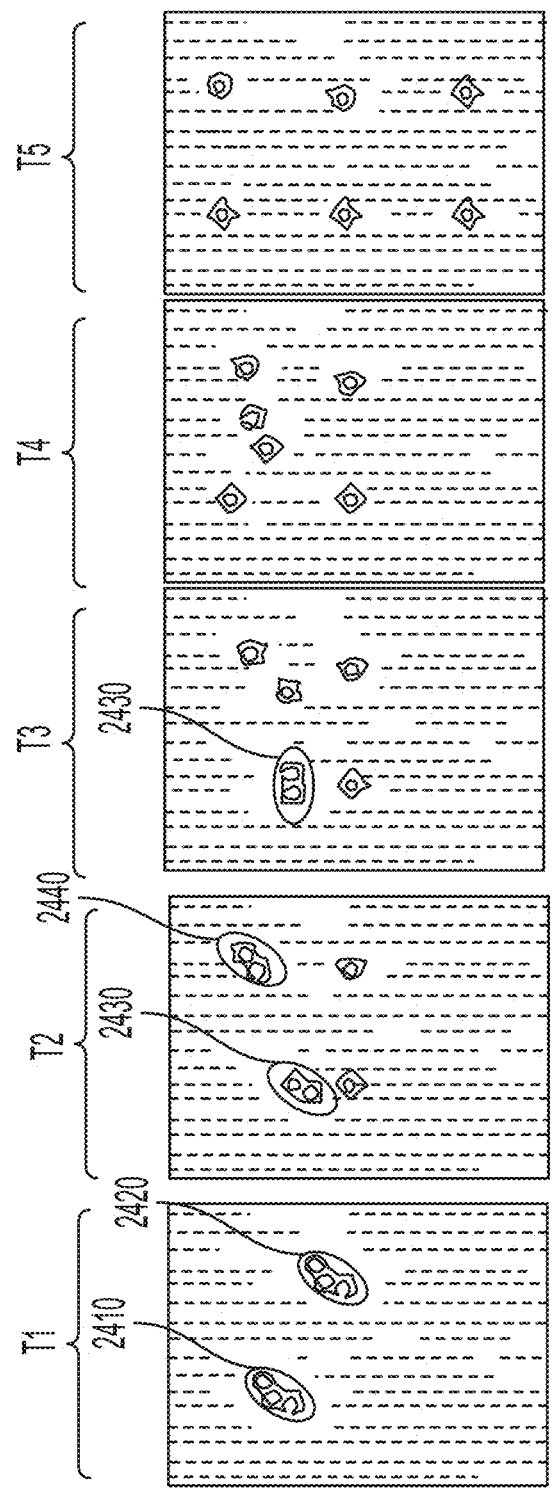
FIG. 23 is a diagram depicting a set of micro-objects, in accordance with some embodiments.

FIG. 23 is a diagram depicting a set of micro-objects 2110, in accordance with some embodiments. At time T1, a computing device may detect the blob of micro-objects 2410. For example, the computing device may use image analysis/processing or may use electric/magnetic field sensors. The computing device may use an ellipse shape to encompass the blob of micro-objects 2410. At time T2, the blob of micro-objects 2420 may be divided into a blob of micro-objects 2440 and a single micro-object. The blob of micro-objects 2410 may be divided into a block of micro-objects 2430 and a single micro-object. At time T3, the blob of micro-objects 2440 is divided into two sets of single micro-objects. At time T4, the blob of micro-objects 2430 is divided into two sets of single micro-objects.

Figure 24:
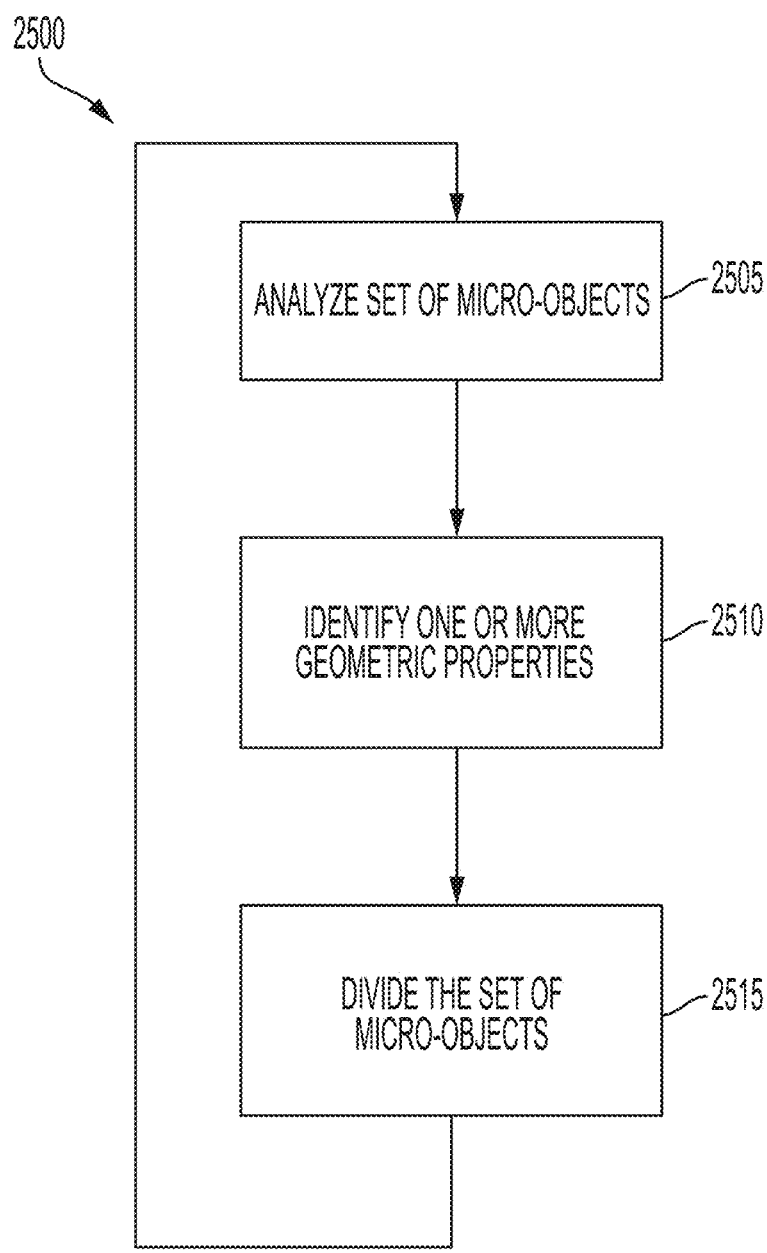
FIG. 24 is a flow diagram depicting a method for dividing a set of micro-objects, in accordance with some embodiments of the present disclosure.

FIG. 24 is a flow diagram depicting a method 2500 for dividing a set of micro-objects, in accordance with some embodiments of the present disclosure. Method 2500 may be performed by processing logic that may comprise hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 400 may be performed by a computing device (e.g., computing device 150 illustrated in FIG. 1) or a processing device (e.g., processing device 602 illustrated in FIG. 6).

Method 2500 begins at block 2505 where a set of micro-object is detected. For example, the set of micro-objects may be detected using a camera and image analysis. In another example, the set of micro-objects may be detected using electric or magnetic field sensors. The method 2500 may detect sets of micro-objects by determining that multiple (e.g., more than two) micro-objects that are in contact with each other (e.g., touching each other) or are within a threshold distance of each other. At block 2510, the method 2500 may identify one or more geometric properties of the set of micro-objects. For example, the method 2500 may identify a boundary or periphery of the set of micro-objects. In another example, the method 2500 may identify a shape (e.g., a geometric shape, an irregular shape, etc.) that may encompass the set of micro-objects or may define a boundary/periphery for the set of micro-objects. The method 2500 may also identify edges and points in the shape.

At block 2515, the method 2500 may divide the set of micro-objects based on the one or more geometric properties and one or more control patterns. For example, the method 2500 may identify one or more electrodes that are on the boundary/periphery or within a threshold distance of the boundary/periphery of the set of micro-objects. The method 2500 may also identify one or more sets of electrodes and may apply one or more control patterns to the sets of electrodes to divide the set of micro-objects. In one embodiment, the blocks 2505, 2510, and 2515 may be repeated multiple times. For example, the blocks 2505, 2510, and 2515 may be repeated until the sets of micro-objects have all be divided into separate micro-objects that are a threshold distance apart.

In one embodiment, the method 2500 may identify one or more sets of electrodes are located at one or more non-deterministic locations (e.g., random locations) around the set of micro-objects. In another embodiment, the method 2500 may identify a geometric shape for the set of micro-objects. The method 2500 may also identify one or more edges of the geometric shape or one or more corners (e.g., points, vertices, etc.) of the shape. The method 2500 may apply one or more control patterns to one or more sets of electrodes located at or around the edges/corners.

In one embodiment, the method 2500 may identify a center (e.g., a centroid, a center of mass, etc.) for the set of micro-objects. The method 2500 may identify a line (e.g., a trajectory) that may pass through the center. The method 2500 may identify one or more sets of electrodes based on the line. For example, the method 2500 may identify sets of electrodes that are on the line. In another example, the method 2500 may identify sets of electrodes that are along a second line that is parallel to the line. In a further example, the method 2500 may identify sets of electrodes that are along a second line that is parallel to the line.

In one embodiment, the method 2500 may identify a line that is identifying a line that is normal to a point in the boundary/periphery. The method 2500 may identify one or more sets of electrodes along the line. In another embodiment, the method 2500 may identify a plurality of electrodes that are evenly spaced along the boundary or non-deterministically distributed (e.g., randomly distributed) along the boundary.

In one embodiment, the method 2500 may identify sets of micro-objects that are located within the boundary/periphery of the set of micro-objects. For example, if an ellipse is used to encompass a set of micro-objects (e.g., a set of fifty micro-objects), the method 2500 may identify electrodes that are located at or around the foci of the ellipse.

In some embodiments, the blocks 2505, 2510, and 2515 may be iteratively repeated in a closed loop fashion. For example, after block 2515, the method 2500 may detect one or more sets of micro-objects (e.g., via image analysis) and may perform blocks 2510 and 2515 for each of the sets of micro-objects that are detected. As sets of micro-objects are divided into additional sets (e.g., smaller sets or sub-sets), the method 2500 may be repeated for each of the additional sets. The repeating of the method 2500 for each of the additional sets may be performed without analyzing the differences in the sets of micro-objects between iterations of the method 2500 (e.g., without feedback from a previous iteration of the method 2500 or in a closed loop fashion).

Figure 25:
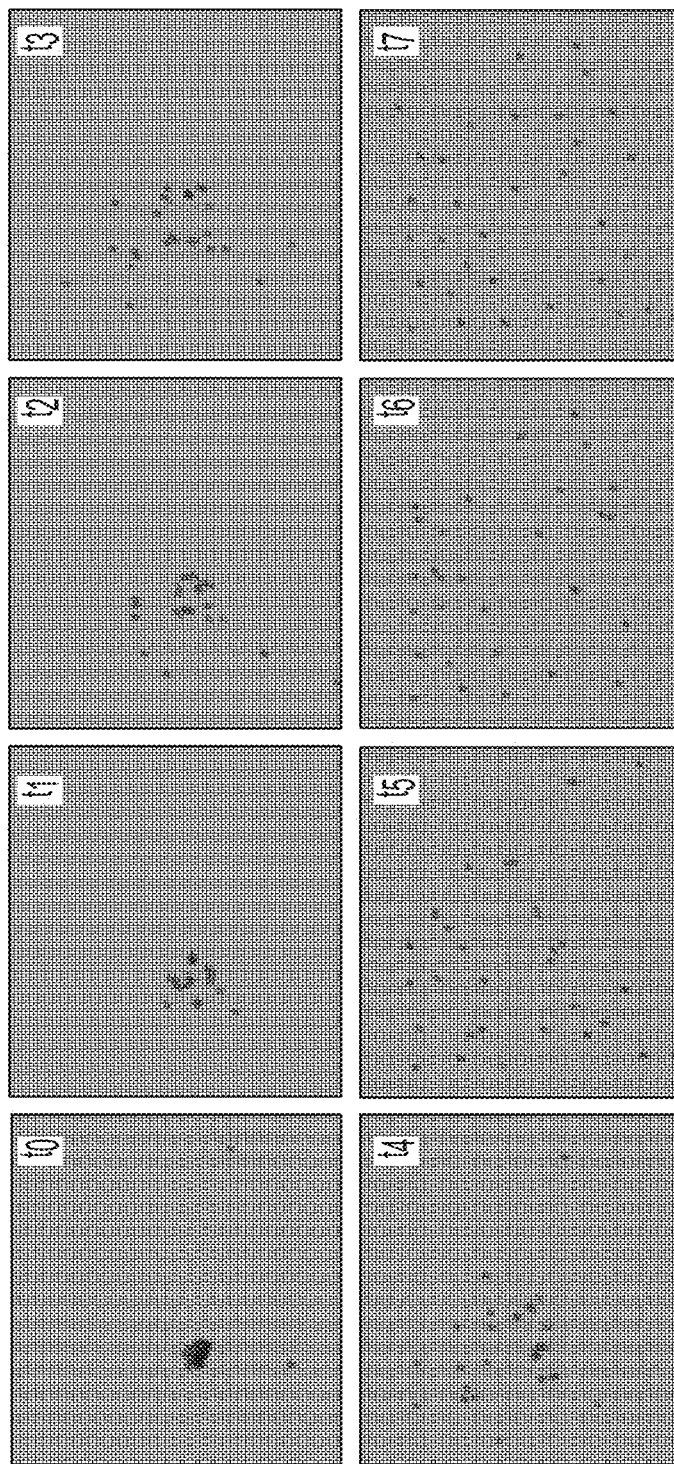
FIG. 25 is a diagram depicting a set of micro-objects in a lab experiment, in accordance with some embodiments.

FIG. 25 is a diagram depicting a set of micro-objects, in accordance with some embodiments. FIG. 25 illustrates how the set of micro-objects may be divided into sub-sets or sub-groups of micro-objects at different times T0, T1, T2, T3, T4, T5, T6, and T7.

Figure 26:
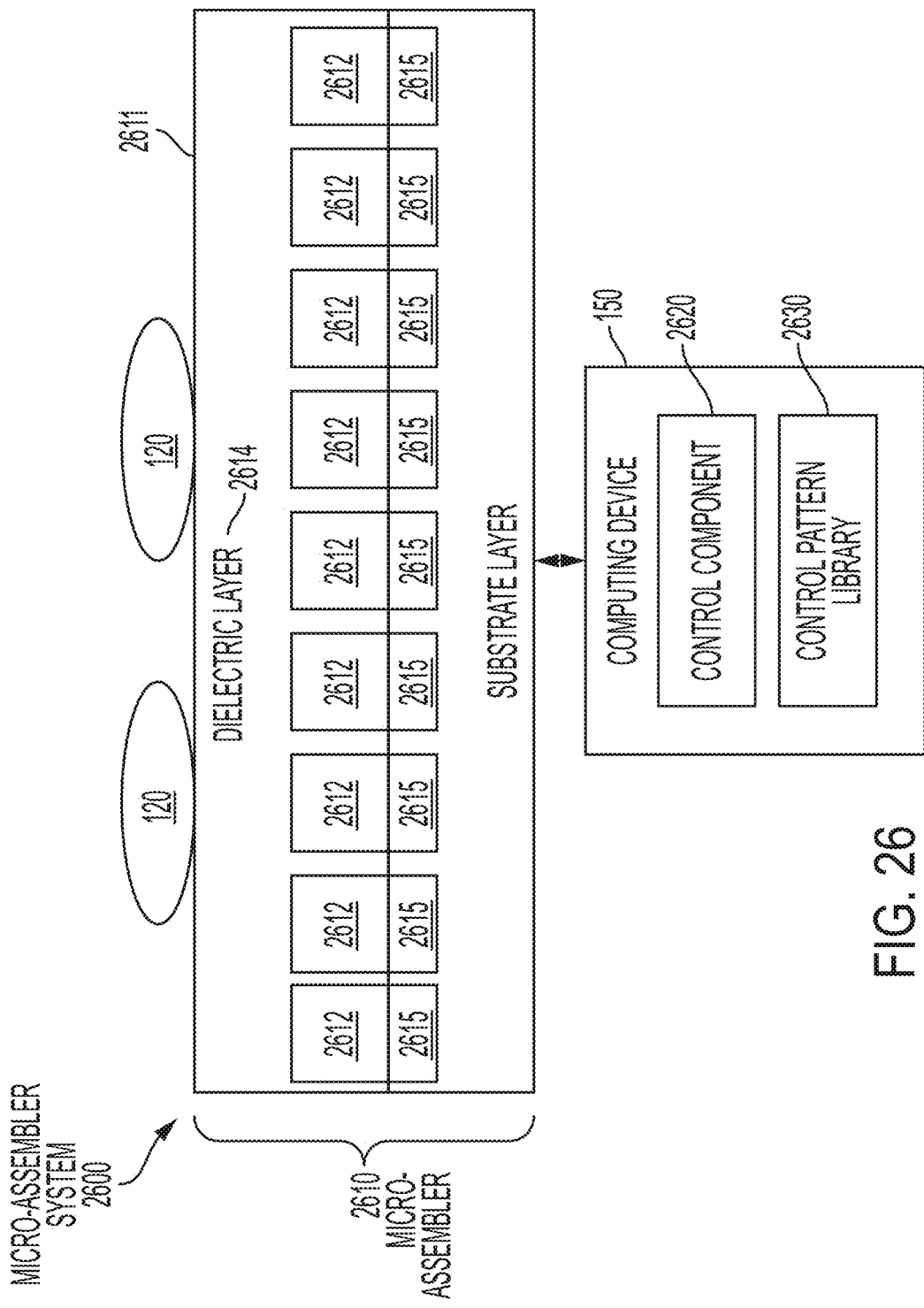
FIG. 26 is a schematic diagram of depicting an embodiment of a micro-assembler system for controlling placement of micro-objects, in accordance with some embodiments of the present disclosure.

FIG. 26 is a schematic diagram of an embodiment of a micro-assembler system 2600 for controlling placement of micro-objects 120, in accordance with some embodiments of the present disclosure. The micro-assembler system 2600 includes a micro-assembler 2610 and a computing device 150. The micro-assembler system may be used to move, hold in place, or control the placement (e.g., control one or more of the position or orientation) of the micro-objects 120, as discussed above.

The micro-assembler 2610 includes a substrate layer 2611, force generating pixels 2612 (e.g., electrodes), and a dielectric layer 2614. The substrate layer 2611 may be a layer of material where the force generating pixels 2612 may be placed. A plurality of switches 2615 may be located within the substrate. Each switch 2615 is coupled (e.g., electrically coupled) to an electrode 2612. The force generating pixels may be electrodes. The switches 2615 may be used to couple and/or decouple the electrodes from voltage sources. The micro-assembler 2610, the force generating pixels 2612, and the switches 2615 may perform functions or operate similar to the micro-assembler, force generating pixels, and switches described above in conjunction with FIGS. 1 and 13.

In one embodiment, the computing device 150 may be any suitable type of computing device or machine that includes one or more programmable processors. In some examples, a computing device may comprise a single machine or may include multiple interconnected machines. The computing device includes a controller 2620 and a control pattern library 2630. The control pattern library 2630 may be a collection, set, group, etc., of control patterns which may be used to manipulate the micro-objects 120. For example, the control pattern library 2630 may include tens, hundreds, thousands, etc., of control patterns.

As discussed above, a control pattern may indicate a force pattern for the micro-assembler 2610. In one embodiment, the force pattern may be a voltage pattern. Each control pattern may include a set of X-Y positions and an orientation angle that may indicate which electrodes 2612 should be coupled to the voltage source. In another embodiment, the control component 2620 may couple different sets of electrodes 2612 to a voltage source based on multiple control patterns simultaneously. For example two, four, ten, or some other appropriate number of control patterns, each having different size, shape, position and orientation may be used simultaneously.

In one embodiment, the control component 2620 may cycle through multiple control patterns sequentially. This process may create dynamic (e.g., varying or changing) electrophoretic (EP) and dielectrophoretic (DEP) forces. Control patterns that are part of a cycle may also be applied to different positions or may have different orientations. In some embodiments, the control component 2620 may cycle through the multiple control patterns without analyzing the positions, locations, orientations, etc., of the micro-objects 120, as discussed above. This may be referred to as open-loop operation. In other embodiments, the control component 2620 may analyze the locations of the micro-objects 120 and may identify different control patterns to be used based on the analysis (e.g., based on feedback). This may be referred to as closed-loop operation.

In one embodiment, the control patterns in the control pattern library 2630 may be control patterns that are generated based on previous testing. For example, the control patterns may be tested for use with certain types of micro-objects (e.g., metallic micro-objects, dielectric micro-objects, circular micro-objects, rectangular micro-objects, etc.). Based on the results of the testing a computing device may automatically generate the control patterns or the control patterns may be defined by a user. In another embodiment, the control patterns may be dynamically or automatically generated by a computing device. For example, the computing device may generate a control pattern that generates the fastest motion along the trajectory to the target, and then create a program, algorithm, function, etc. to replicate these pre-generated control patterns. The control component 2620 may use this algorithm to create the control pattern in real time by optimizing the control pattern to produce the fastest motion along the trajectory to the target, then creating a library (or look-up table) of these pre-generated control patterns. The control patterns that are in the control pattern library 2630 may also be used to create other control patterns. For example, a control pattern in the control pattern library may be used in another control pattern.

The control patterns may generate EP forces that pull micro-objects, EP forces that push micro-objects, or EP forces that pull and push micro-objects. The control patterns may also generate a combination of EP and DEP forces that pull micro-objects, a combination of EP and DEP forces that push micro-objects, and a combination of EP and DEP forces that pull and push micro-objects. The control pattern may also generate DEP forces that attract micro-objects to a local region and this local region may be moved along the trajectory to the target. The control patterns may include anchor control patterns that hold micro-objects in place by generating DEP forces that attract micro-objects to a local region or by generating a combination of EP and DEP forces that pull and push micro-objects into a local region.

In one embodiment, the control pattern library 2630 may include orientation control patterns that rotate micro-objects parallel to and with same directionality of a target vector by generating EP forces that pull micro-objects, EP forces that push micro-objects, EP forces that pull and push micro-objects, a combination of EP and DEP forces that pull micro-objects, a combination of EP and DEP forces that push micro-objects, and a combination of EP and DEP forces that pull and push micro-objects.

In one embodiment, the control pattern library 2630 may include unstick control patterns that agitate micro-objects and encourage movement by generating EP forces that pull micro-objects, EP forces that push micro-objects, EP forces that pull and push micro-objects, a combination of EP and DEP forces that pull micro-objects, a combination of EP and DEP forces that push micro-objects, and a combination of EP and DEP forces that pull and push micro-objects.

In one embodiment, the control pattern library 2630 may include pulldown control patterns that pull micro-objects back to the surface of the micro-assembler 2610 by generating EP forces that pull micro-objects, DEP forces that attract micro-objects to a local region, a combination of EP and DEP forces that pull micro-objects, and a combination of EP and DEP forces that pull and push micro-objects.

In one embodiment, the control pattern library 2630 may include pushup and flip control patterns that push micro-objects away from the surface of the micro-assembler 2610, and potentially flip micro-objects by generating EP forces that push micro-objects, EP forces that pull and push micro-objects, a combination of EP and DEP forces that push micro-objects, a combination of EP and DEP forces that pull and push micro-objects, EP forces between the 2D array surface and a counter electrode, and combination of EP and DEP forces between the 2D array surface and a counter electrode.

In one embodiment, the control pattern library 2630 may include control patterns that have different sizes relative to the array of electrodes (e.g., the 2-D array) of the micro-assembler 2610. The control pattern library 2630 may also include control patterns with different polarities (e.g., that use positive or negative voltages). The control pattern library 2630 may also include control patterns have different frequencies. For example, the frequencies of the voltages may range from 30 Hertz to 720 Hertz or 1440 Hertz, or 10000 Hertz.

Figure 27:
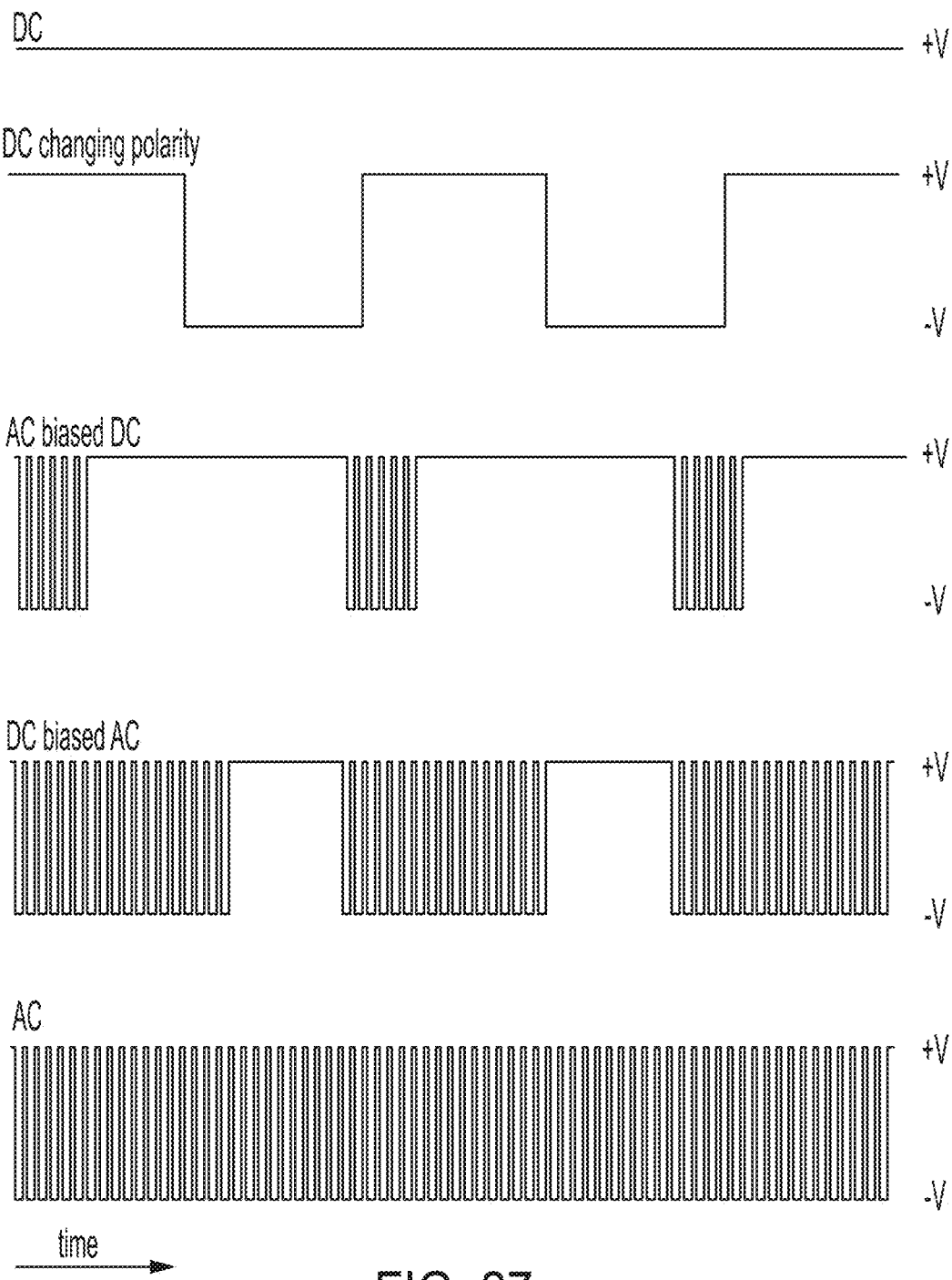
FIG. 27 is a diagram depicting example voltage waveforms, in accordance with some embodiments of the present disclosure.

FIG. 27 is a diagram depicting example voltage waveforms, in accordance with some embodiments of the present disclosure. As illustrated in FIG. 27, different types of voltage patterns and voltage waveforms may be applied to the electrodes of a micro-assembler (e.g., micro-assembler 110 illustrated above). For example, a direct voltage (DC) may be provided to one or more electrodes of the micro-assembler. The direct voltage may be a voltage with a single polarity (e.g., positive). In another example, a direct voltage may have a changing polarity. For example, the voltage may alternate or oscillate between positive and negative polarity. In a further example, an alternating voltage biased direct voltage may be provided to one or more electrodes of the micro-assembler. In another example, a direct voltage biased alternating voltage may be provided to one or more electrodes of the micro-assembler. In a further example, an alternating voltage may be provided to one or more electrodes of the micro-assembler.

In one embodiment, a control pattern may indicate the voltages, the polarity, the biasing of the voltages or current, etc. For example, a control pattern may indicate that an alternating voltage should be applied to specific electrodes of the micro-assembler for one or more periods of time (e.g., one or more durations, one or more time periods, etc.). In another example, a control pattern may indicate whether a DC or AC voltage should be applied. In a further example, a control pattern may indicate the refresh rate for the voltages that may be applied. In yet another example, a control pattern may indicate that certain electrodes should be grounded (e.g., coupled to ground).

Figure 28:
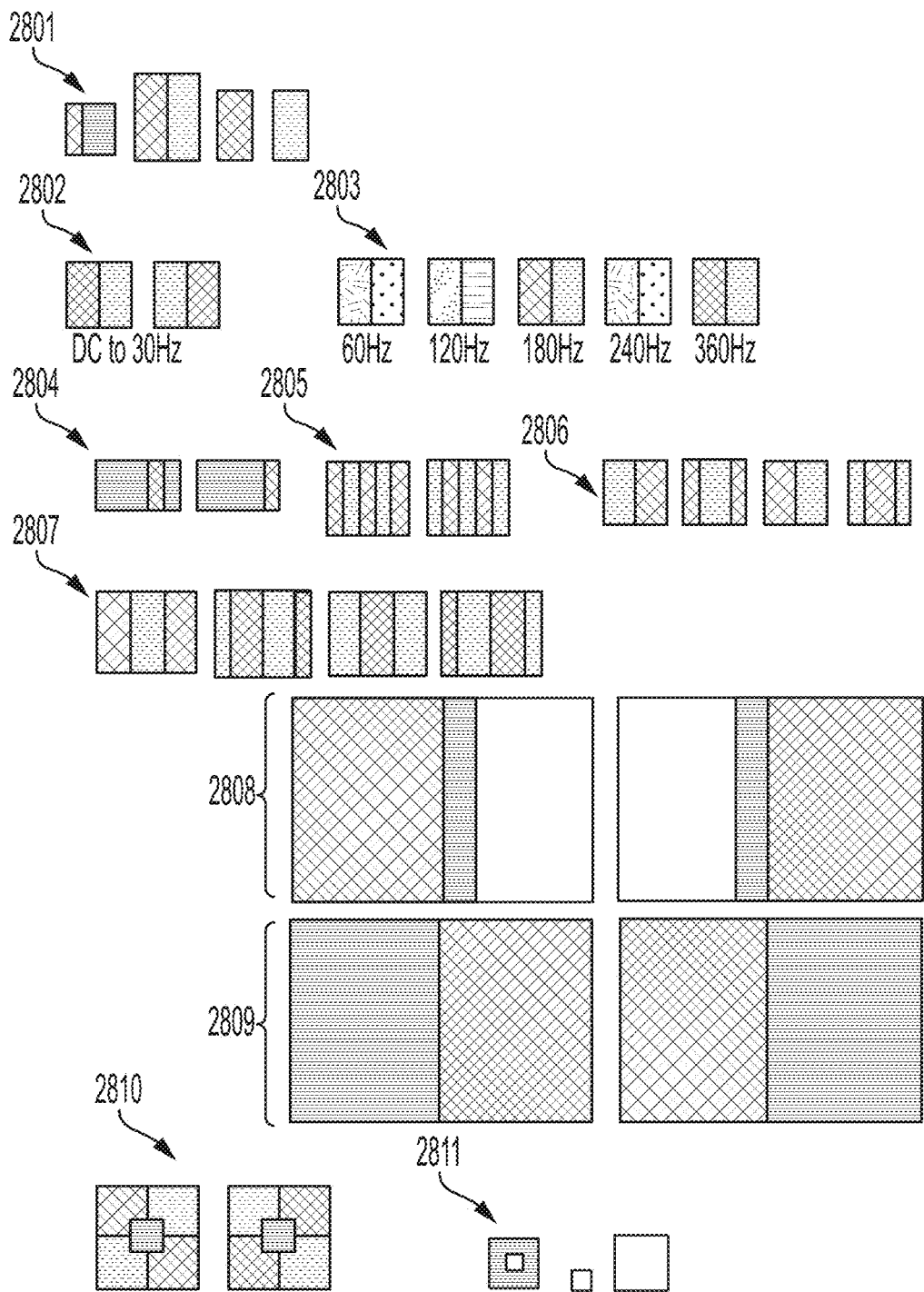
FIG. 28 is a diagram depicting example control patterns that may be applied to a portion of a micro-assembler, in accordance with some embodiments of the present disclosure.

FIG. 28 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The horizontal dotted hashed regions in the control patterns may indicate portions of the micro-assembler (e.g., one or more electrodes) where a negative voltage may be applied (e.g., where a negative electric field is generated). The horizontal solid hashed regions in the control patterns may indicate portions of the micro-assembler (e.g., one or more electrodes) where no voltage may be applied (e.g., where no electric field is generated). The white regions of the control patterns may indicate portions of the micro-assembler (e.g., one or more electrodes) where an AC voltage may be applied. The control patterns illustrated in FIG. 28 may be used to move (e.g., translate) one or more micro-objects.

Control pattern 2801 illustrates four separate DC voltage pattern that may push or pull micro-objects depending on the polarity (e.g., positive, negative, etc.) of the voltage and the charge of the micro-object (e.g., whether a micro-object is positively charged, negatively charged, not charged, a dipole is induced etc.). The first control pattern may apply a positive voltage on a left side of the first control pattern and apply no voltage on a right side of the control pattern. The second control pattern may apply a positive voltage on a left side of the second control pattern and may apply a negative voltage on the right side of the second control pattern. The third control pattern may apply a positive voltage. The fourth control pattern may apply a negative voltage. Control pattern 2802 illustrates symmetric (e.g., a control pattern with portions that have the same size) AC voltage patterns or a DC voltage patterns that may be applied to one or more electrodes at a rate (e.g., a refresh rate) of 30 Hertz (Hz). Control pattern 2803 illustrates symmetric AC voltage patterns that may be applied to one or more electrodes at different rates such as 60 Hz, 120 Hz, 180 Hz, 240 Hz, and 360 Hz.

Control pattern 2804 illustrates a DC voltage pattern that may change over time (e.g., may be applied to one or more electrodes at different times, for different periods of time, etc.). The control pattern 2804 illustrates a portion (e.g., a cross hashed bar) where the positive voltage moves towards the right over time. The control pattern 2805 illustrates a DC voltage pattern that may change over time. The control pattern 2805 illustrates portions (e.g., cross hashed bars) where the positive voltage moves towards the right (or left) over time and where the negative voltage (e.g., the horizontal dotted hashed bars) move towards the right (or left) over time. The control pattern 2806 illustrates a DC voltage pattern with different size portions that may change over time. The control pattern 2806 illustrates portions (e.g., cross hashed gars) where the positive voltage moves towards the right (or left) over time and where the negative voltage (e.g., the horizontal dotted hashed bars) move towards the right (or left) over time. The control pattern 2807 illustrates a DC voltage pattern with different size portions that may change over time. The control pattern 2807 illustrates portions (e.g., cross hashed gars) where the positive voltage moves towards the right (or left) over time and where the negative voltage (e.g., the horizontal dotted hashed bars) move towards the right (or left) over time.

Control pattern 2808 illustrates a DC voltage pattern that may agitate (e.g., move) one or more micro-objects by repelling micro-objects with the same polarity of the DC voltage pattern and attracting particles with the opposite polarity towards the horizontal solid hashed regions. Control pattern 2809 illustrates a DC voltage pattern that may agitate (e.g., move) one or more micro-objects by repelling micro-objects with the same polarity of the DC voltage pattern towards the horizontal solid hashed regions.

Control pattern 2810 illustrates an AC control pattern that may be applied at a rate of 10 Hz, 30 Hz, 60 Hz, 120 Hz, 240 Hz, 360 Hz, 720 Hz, 10000 Hz, etc. The control pattern 2810 may be a trap that may hold one or more micro-objects within the horizontal solid hashed region. Control pattern 2811 illustrates a DC control pattern that may hold or trap micro-objects within an AC trap (e.g., the white regions).

Figure 29:
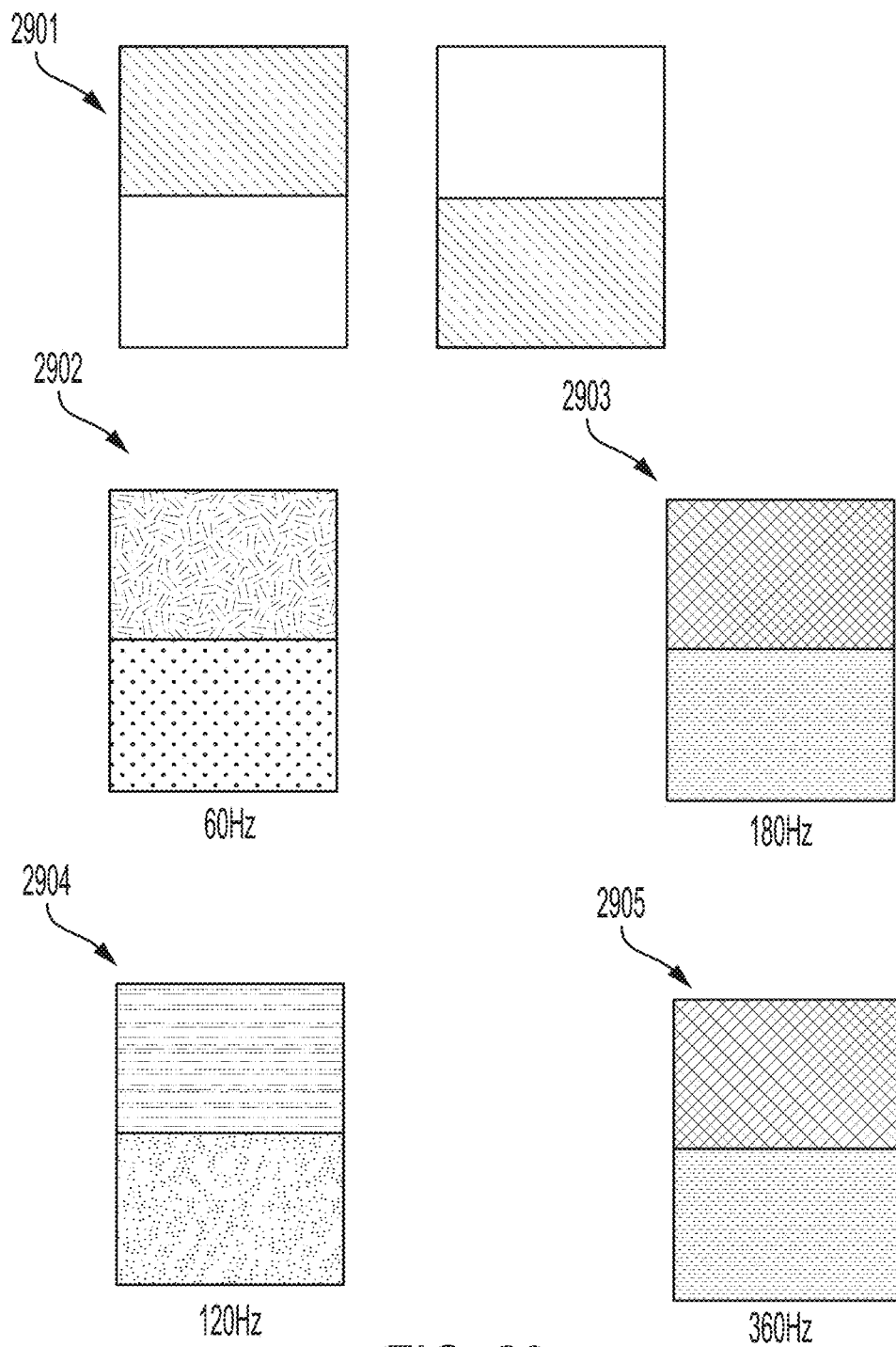
FIG. 29 is a diagram depicting example control patterns that may be applied to a portion of a micro-assembler, in accordance with some embodiments of the present disclosure.

FIG. 29 is a diagram depicting example control patterns that may be applied to a portion of a micro-assembler (e.g., micro-assembler 110 illustrated above), in accordance with some embodiments of the present disclosure. The diagonal dotted hashed regions in the control patterns may indicate portions of the micro-assembler (e.g., one or more electrodes) where a positive voltage may be applied (e.g., where a positive electric field is generated). The white or horizontal dotted hashed regions in the control patterns may indicate portions of the micro-assembler (e.g., one or more electrodes) where a negative voltage may be applied (e.g., where a negative electric field is generated). The control patterns illustrated in FIG. 29 may be used to move (e.g., translate) one or more micro-objects.

Control pattern 2901 illustrates a symmetric AC voltage pattern or a DC voltage pattern that may be applied to one or more electrodes at a rate (e.g., a refresh rate) of e.g. 30 Hz, 60 Hz. If the control pattern 2901 is a DC voltage pattern, either of the top or the bottom may be used continuously. If the control pattern 2901 is an AC voltage pattern, the control pattern 2901 may alternate between applying the left side and the right side to produce an AC voltage pattern. Control pattern 2902 illustrates an AC voltage pattern that may be applied at a rate of 60 Hz. Control pattern 2903 illustrates an AC voltage pattern that may be applied at a rate of 180 Hz. Control pattern 2904 illustrates an AC voltage pattern that may be applied at a rate of 120 Hz. Control pattern 2905 illustrates an AC voltage pattern that may be applied at a rate of 360 Hz. If the control pattern 2901 is an AC voltage pattern with a DC bias, one of the left side or right side may be applied more frequently than the other.

Figure 30:
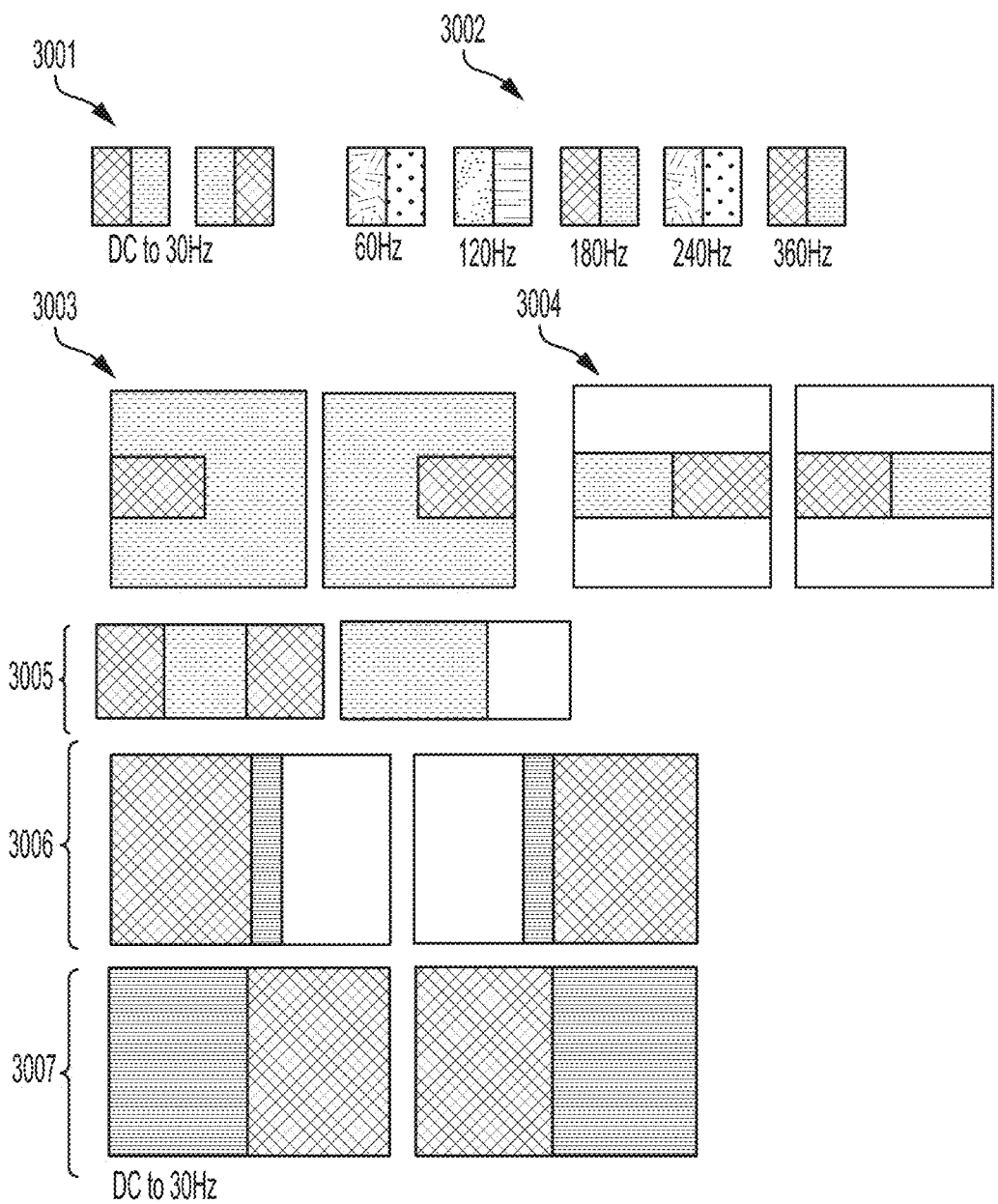
FIG. 30 is a diagram depicting example control patterns that may be applied to a portion of a micro-assembler, in accordance with some embodiments of the present disclosure.

FIG. 30 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The horizontal dotted hashed regions in the control patterns may indicate portions of the micro-assembler (e.g., one or more electrodes) where a negative voltage may be applied (e.g., where a negative electric field is generated). The horizontal solid hashed regions in the control patterns may indicate portions of the micro-assembler (e.g., one or more electrodes) where no voltage may be applied (e.g., where no electric field is generated). The control patterns illustrated in FIG. 30 may be used to rotate (e.g., move) one or more micro-objects.

Control pattern 3001 illustrates a symmetric AC voltage pattern or a DC voltage pattern that may be applied to one or more electrodes at a rate (e.g., a refresh rate) of e.g. 30 Hz, 60 Hz. Control pattern 3002 illustrates symmetric AC voltage patterns that may be applied to one or more electrodes at different rates such as 60 Hz, 120 Hz, 180 Hz, 240 Hz, and 360 Hz. A micro-object may align along an axis relative to the dividing line in the control patterns for the different rates (e.g., a dividing line between the positive and negative regions). For example, a center axis of the micro-object may align such that the center axis is parallel with the dividing line in the control patterns.

Control pattern 3003 illustrates a DC voltage pattern or a DC voltage pattern with an AC bias. The control pattern 3003 may align micro-objects relative to the dividing line (e.g., one or more dividing lines between the positive and negative regions). Control pattern 3004 illustrates a DC voltage pattern or a DC voltage pattern with an AC bias. The control pattern 3004 may align micro-objects relative to the dividing line (e.g., one or more dividing lines between the positive and negative regions). Control pattern 3005 illustrates a voltage pattern that may align micro-objects relative to the dividing lines (e.g., one or more dividing lines between the positive and negative regions). Control pattern 3006 illustrates a voltage pattern that may align micro-objects relative to the horizontal solid hashed region. Control pattern 3007 illustrates a voltage pattern that may align micro-objects relative to the dividing line (e.g., one or more dividing lines between the positive and horizontal solid hashed regions).

Figure 31:
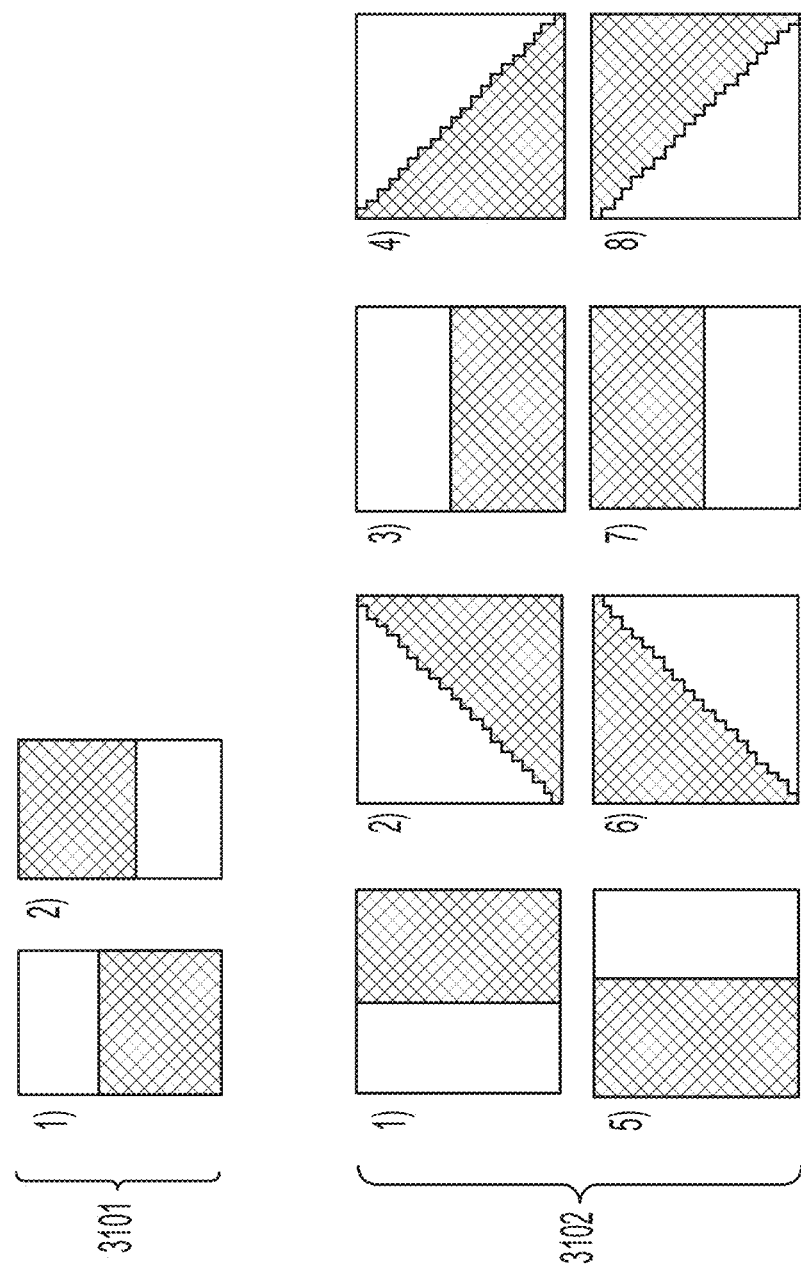
FIG. 31 is a diagram depicting example control patterns that may be applied to a portion of a micro-assembler, in accordance with some embodiments of the present disclosure.

FIG. 31 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The white regions in the control patterns may indicate portions of the micro-assembler (e.g., one or more electrodes) where a negative voltage may be applied (e.g., where a positive electric field is generated). The control patterns illustrated in FIG. 31 may be used to rotate (e.g., move) one or more micro-objects.

Control pattern 3101 illustrates an asymmetric (e.g., control pattern with different size portions) AC trap with a constant DC portion (e.g., a bar) of positive or of negative polarity. The constant DC portion may have the same polarity as the micro-object. The size of the constant DC portion may be the same as the length of the micro-object being rotated. The control pattern 3101 may be applied at a constant angle offset relative to the angle of the micro-object. The constant DC portion lifts the particle, while the AC trap rotates the micro-object into the desired orientation.

Control pattern 3102 illustrate a rotating AC trap with a constant DC portion (e.g., control patterns 3006, 3101 illustrated above). The control pattern 3102 may include eight individual control patterns (or sprites) 1-8. The control pattern 3102 may rotate through the sprites 1-8 in order. The control pattern 3102 may have a constant DC portion (e.g., a bar) that has the same polarity as the micro-object being rotated. The constant DC portion creates a constant DC force in the center of the sprites 1-8 which lifts the micro-object, while the rotating portion of the sprites 1-8 sweeps the micro-object around until the desired orientation.

Figure 32:
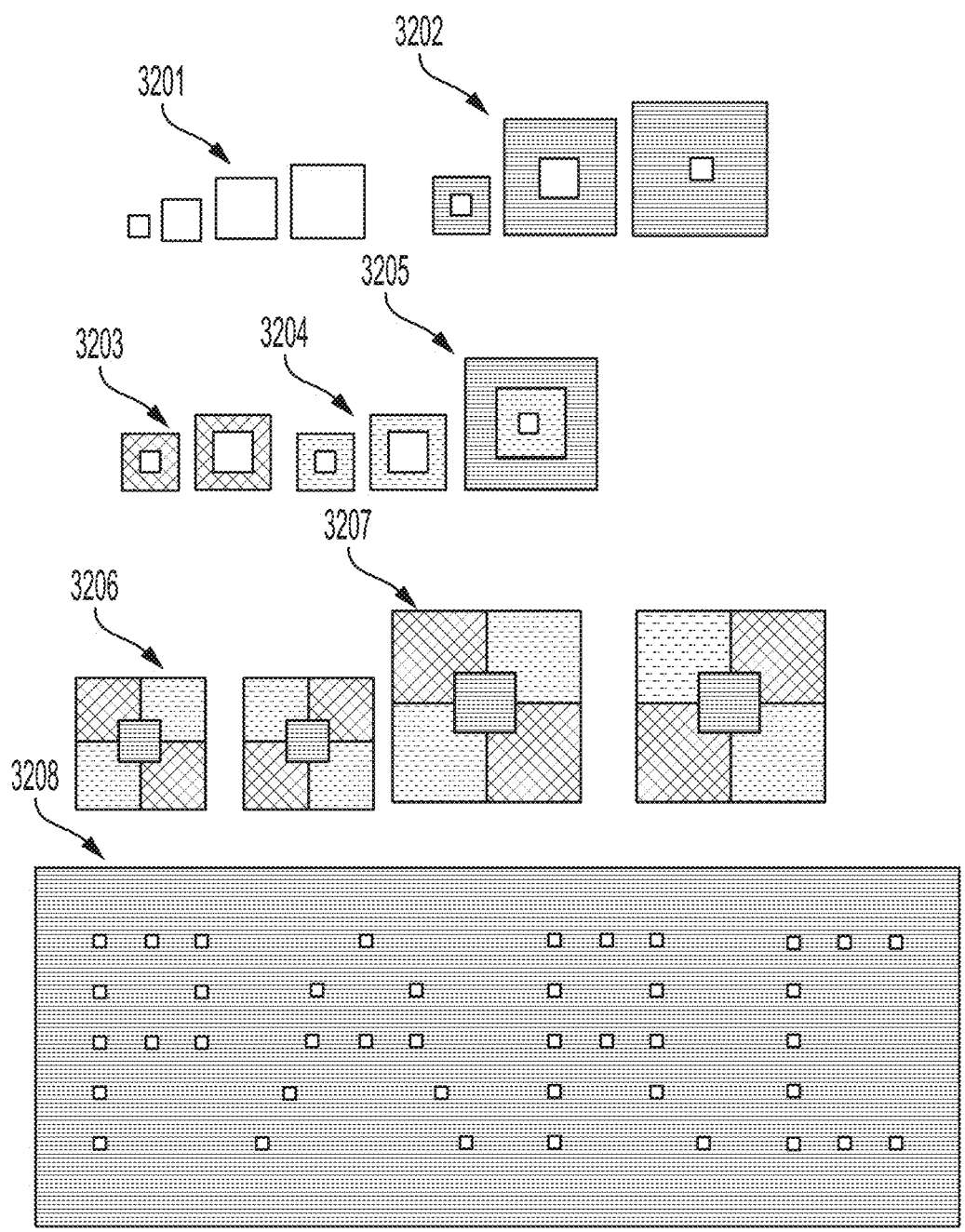
FIG. 32 is a diagram depicting example control patterns that may be applied to a portion of a micro-assembler, in accordance with some embodiments of the present disclosure.

FIG. 32 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The horizontal dotted hashsed regions in the control patterns may indicate portions of the micro-assembler (e.g., one or more electrodes) where a negative voltage may be applied (e.g., where a positive electric field is generated). The horizontal solid hashed regions in the control patterns may indicate portions of the micro-assembler (e.g., one or more electrodes) where no voltage may be applied (e.g., where no electric field is generated). The white regions may be AC traps. The control patterns illustrated in FIG. 32 may be used to hold (e.g., trap, anchor, etc.) one or more micro-objects in an area or region of the micro-assembler.

Control pattern 3201 illustrates an AC voltage pattern that may attract particles to an area or region (e.g., to one or more electrodes) using DEP forces. Control pattern 3202 illustrates an AC voltage pattern that may attract particles to an area or region (e.g., to one or more electrodes) using DEP forces. Control pattern 3203 illustrates an AC voltage pattern with a DC bias that pushes micro-objects into an AC trap. Control pattern 3204 illustrates an AC voltage pattern with a DC bias that pushes micro-objects into an AC trap. Control pattern 3205 illustrates an AC voltage pattern with a DC bias that pushes micro-objects into an AC trap. Control pattern 3206 illustrates a DC voltage pattern (e.g., a quadrupole pattern) with a rate (e.g., a refresh rate) of e.g., 30 Hz, 60 Hz. The control pattern 3206 may trap a micro-object in the horizontal solid hashed regions. Control pattern 3207 illustrates a DC voltage pattern (e.g., a quadrupole pattern of a different size) with a rate (e.g., a refresh rate) of e.g., 30 Hz, 60 Hz. The control pattern 3207 may trap a micro-object in the horizontal solid hashed regions. Control pattern 3208 illustrates a DC voltage pattern with multiple of AC traps to assemble and trap micro-objects in a pattern that spells the word "PARC."

Figure 33:
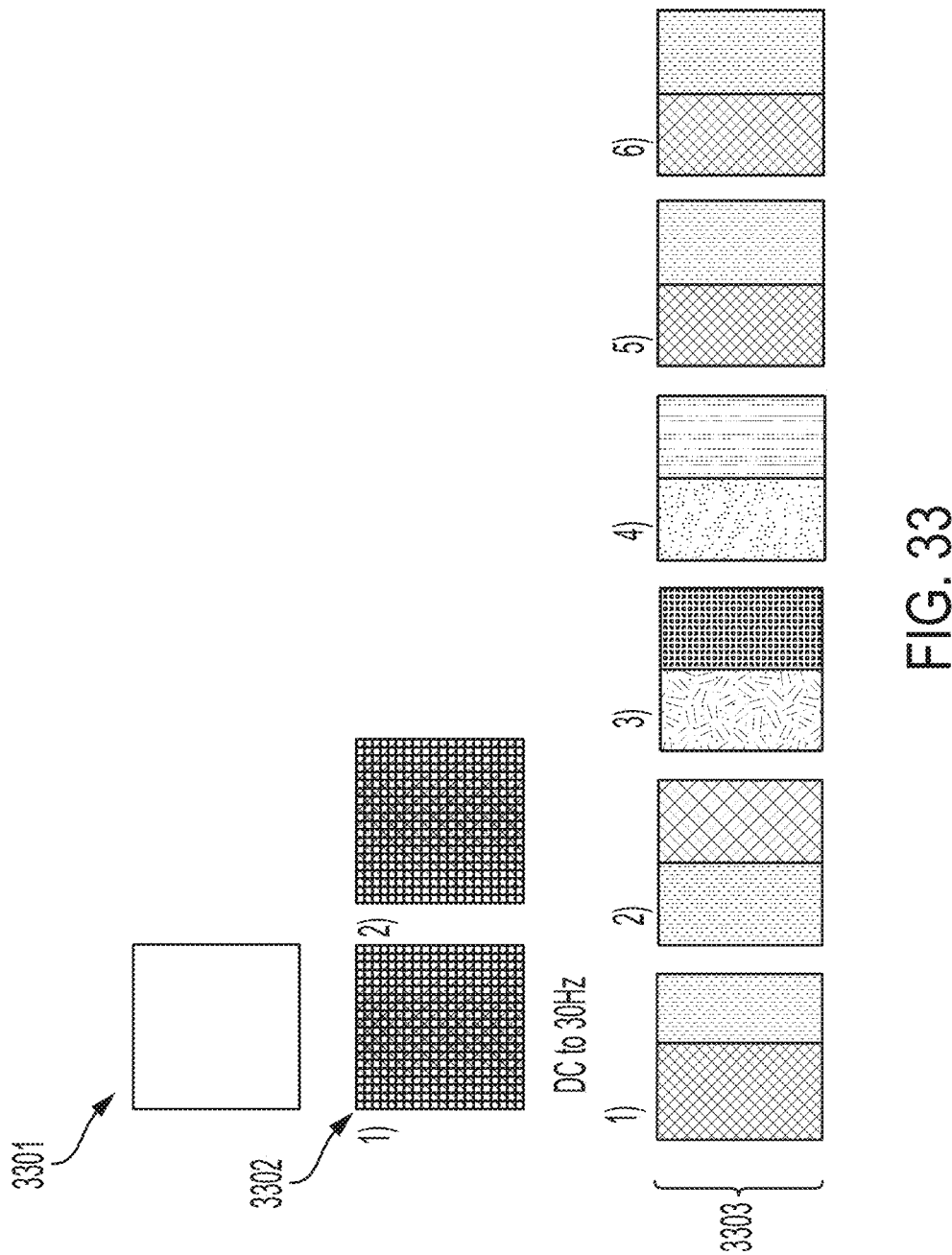
FIG. 33 is a diagram depicting example control patterns that may be applied to a portion of a micro-assembler, in accordance with some embodiments of the present disclosure.

FIG. 33 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The vertial dotted hashsed regions in the control patterns may indicate portions of the micro-assembler (e.g., one or more electrodes) where a negative voltage may be applied (e.g., where a negative electric field is generated). The white regions in the control patterns may indicate portions of the micro-assembler (e.g., one or more electrodes) where no voltage may be applied (e.g., where no electric field is generated). The control patterns illustrated in FIG. 33 may be used to hold (e.g., trap, anchor, etc.) one or more micro-objects in an area or region of the micro-assembler.

Control pattern 3301 may indicate a region where no voltage is applied to hold a micro-object in a position. Control pattern 3302 may be a DC voltage pattern or an AC voltage pattern that forms a checkboard pattern. The control pattern 3302 includes two control patterns 1 and 2. The control pattern 3302 may alternate between the sprites 1 and 2 and may be applied at a rate (e.g., a refresh rate) of e.g., 30 Hz, 60 Hz.

The control pattern 3303 may be an annealing control pattern that increases the rate at which the control pattern is applied. The control pattern 3303 includes sprites (e.g., control patterns, voltage patterns) 1-6. Sprite 1 may be an offset AC voltage pattern that is applied at a rate starting at 1 Hz and increasing to 30 Hz to agitate a micro-object. The size of the constant DC portion (e.g., a bar) in the middle may be the size of the micro-object being anchored. Sprites 2-6 may be applied at a rate of 30 Hz, 60 Hz, 120 Hz, 180 Hz, 240 Hz, and 360 Hz respectively, at regular intervals. This may settle the micro-object to its final position.

Figure 34:
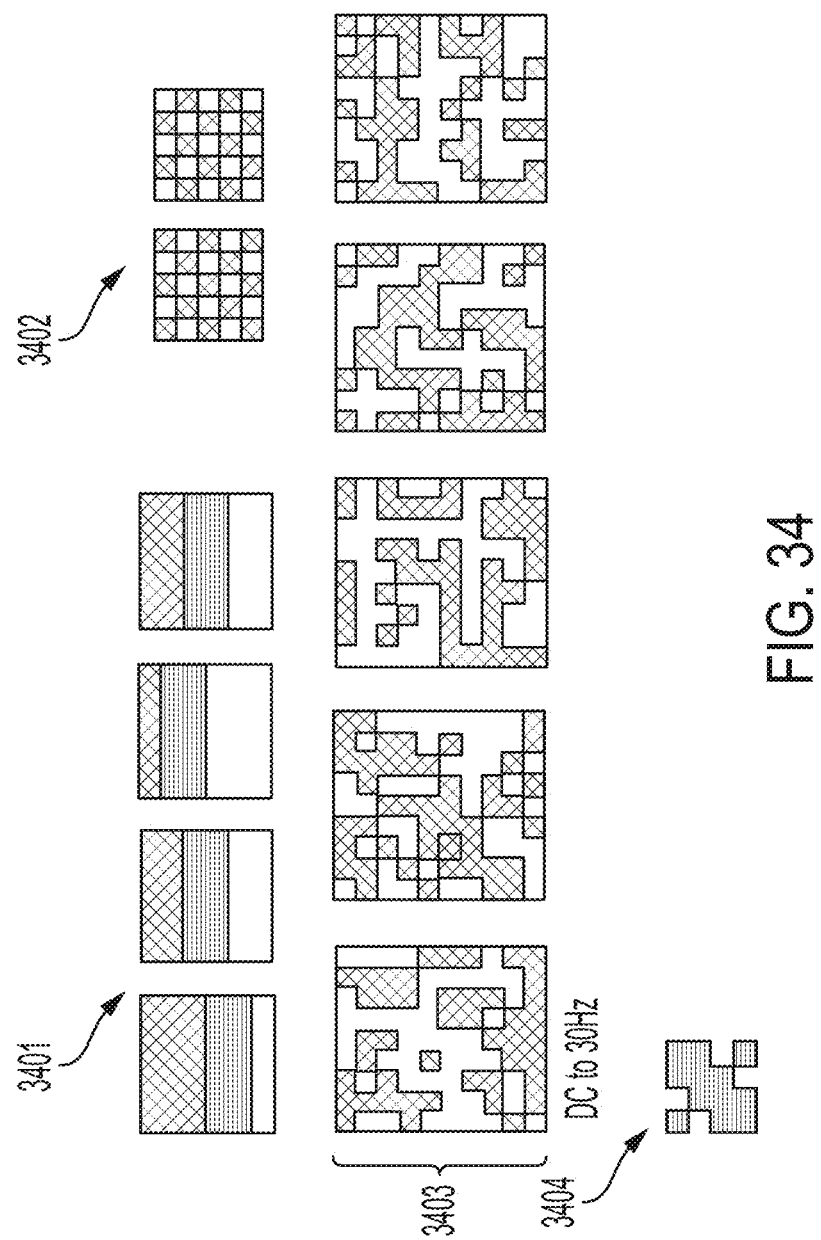
FIG. 34 is a diagram depicting example control patterns that may be applied to a portion of a micro-assembler, in accordance with some embodiments of the present disclosure.

FIG. 34 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The white regions in the control patterns may indicate portions of the micro-assembler (e.g., one or more electrodes) where a negative voltage may be applied (e.g., where a negative electric field is generated). The vertial solid hashed regions in the control patterns may indicate portions of the micro-assembler (e.g., one or more electrodes) where no voltage may be applied (e.g., where no electric field is generated). The white regions may be AC traps. The control patterns illustrated in FIG. 34 may be used to move (e.g., unstick) a micro-object that may be stuck at a location on the surface of the micro-assembler.

Control pattern 3401 may be a DC voltage pattern that may move micro-objects perpendicular to a target trajectory. Control pattern may 3401 may include a sequence of four sprites (e.g., control patterns, voltage patterns) that proceed from left to right to dislodge or unstick micro-objects which are stuck in a location. Control pattern 3402 may be a DC voltage pattern that forms a checkerboard pattern. The control pattern 3402 includes two sprites and the control pattern 3402 may alternate between the two sprites. Control pattern 3403 may be a DC voltage pattern that includes five sprites. Each of the five sprites may have randomized positive and negative regions to dislodge micro-objects. Control pattern 3404 may be an AC voltage pattern with a 45 degree orientation relative to a target trajectory to dislodge a micro-object.

Figure 35:
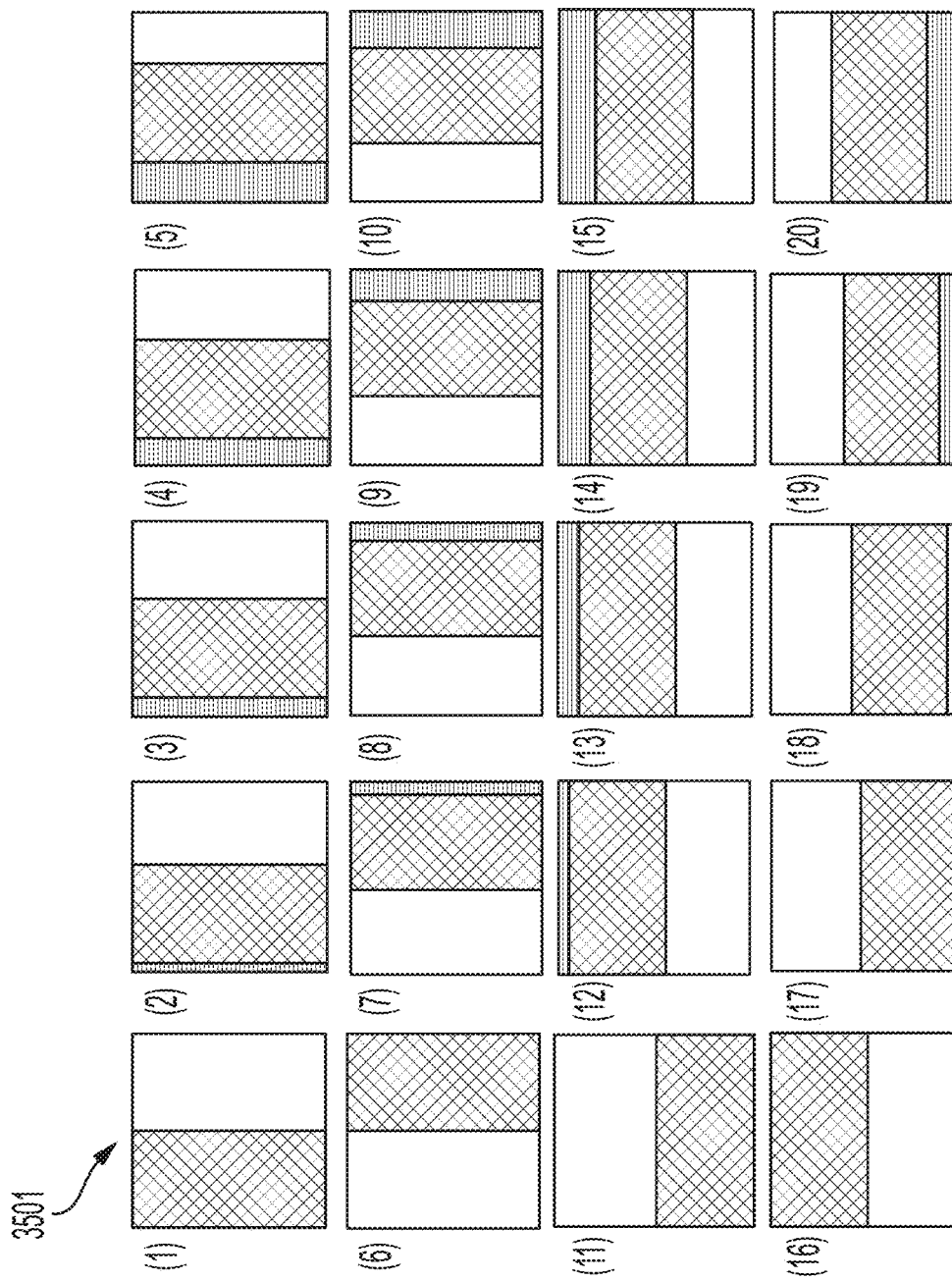
FIG. 35 is a diagram depicting example control patterns that may be applied to a portion of a micro-assembler, in accordance with some embodiments of the present disclosure.

FIG. 35 is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The white regions in the control patterns may indicate portions of the micro-assembler (e.g., one or more electrodes) where a negative voltage may be applied (e.g., where a negative electric field is generated). The horizontal solid hashsed regions in the control patterns may indicate portions of the micro-assembler (e.g., one or more electrodes) where no voltage may be applied (e.g., where no electric field is generated). The control patterns illustrated in FIG. 35 may be used to move (e.g., unstick) a micro-object that may be stuck at a location on the surface of the micro-assembler.

Control pattern 3501 may include 20 sprites (e.g., control patterns) that may be used to dislodge (e.g., unstick) a micro-object that is stuck to a region or location on the surface of the micro-assembler. The control pattern 3501 may cycle through the sprites 1-20 in numerical order.

Figure 36A:
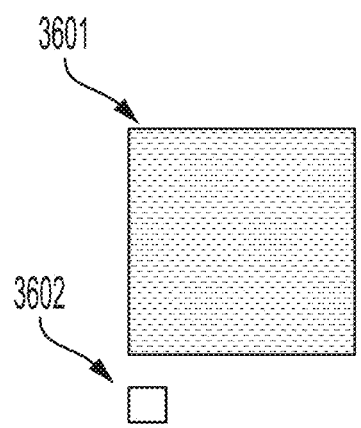
FIG. 36A is a diagram depicting example control patterns that may be applied to a portion of a micro-assembler, in accordance with some embodiments of the present disclosure.

FIG. 36A is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The horizontal dotted hashsed regions in the control patterns may indicate portions of the micro-assembler (e.g., one or more electrodes) where a negative voltage may be applied (e.g., where a negative electric field is generated). The white regions may be AC traps. The control patterns illustrated in FIG. 36A may be used to move a micro-object that may be stuck at a location on the surface of the micro-assembler.

Control pattern 3601 may be a control pattern where a negative voltage is applied. This may pull a micro-object with a positive charge down to the surface of the micro-assembler. For example, micro-object may be suspended in a fluid above the surface of the micro-assembler. The control pattern 3601 may pull the micro-object downward through the fluid to the surface of the micro-assembler. The control pattern 3602 may also be used to push a micro-object upwards from the surface of the micro-assembler. For example, if the micro-object has a negative charge, this may repel the micro-object from the surface of the micro-assembler. Control pattern 3602 may be an AC trap that traps a micro-object down to the surface of the micro-assembler.

Figure 36B:
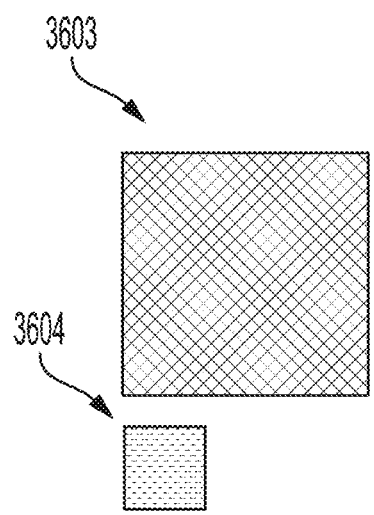
FIG. 36B is a diagram depicting example control patterns that may be applied to a portion of a micro-assembler, in accordance with some embodiments of the present disclosure.

FIG. 36B is a diagram depicting example control patterns that may be applied to a portion of a micro-assembler (e.g., micro-assembler 110 illustrated above), in accordance with some embodiments of the present disclosure. The cross hashed regions in the control patterns may indicate portions of the micro-assembler (e.g., one or more electrodes) where a positive voltage may be applied (e.g., where a positive electric field is generated). The horizontal dotted hashsed regions in the control patterns may indicate portions of the micro-assembler (e.g., one or more electrodes) where a negative voltage may be applied (e.g., where a negative electric field is generated).

Control pattern 3603 may be a control pattern where a positive voltage is applied. This may push a micro-object with a positive charge away from the surface of the micro-assembler. Control pattern 3604 may be a control pattern where a negative voltage is applied. This may push a micro-object with a negative charge away from the surface of the micro-assembler.

Figure 37:
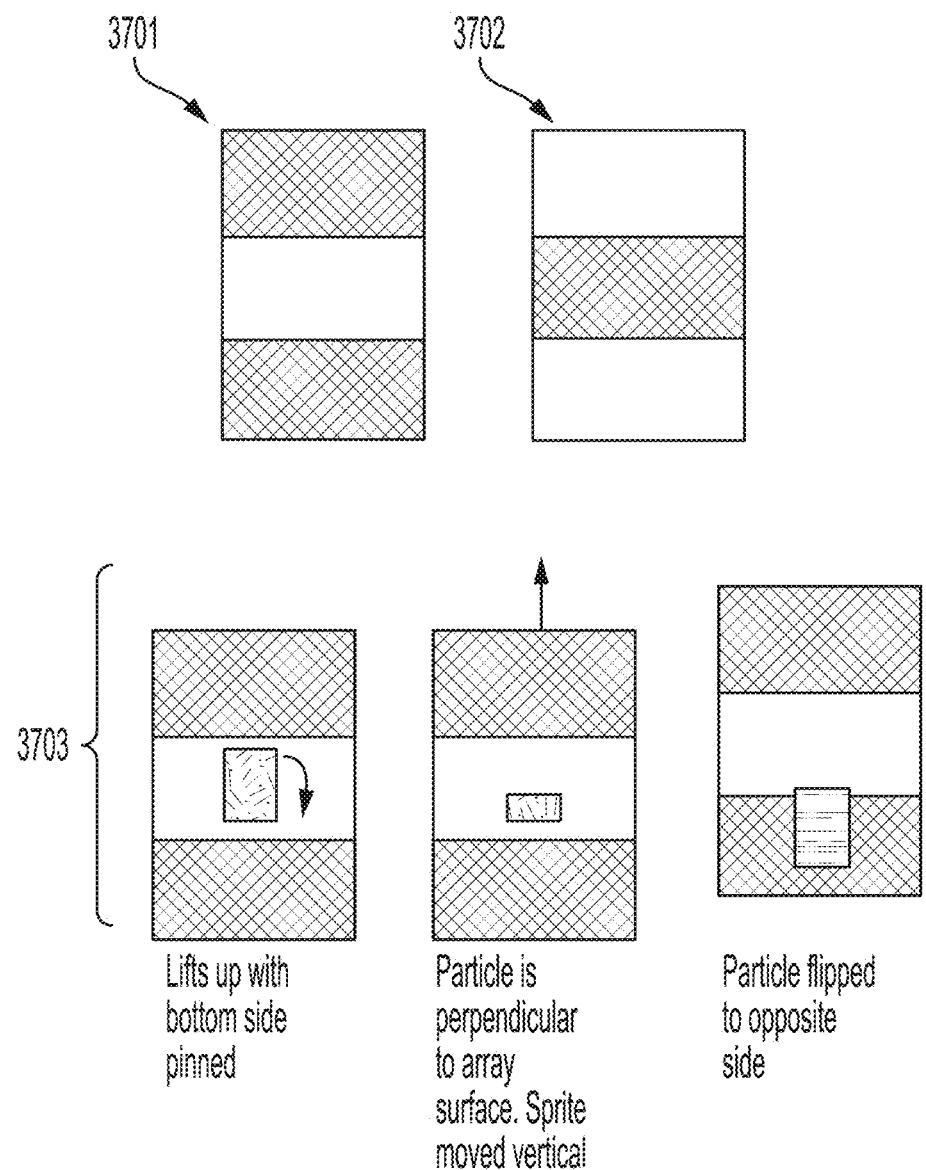
FIG. 37 is a diagram depicting example control patterns that may be applied to a portion of a micro-assembler, in accordance with some embodiments of the present disclosure.

FIG. 37 is a diagram depicting example control patterns that may be applied to a portion of a micro-assembler (e.g., micro-assembler 110 illustrated above) to flip a micro-object on the micro-assembler surface, in accordance with some embodiments of the present disclosure. The cross hashed regions in the control patterns may indicate portions of the micro-assembler (e.g., one or more electrodes) where a positive voltage may be applied (e.g., where a positive electric field is generated). The white regions in the control patterns may indicate portions of the micro-assembler (e.g., one or more electrodes) where a negative voltage may be applied (e.g., where a negative electric field is generated).

Control pattern 3701 illustrates a control pattern that may be used to change the orientation of a micro-object. For example, the control pattern 3701 may be used to flip a micro-object that is lying on the surface of the micro-assembler on a first face/side, onto an opposite face/side. Control pattern 3702 illustrates a different variation of a control pattern that may be used to change the orientation of a micro-object with opposite polarity.

Control pattern 3703 illustrates how the orientation of a micro-object may be changed (e.g., how a micro-object may be flipped onto an opposite face/side). The control pattern 3703 is positioned centered under the micro-object with the long axis of the control pattern 3703 aligned with the long access of the micro-object. The control pattern 3703 remains in place or in effect for a period of time which may polarize the micro-object. This may cause the micro-object to tilt up, perpendicular to the surface of the micro-assembler. The control pattern (e.g., a sprite) is then moved vertically (e.g., in the opposite direction of the edge which stayed on the surface of the micro-assembler). This causes the micro-object to flip onto the opposing face/side.

Figure 38:
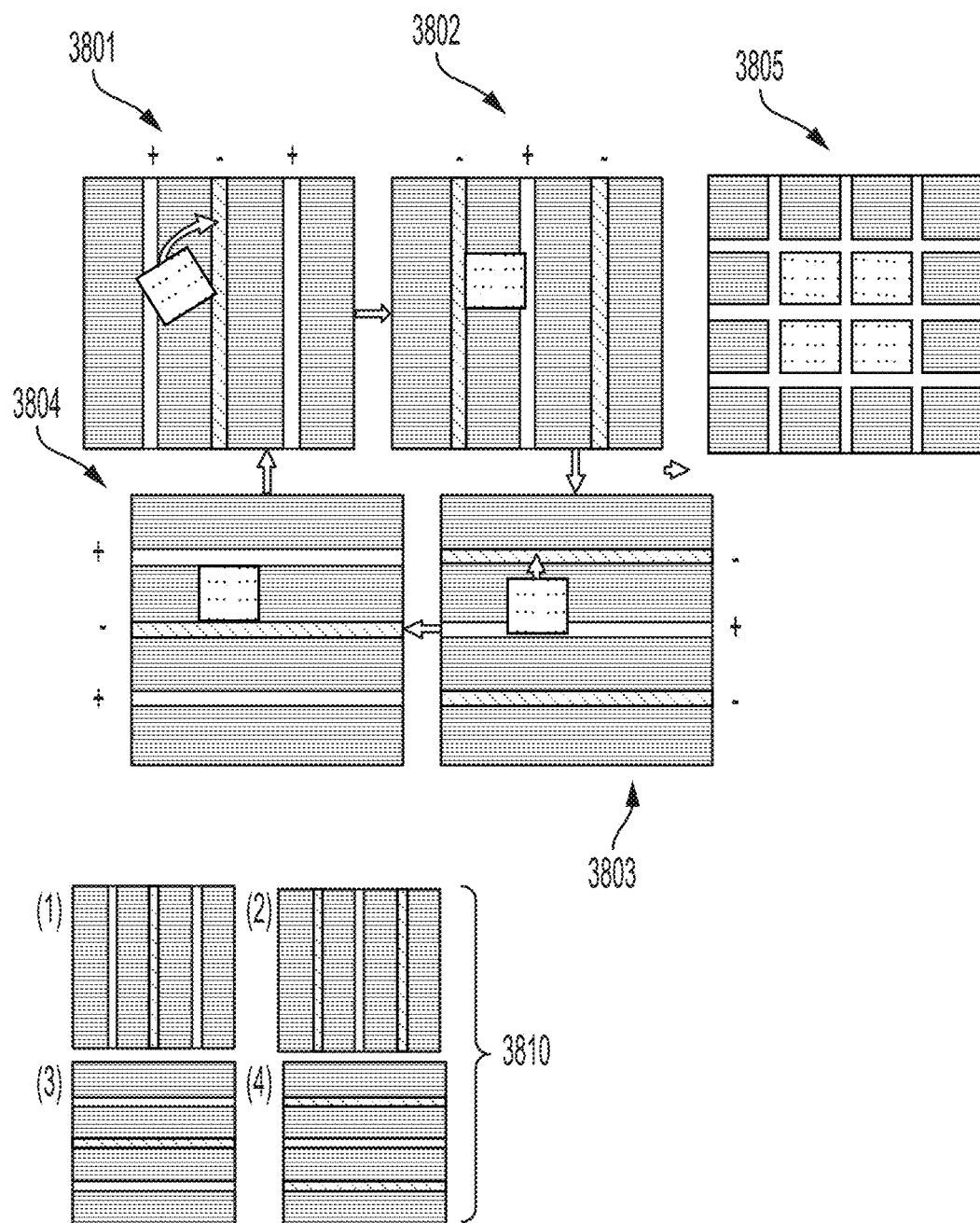
FIG. 38 is a diagram depicting example control patterns that may be applied to a portion of a micro-assembler, in accordance with some embodiments of the present disclosure.

FIG. 38 is a diagram depicting example control patterns that may be applied to a portion of a micro-assembler (e.g., micro-assembler 110 illustrated above), in accordance with some embodiments of the present disclosure. The white regions in the control patterns may indicate portions of the micro-assembler (e.g., one or more electrodes) where a positive voltage may be applied (e.g., where a positive electric field is generated). The diagonal dotted hashed regions in the control patterns may indicate portions of the micro-assembler (e.g., one or more electrodes) where a negative voltage may be applied (e.g., where a negative electric field is generated). The horizontal solid hashed regions in the control patterns may indicate portions of the micro-assembler (e.g., one or more electrodes) where no voltage may be applied (e.g., where no voltage is generated). The white regions may be AC traps.

The control patterns 3801 through 3804 may be used to rotate and position a micro-object at a location of the micro-assembler. For example, a computing device may cycle through the control pattern 3801 through 3804 in numerical order. This may be used to create the arrangement 3805 of micro-objects (e.g., a 2×2 arrangement of micro-objects), where the micro-objects have a pre-defined spacing of e.g. one, two, four, . . . electrodes between each other.

The control pattern 3810 includes four sprites (e.g., control patterns, voltage patterns) 1-4. The control patterns may alternate positive and negative portions (e.g., bands) to polarize adjacent micro-objects with opposite polarities such that the micro-objects repel each other and are not attracted to each other.

Figure 39:
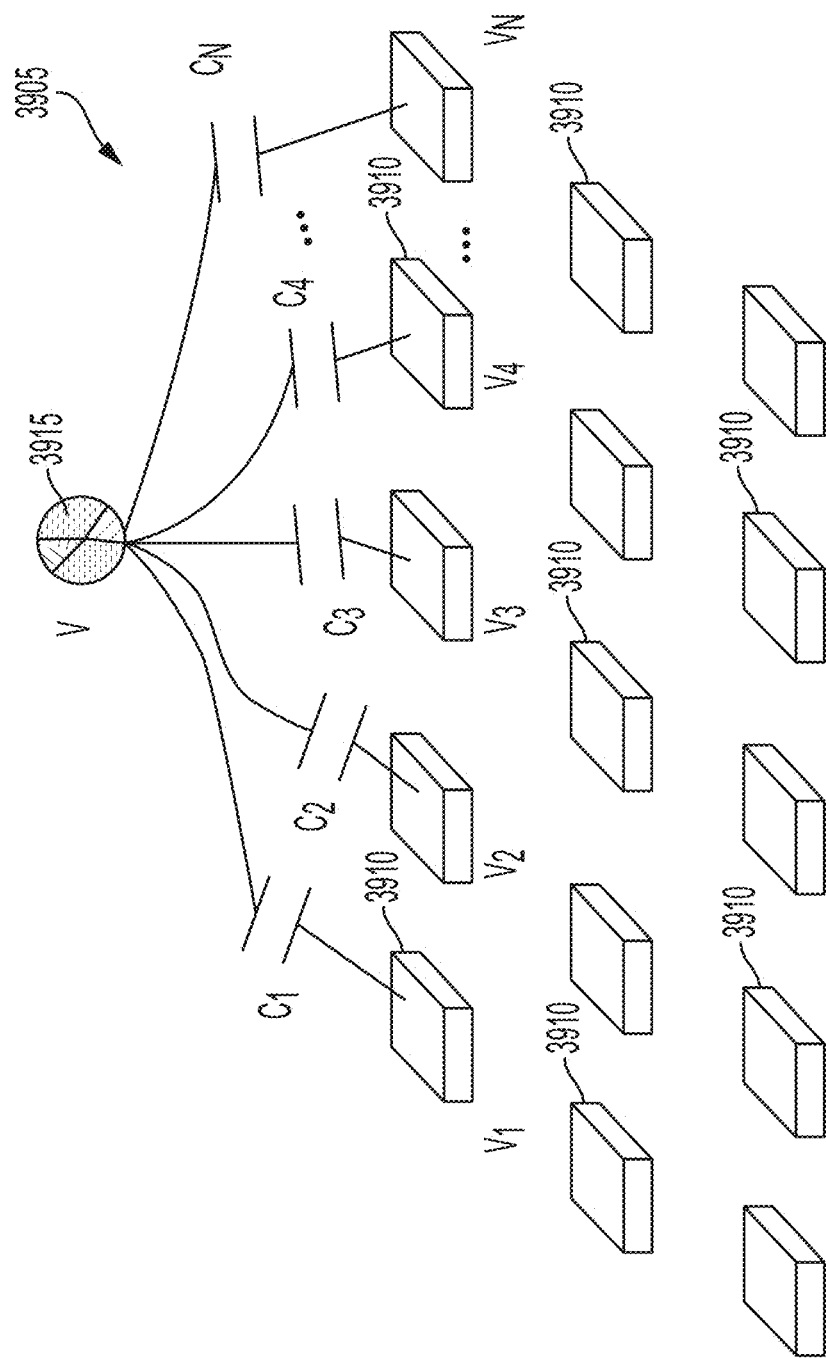
FIG. 39 is a diagram depicting a capacitance model by which each electrode of the micro-assembler is modeled as a capacitor, in accordance with some embodiments of the present disclosure.

FIG. 39 is a diagram depicting capacitances between electrodes 3910 of a micro-assembler 3905 and a micro-object 3915, in accordance with some embodiments of the present disclosure. As discussed above, a computing device (e.g., a control component 2620 of a computing device 150 illustrated in FIG. 26) may generate control patterns that may be included in a control pattern library (e.g., control pattern library 2630 illustrated in FIG. 26). In one embodiment, the computing device (e.g., the control component) may automatically generate control patterns based on modeling and optimization functions, operations, methods, etc. The control patterns (which may be automatically generated by the computing device) may be used to control the voltage patterns that are applied to the electrodes 3910 of the micro-assembler 3905. In one embodiment, the control patterns may be generated by modeling the motion of a micro-object as a function of the electrode voltages and optimizing the voltage pattern to produce the fastest motion in the desired direction. After this optimization is performed, the resulting control patterns may be described and generated based on the position and desired direction of motion of the micro-object 3915.

FIG. 39 illustrates a capacitance based model of the interactions between the micro-object 3915 and the electrodes 3910. The micro-object 3915 may form a capacitor with each underlying electrode 3910. If the voltage of the micro-object 3915 is V, the voltages of the underlying electrodes are $V_1$ to $V_N$. The capacitances between the micro-object 3915 and the underlying electrodes 3910 may be calculated as a function of micro-object-to-electrode distance. The motion for a micro-object may be represented using equation (1):

$$\dot{x} = \frac{F_x}{\mu_1} - \frac{F_z}{\mu_2}, \dot{y} = \frac{F_y}{\mu_1} - \frac{F_z}{\mu_2} \qquad (1)$$

where $\mu_1$ and $\mu_2$ are the friction coefficients in the X-Y plane and the Z direction respectively. The forces x, Fy and Fz represent the forces in the x, y, and z directions. To calculate these forces, a capacitance-based model for the micro-object field interactions may be used. Under such a model, the micro-object 3915 will form a capacitor with each underlying electrode, as illustrated in FIG. 39. The forces Fx, Fy, and Fz may be calculated from the negative gradient of the micro-object field potential using the following equations:

$$F = -\nabla U(x, y, z), F = (F_x, F_y, F_z)^T \qquad (2)$$

$$U(x, y, z) = \frac{1}{2}\sum_i C_i(x, y, z)(V_i - V(x, y, z))^2 + qV \qquad (3)$$

Kirchhoff's circuit law relates the voltage on the particle to the voltages on the electrodes as:

$$V(x, y, z) = \frac{\sum_i C_i V_i}{\sum_i C_i} \qquad (4)$$

Through algebraic operations, the forces may be written in quadratic form plus a linear form on the applied voltages, as represented in the following equations $$F_x = V^T B_x V + q D_x^T V,$$
$$F_y = V^T B_y V + q D_y^T V, \qquad (5)$$
$$F_z = V^T B_z V, + q D_z^T V, B \in R^{N \times N}, D \in R^N$$

where $$B_{x,ij} = -\delta_{ij}\left[\frac{1}{2}\frac{dC_i}{dx}\right] - \left[\frac{1}{2S_C^2}\frac{dS_c}{dx}C_iC_j\right] + \frac{1}{2S_c}\left(\frac{dC_i}{dx}C_j + \frac{dC_j}{dx}C_i\right), \quad (6)$$

$$S_c = \sum_{i=1}^{N} C_i$$

and $$D_{x,i} = +\left[\frac{1}{S_C^2}\frac{dS_c}{dx}C_i\right] - \frac{1}{S_c}\frac{dC_i}{dx}. \quad (7)$$

The simplified force expression enables us to write the equation of motion in a more compact form as follows:

$$\dot{x} = \frac{F_x}{\mu_1} - \frac{F_z}{\mu_2} = V^T\left(\frac{B_x}{\mu_1} - \frac{B_z}{\mu_2}\right)V + q\left(\frac{D_x}{\mu_1} - \frac{D_z}{\mu_2}\right)V = V^TA_xV + M_xV, \quad (8)$$

$$\dot{y} = \frac{F_y}{\mu_1} - \frac{F_z}{\mu_2} = V^T\left(\frac{B_y}{\mu_1} - \frac{B_z}{\mu_2}\right)V + q\left(\frac{D_y}{\mu_1} - \frac{D_z}{\mu_2}\right)V = V^TA_yV + M_yV$$

where $$A_x = \left(\frac{B_x}{\mu_1} - \frac{B_z}{\mu_2}\right), M_x = \left(\frac{D_x}{\mu_1} - \frac{D_z}{\mu_2}\right), \quad (9)$$

$$A_y = \left(\frac{B_y}{\mu_1} - \frac{B_z}{\mu_2}\right), M_y = \left(\frac{D_y}{\mu_1} - \frac{D_z}{\mu_2}\right)$$

This reformulation may provide insight on the mathematical structure of the equation of motion under applied voltages and may facilitate in optimizing the voltage pattern to produce the fastest motion in the desired direction.

Figure 40A:
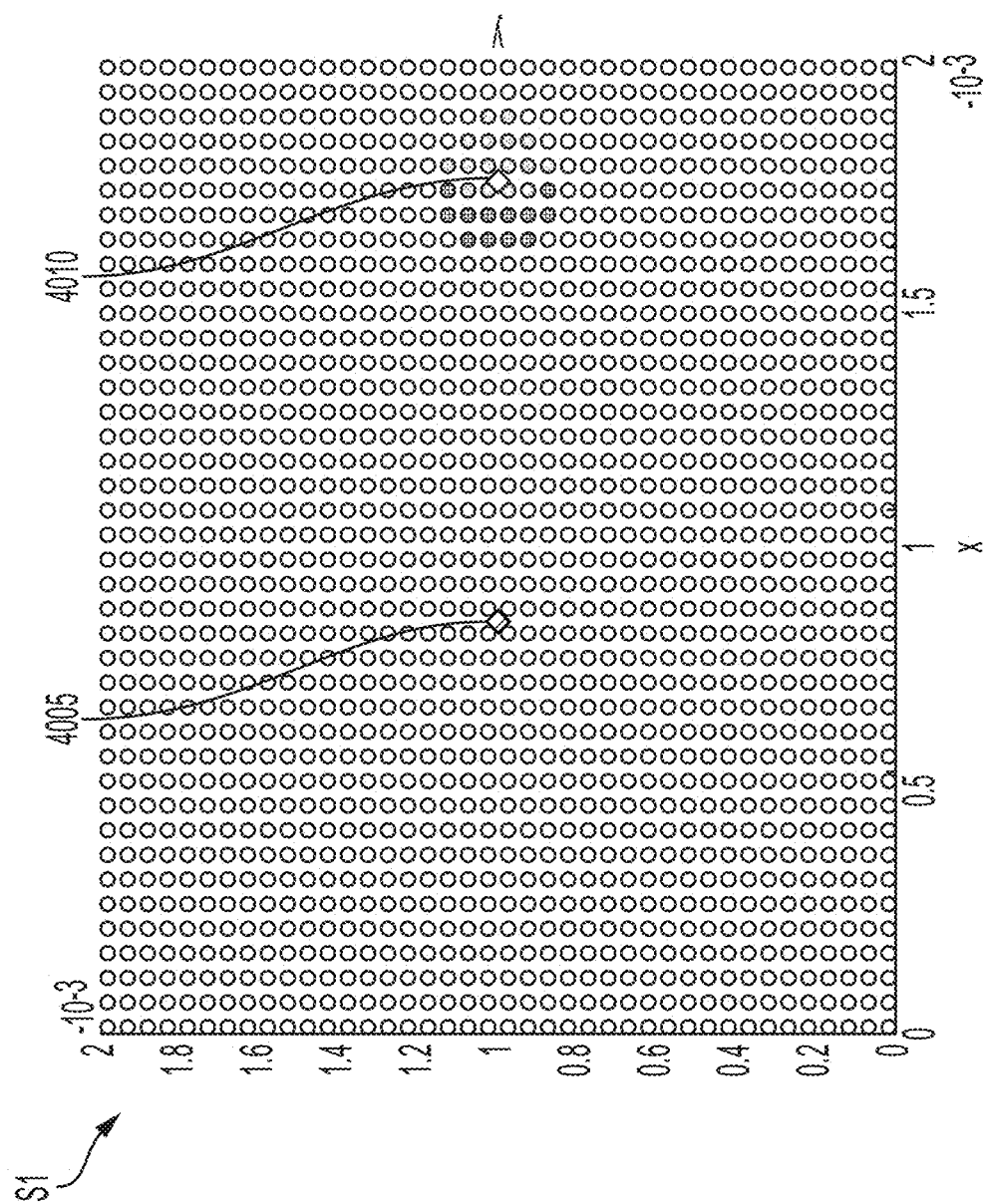
Figure 40B:
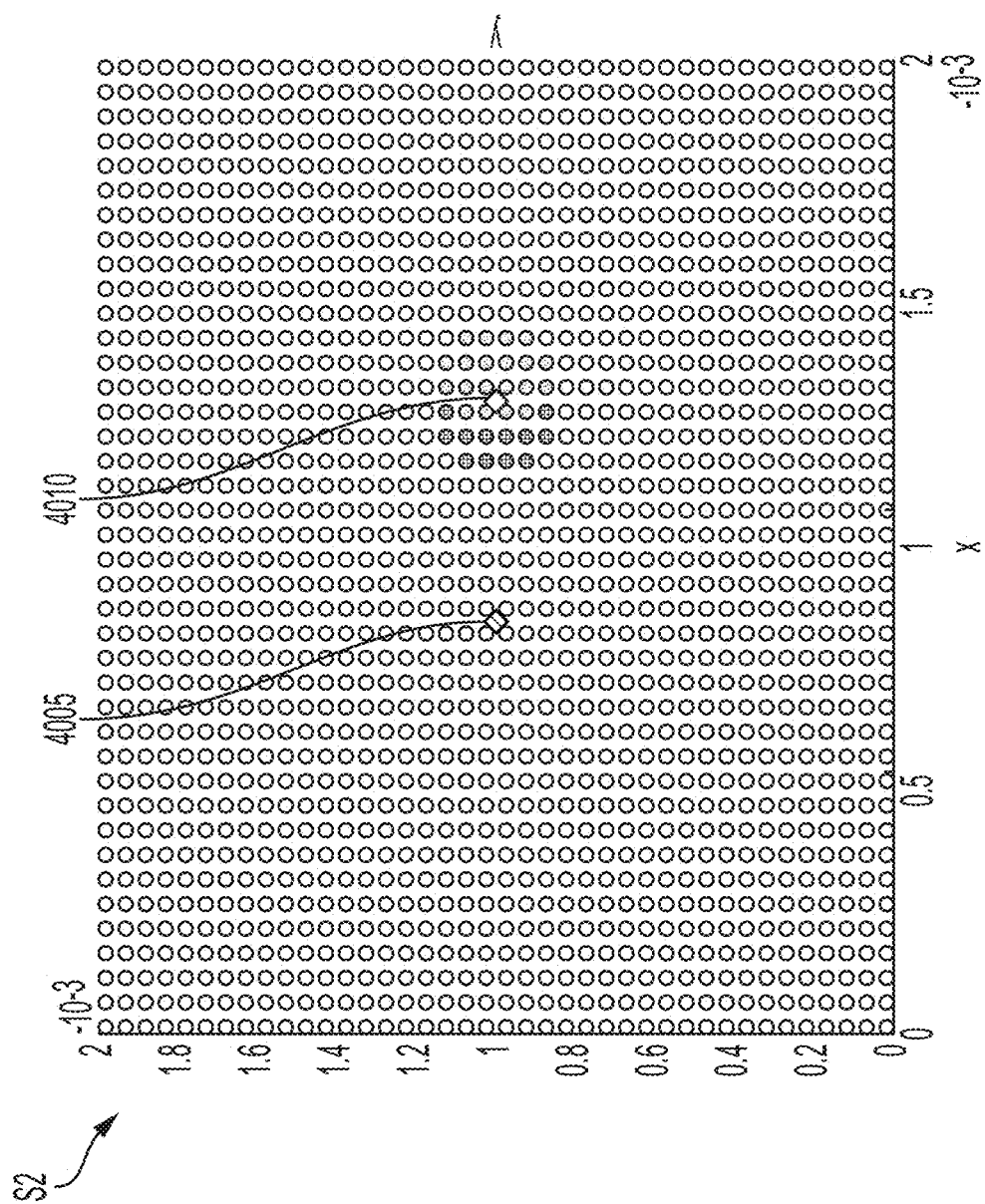

FIGS. 40A-40C illustrate how a micro-object 4010 can be manipulated to arrive at a target location 4005 (e.g., a target), in accordance with some embodiments of the present disclosure. Referring to the equations (1)-(9) above, the quadratic terms of the equations may not be considered because they may be smaller than the linear terms. If we do not consider the quadratic terms of the equations (3), (5), (6), and (8), an equation for determining the motion of a single micro-object 4010 as related to the applied voltage V of the N electrodes may be defined as $$\dot{x}=M_xV, \dot{y}=M_yV, V\in R^N \quad (10)$$

Given the target position ($x_{target}$, $y_{target}$), one optimal control may be to maximize the projection of the velocity vector onto the specified direction (cos(θ), sin(θ)), where $$\theta = \arctan\left(\frac{y_{target} - y}{x_{target} - x}\right) \quad (11)$$

The optimization formula may be defined as follows:

$$\max_{-V_{min} \leq V \leq V_{max}} (M_x\cos(\theta) + M_y\sin(\theta))^T V \quad (12)$$

where $V_{min}$ and $V_{max}$ are the lower and upper bounds of the applied voltages.

As illustrated in FIG. 40, different voltages may be applied to electrodes of a micro-assembler to move the micro-object 4010 to the target location 4005. The dotted electrodes indicate electrodes where the voltage $V_{max}$ is applied and the cross hashed electrodes indicate electrodes where the voltage $V_{min}$ is applied. FIG. 40 illustrates the locations of the micro-object 4010 and the voltages applied to the different electrodes at different stages S1, S2, and S3 (e.g., at different time periods, different points in time).

FIG. 41 illustrates how a plurality of micro-objects 4110 can be manipulated to arrive at a plurality of target locations 4105 (e.g., multiple targets), in accordance with some embodiments of the present disclosure. Referring to the equations (1)-(12) above, if we assume there are K micro-objects, characterized by position vector ($x_1$, $y_1$), ..., ($x_K$, $y_K$) and K target locations, characterized by position vector ($x_{1,target}$, $y_{1,target}$), ..., ($x_{K,target}$, $y_{K,target}$). The equation of motion for each micro-object may be defined as:

$$\dot{x}_i=M_{x_i}V, \dot{y}_i=M_{y_i}V, i=1,2,\ldots,K \quad (13)$$

If we want the first micro-object to go to the first target location, the second micro-object to go to the second target location, and so on and so forth to the Kth micro-object and the Kth target location, the direction for each micro-object in which we want to maximize the velocity may be defined as follows:

$$\theta_i = \arctan\left(\frac{y_{i,target} - y_i}{x_{i,target} - x_i}\right) \quad (14)$$

Maximizing the velocity projection of each micro-object on its specified direction may be achieved by maximizing the weighted sum of the velocity projection of each micro-object on its specified direction, using the following equation:

$$f = \sum_{i=1}^{K} w_i(\dot{x}_i\cos(\theta_i) + \dot{y}_i\sin(\theta_i)) = MV \quad (15)$$

$$\max_{-V_{min} \leq V \leq V_{max}} f$$

where the weights $w_i$ reflect the priority of optimization for each micro-object and where the larger the weights, the higher the priority.

Figure 41A:
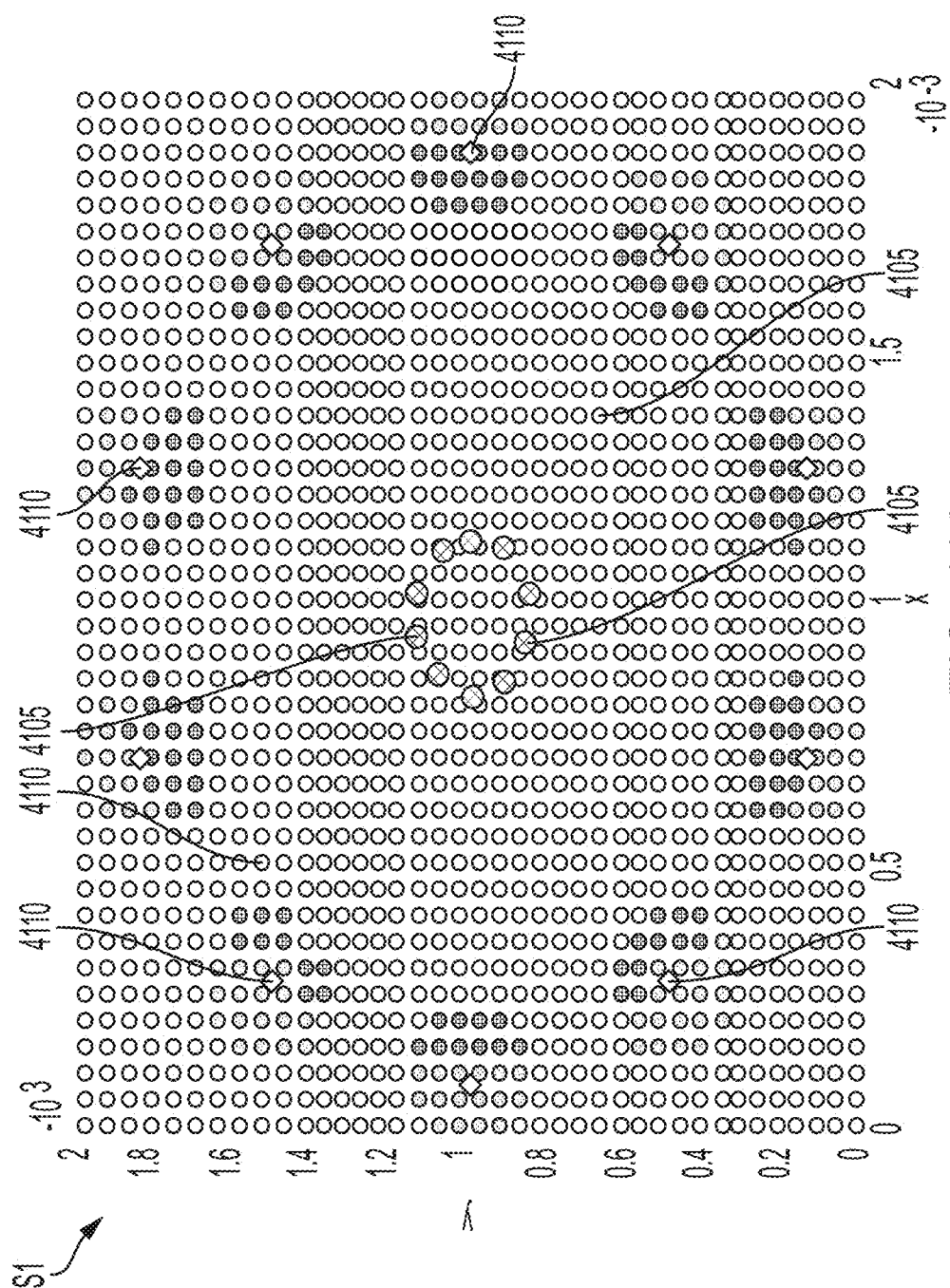
FIGS. 41A-41C illustrate how applied voltage pattern can manipulate a plurality of micro-objects to arrive at a plurality of target locations, in accordance with some embodiments of the present disclosure.
Figure 41B:
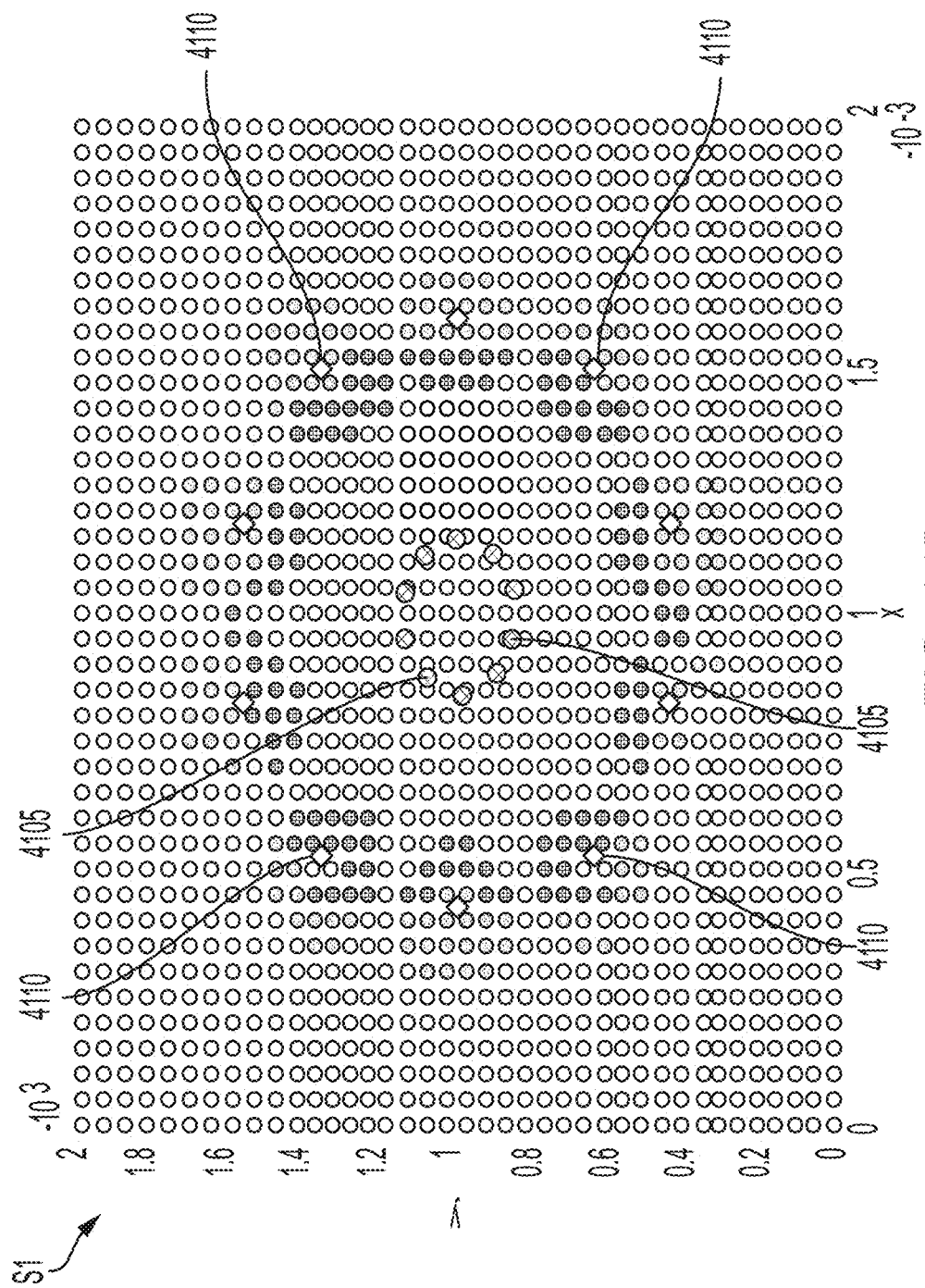
Figure 41C:
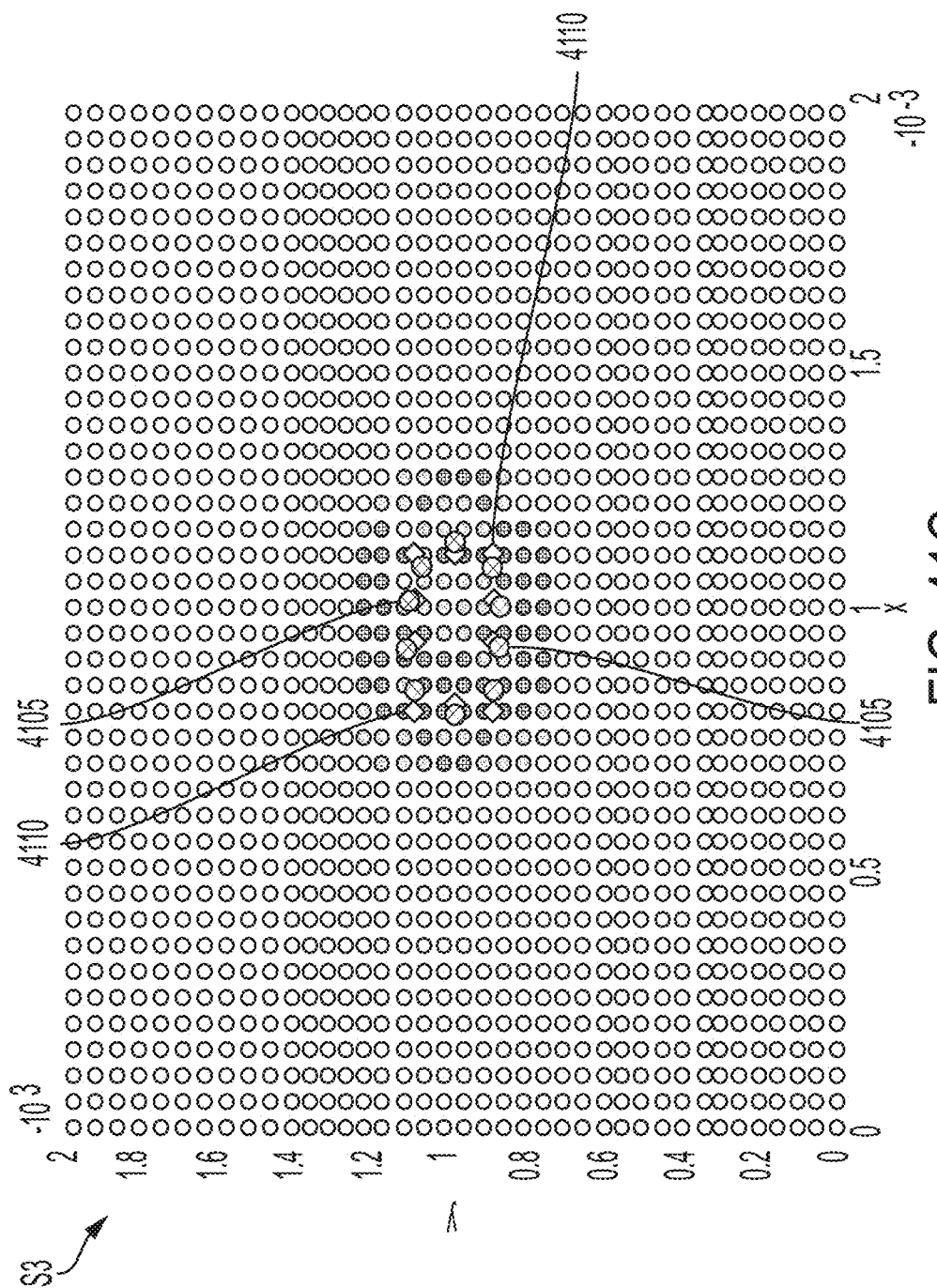

FIGS. 41A-41C illustrate ten micro-objects 4110 that are directed to ten target locations 4105 (e.g., one target location 4105 for each micro-object 4110). The ten micro-objects 4110 are arranged in a circle and the ten target locations 4105 are arranged in a smaller circle. A weight of 1 was used for all $w_i$ in equation (15).

As illustrated in FIG. 41, different voltages may be applied to electrodes of a micro-assembler to move the micro-objects 4110 to the target locations 4105. The dotted electrodes indicate electrodes where the voltage $V_{max}$ is applied and the cross hashed electrodes indicate electrodes where the voltage $V_{min}$ is applied. FIG. 41 illustrates the locations of the micro-objects 4110 and the voltages applied to the different electrodes at different stages S1, S2, and S3 (e.g., at different time periods, different points in time).

Figure 42:
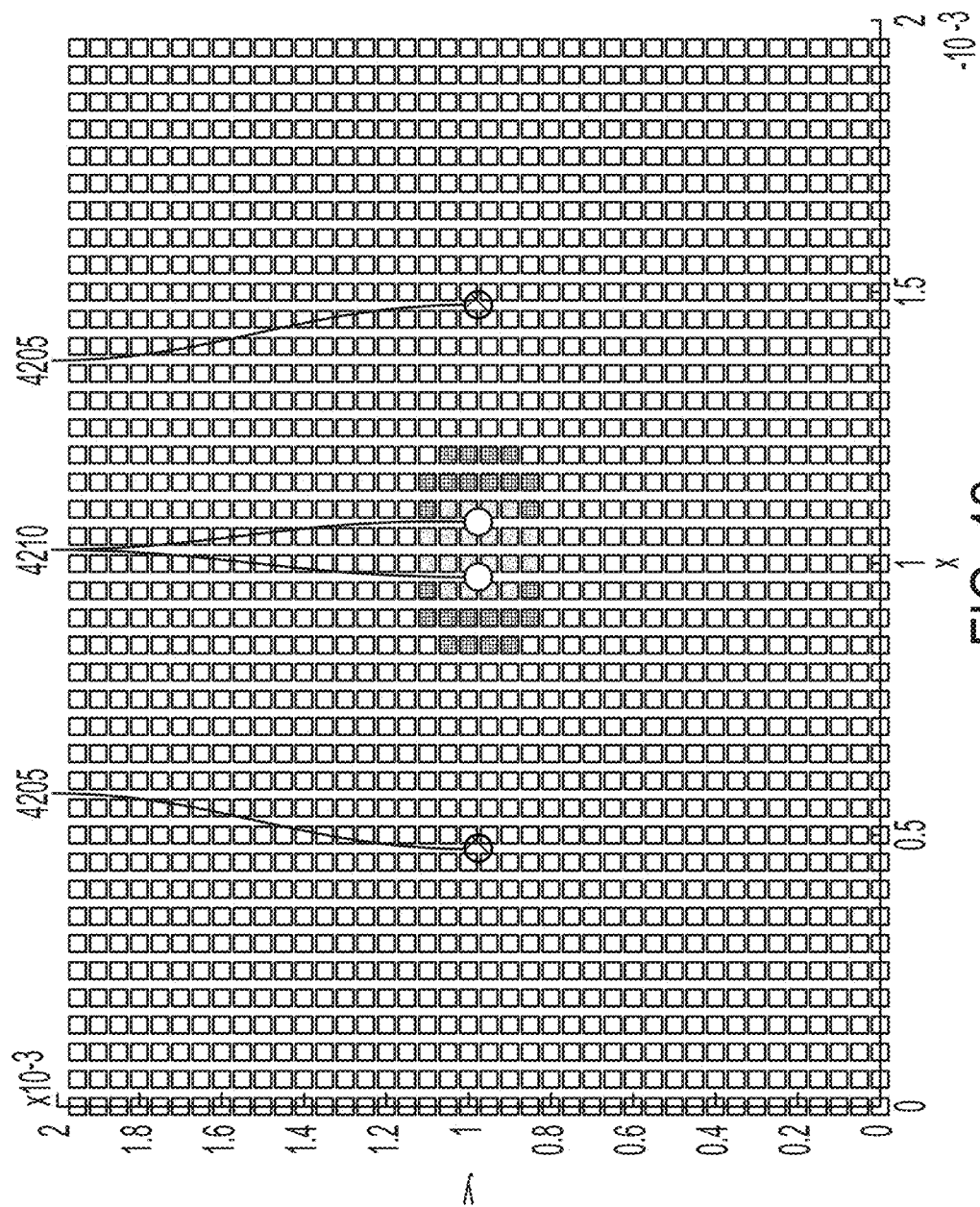
FIG. 42 illustrates how applied voltage pattern can manipulate and separate a plurality of micro-objects to arrive at a plurality of target locations, in accordance with some embodiments of the present disclosure.

FIG. 42 illustrates how a plurality of micro-objects 4210 can be manipulated to arrive at a plurality of target locations 4205 (e.g., multiple targets), in accordance with some embodiments of the present disclosure. The plurality of micro-objects 4210 may be micro-objects that are close to each other (e.g., closely-spaced micro-objects). The micro-objects 4210 may be separated to the target locations 4205. The formulas (13)-(15) may be used to determine control patterns that may be used to manipulate the micro-objects 5210 along an optimal path. The formulas (13)-(15) may also be used to determine control patterns that may be used to move the micro-objects 4210 to their respective target locations 4205. In one embodiment, the formulas (13)-(15) may also be used to determine control patterns that may be used to manipulate different sets of closely spaced micro-objects 4210. For example, there may be multiple groups of micro-objects 4210 and the multiple groups of micro-objects 4210 may be located in closely spaced portions of the surface of the micro-assembler. The formulas (13)-(15) may be used to determine control patterns that may be used to manipulate each of the multiple groups of micro-objects 4210.

As discussed above, there may be multiple groups, sets, etc., of micro-objects 4210 that may be closely spaced on the surface of the micro-assembler. In one embodiment, a computing device may use one set of control patterns to move one each of the micro-objects 4210 in a group. Each set of control patterns may be identified or determined based on formula (12), separately for each respective micro-object, as discussed above. If two control patterns overlap (e.g., two control patterns may be applied to the same force generating pixels), the first control pattern may be used in the overlapping region for a period of time and the second control pattern may be used in that region for a period of time. Outside of the overlapping region, both control patterns may be applied as usual. The micro-assembler (or controller/control component) may switch between the first control pattern and the second control pattern in the overlapping region in a randomized order or may alternate between the first control pattern and the second control pattern. This allows both of the control patterns to be applied at different points in time while still moving the micro-objects 4210 to their target locations.

Figure 43:
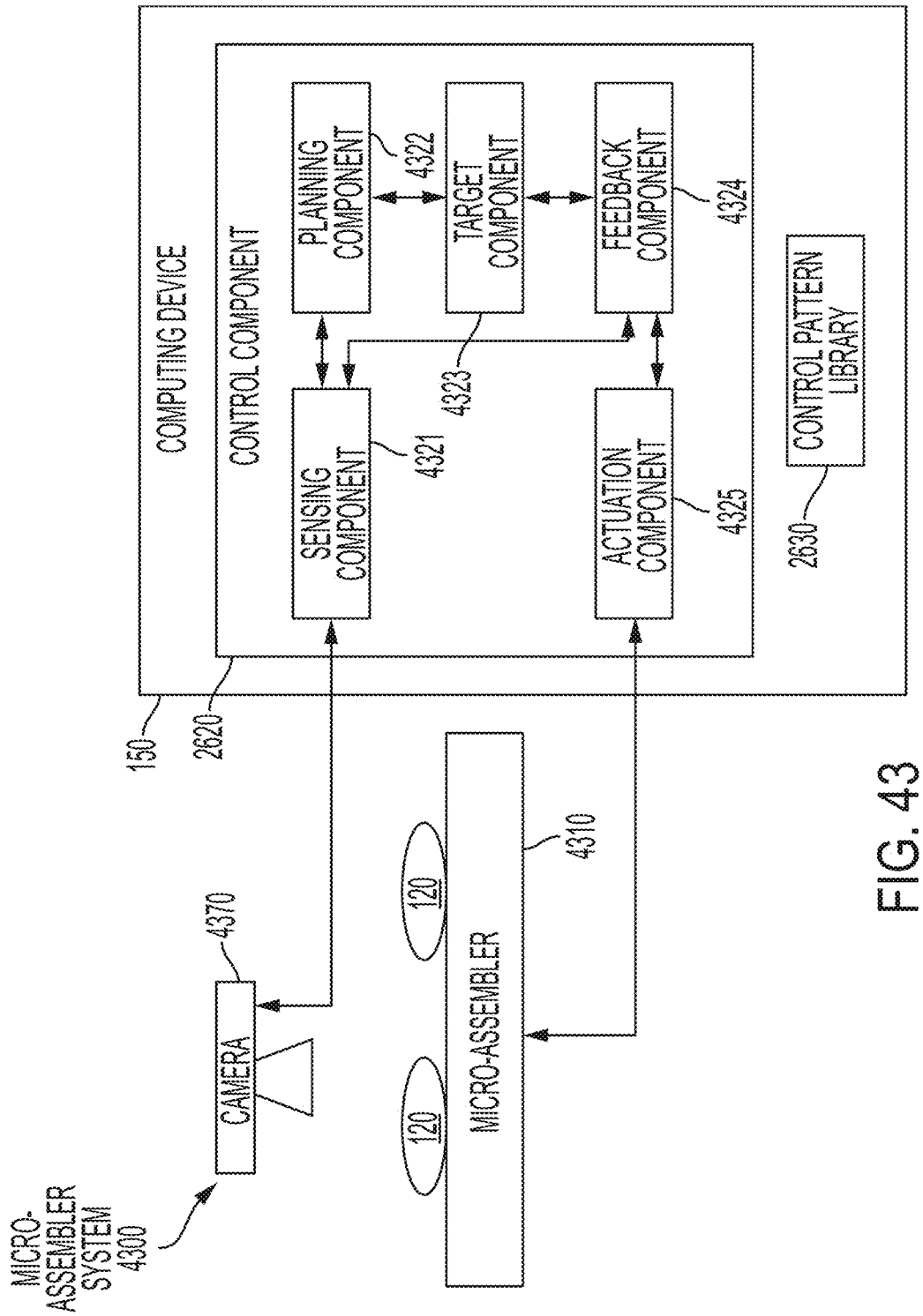
FIG. 43 is a schematic diagram of depicting an embodiment of a micro-assembler system for controlling placement of micro-objects, in accordance with some embodiments of the present disclosure.

FIG. 43 is a schematic diagram depicting an embodiment of a micro-assembler system 4300 for controlling placement of micro-objects 120, in accordance with some embodiments of the present disclosure.

As discussed above, the micro-assembler 4310 may use various control patterns that indicate spatially and temporally varying voltage patterns that may be used to manipulate the micro-objects 120 (e.g., move a micro-object 120, hold a micro-object 120 in place, rotate a micro-object, etc.). Although the control patterns may be selected and used (e.g., moved/positioned) manually or used in a pre-defined (e.g., a pre-programmed) sequence, it may be useful to control the micro-objects 120 using feedback. The feedback may be data indicating where one or more micro-objects 120 are located on the surface of the micro-assembler 4310. For example, the feedback data may be an image (e.g., image data) that shows the surface of the micro-assembler 4310 and the locations of the micro-objects 120 after a voltage pattern was applied to one or more electrodes of the micro-assembler 4310. Based on the feedback, the control component 2620 may change the control patterns used, change the locations where the control patterns are applied, change the orientation of the control pattern, etc.

In one embodiment, the sensing component 4321 determines the current state of the micro-objects 120. The state of micro-objects 120 may include the position, the orientation, one or more types of the micro-objects 120 (e.g., whether the micro-objects 120 are beads, chiplets, metallic, glass, up/down face of the micro-objects, etc.). The sensing component 4321 may communicate with the camera 4370 (or some other type of sensor that may be used to detect the current state of the micro-objects 120). The camera 4370 may be a high resolution camera that may capture images or video and may provide the images to the sensing component 4321. The sensing component 4321 may analyze the images or video captured by the camera 4370. The sensing component 4321 may determine the positions (e.g., locations) of micro-objects 120 and may determine the orientations of the micro-objects 120. The positions/orientations may be determined by analyzing one image (e.g., instantaneous detection) or by analyzing multiple images and tracking the positions/orientations of the micro-objects 120 over time. The sensing component may also determine the identity of one or more micro-objects 120. For example, the sensing component 4321 may assign an identifier (e.g., an alpha numeric string, a number, etc.) to a micro-object 120 to assist in the tracking of the micro-object 120.

In one embodiment, the planning component 4322 may communicate with a transfer system (not illustrated in the figures) to facilitate the transfer of the micro-objects 120 off of the surface of the micro-assembler 4310. For example, the planning component 4322 may communicate with a transfer system to transfer the micro-objects 120 onto a target substrate which may be located above and/or parallel to the micro-assembler 4310. The planning component 4322 may also organize the micro-objects 120 into different groups, sets or batches of micro-objects. This may allow the planning component 4322 to manipulate the micro-objects 120 in separate batches or groups which may facilitate the placement of the micro-objects into their target locations or targets. The planning component 4322 may also determine which mode the control component 2620 will operate in, as discussed in more detail below.

In one embodiment, the target component 4323 may determine target locations for the different micro-objects 120. For example, the target component 4323 may receive user input indicating the target locations for the different micro-objects 120. In another example, the target component 4323 may determine the target locations based on a configuration file, based on analyzing an image by sensing component 4321, or based on pre-define target locations (e.g., locations that may have previously been specified). The target component 4323 may also determine one or more intermediate target locations which may be used while moving the micro-objects 120 to their final target locations.

In one embodiment, the feedback component 4324 may identify or determine which control patterns should be used based on the positions/orientations of the micro-objects detected by the sensing component 4321. The feedback component 4324 may also determine the positioning and the orientation of the control pattern. The feedback component 4324 may also determine which electrodes of the micro-assembler 4310 the control patterns should be applied to. As discussed above, the feedback component 4324 may use control patterns that are included in or pre-defined in the control pattern library 2630.

In one embodiment, the actuation component 4325 may apply different voltages and/or currents to the electrodes of the micro-assembler 4310 based on the control patterns. For example, the actuation component 4325 may couple an electrode to a voltage/current source by activating a switch. In another example, the actuation component 4325 may control a light source (e.g., a laser) and direct the light source at one or more phototransistors.

Figure 44:
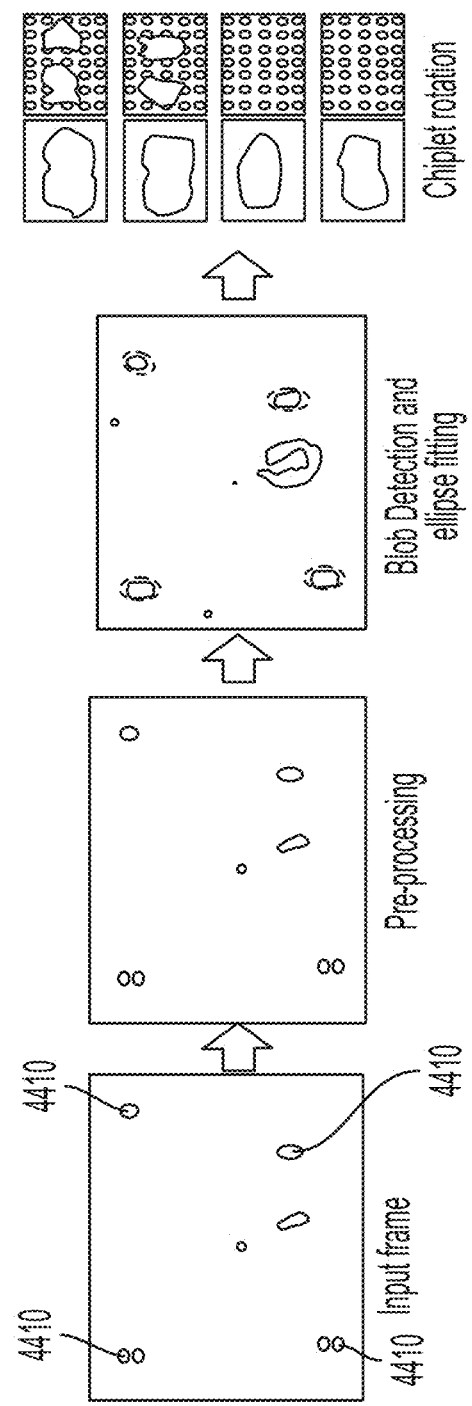
FIG. 44 is a diagram depicting micro-objects on a surface of a micro-assembler, in accordance with some embodiments of the present disclosure.

FIG. 44 is a diagram depicting micro-objects 4410 on a surface of a micro-assembler, in accordance with some embodiments of the present disclosure. As discussed above, a camera may capture an image or a video of the surface (or a portion of the surface) of the micro-assembler. A sensing component may detect the locations and/or orientations of the micro-objects 4410. Various algorithms, methods, functions, operations, etc., may be used to analyze the images/ videos and detect the locations and/or orientations of the micro-objects 4410. For example, foreground segmentation, background subtraction, morphological filtering, and/or foreground blob selection may be used to detect micro-objects. Other methods include the use of deep neural networks that take a full image frame as input and output the localizations and size of each micro-object. For example, the paper "Mask R-CNN," by Kaiming He, et al., describes how a convolutional neural network (CNN) may be used to identify features (e.g., micro-objects) in an image. In another example, the techniques presented in the paper "SSD: Single Shot MultiBox Detector," by Wei Liu, et al., may be used to identify or detect micro-objects on the surface of the micro-assembler. Alternative deep network output may include a full pixel-labeled segmentation map (e.g., as illustrated in the paper "Mask R-CNN") where each pixel label may indicate the presence of a micro-object and/or a unique ID for that micro-object. Kalman filtering and/or the Hungarian matching algorithm may be used to detect blobs (e.g., one or more) of micro-objects.

Various parameters may be used to detect blobs which may correspond to micro-objects, such as chiplets. To set these parameters, the control component of a computing device may use the following approach/method. The control component may choose a set of parameters that may result in very sensitive blob segmentation. For example, there may be false positives detected that may indicate that micro-objects are detected when the micro-objects are not actually there. The control component may perform blob segmentation as illustrated in FIG. 44. For example, the control component may analyze the input frame and perform pre-processing on the input frame. The control component may then perform blob detection and ellipse fitting (e.g., shape fitting) to identify candidate micro-objects. The control component may then identify the orientation or rotation of the candidate micro-objects.

After performing the blob segmentation, the control component may track each blob that is detected. For example, the control component may indicate the location of each blob, the orientation of each blob, the size of each blob, an identifier for each blob, etc. The control component may apply a control pattern that may move micro-objects by a fixed number of pixels (e.g., by a fixed number of electrodes) and may separate the micro-objects. For example, the control component may apply a control pattern that may separate the micro-objects (e.g., blobs) by 100 pixels or 100 electrodes. If less than a threshold number of blobs move, the control component may choose a new set of parameters that reduces sensitivity and may re-perform the blob segmentation, tracking, and control pattern application. If more than the threshold number of blobs move, the control component may reduce the sensitivity of the sensing component in incremental steps (e.g., small steps) until less than a threshold number of non-moving micro-objects are no longer detected.

Figure 45:
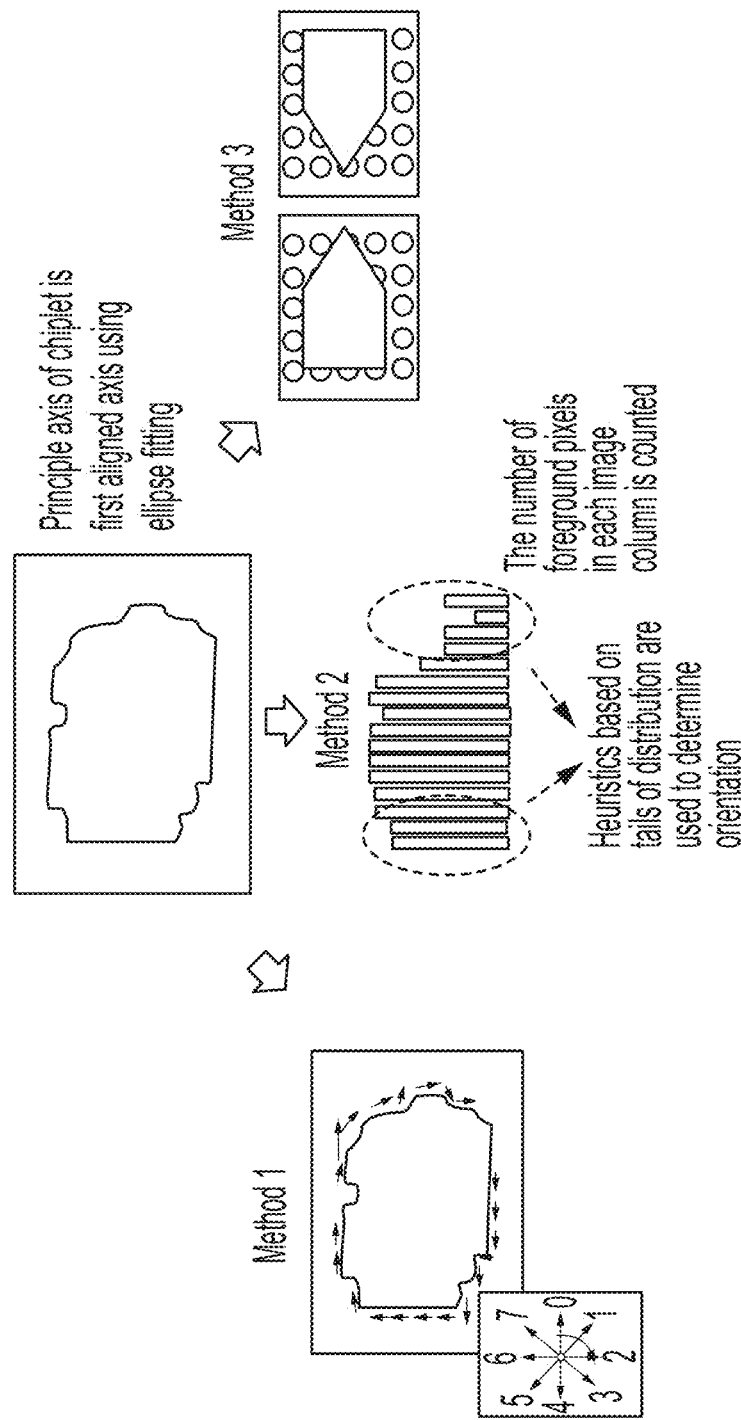
FIG. 45 is a diagram depicting example methods for determining and orientation of a micro-object, in accordance with some embodiments of the present disclosure.

FIG. 45 is diagram depicting example methods for determining the orientation of a micro-object, in accordance with some embodiments of the present disclosure. As discussed above, a camera may capture an image or a video of the surface (or a portion of the surface) of the micro-assembler. Various algorithms, methods, functions, operations, etc., may be used by a control component to analyze the images/videos and determine the orientations of the micro-objects.

In one embodiment, the symmetries and/or asymmetries of the micro-objects may be used to facilitate the determination of the orientation of the micro-objects (e.g., to simply or decrease the complexity of the image processing used to determine the orientation of the micro-objects). The asymmetry of the micro-object may be given by properties of the micro-objects, e.g., shape, reflectivity, transmissivity, color, texture, label, etc. The control component may determine the orientation of a micro-object up to a 180 degree rotation by fitting an ellipse and then rotating by the line described by the principle axis of the ellipse.

The control component may also use the asymmetry in the tip of a micro-object to determine possible orientations of the micro-object (e.g., a chiplet). Various methods may be used to determine the possible orientations of the micro-object. A first method may geometrically encode the perimeter of a micro-object (e.g., a blob). Freeman chain codes may be used in the encoding scheme. The first method may select a random starting foreground point on the perimeter of the micro-object and then searching each of its eight neighboring pixel regions in a fixed direction for a foreground pixel. When a foreground pixel is found, the indexed location of the neighbor is stored (e.g., a value between 0 and 7) and added to an array. This process is repeated from each newly found foreground point until the original starting foreground point is reached. The encoded arrays are used to determine which direction the micro-object is pointing.

A second method may count the number of foreground pixels in each column along the horizontal axis of a cropped image of a micro-object that has been determined to lie within 180 degrees to generate a histogram. Each bin in the histogram counts the number of foreground pixel in each column of the image. The asymmetry of ends of the micro-object may be used to determine if the micro-object is pointing left or right. This may be referred to as axis projection.

A third method may use a canonical micro-object image template (e.g., a reference image of a micro-object) that is rescaled to size of the micro-object in the image. The template is oriented in both directions (left and right) and a correlation coefficient is calculated to determine the direction. This may be referred to as a template overlay.

In one embodiment, the control component may also use a belief value to determine whether a micro-object that is detected (in an image) is an actual micro-object or is an imaging artifact. This may be useful when removing false positives or false detections. In addition, a micro-object that has a belief value that indicates that the micro-object is an actual micro-object but whose image is not detected may be referred to as a lost or missing micro-object. This may allow the control component to take corrective actions/measure (e.g., apply different control patterns) to restore the visibility of the micro-object (e.g., to bring the micro-object back onto the micro-assembler surface, or focal plane).

Figure 46:
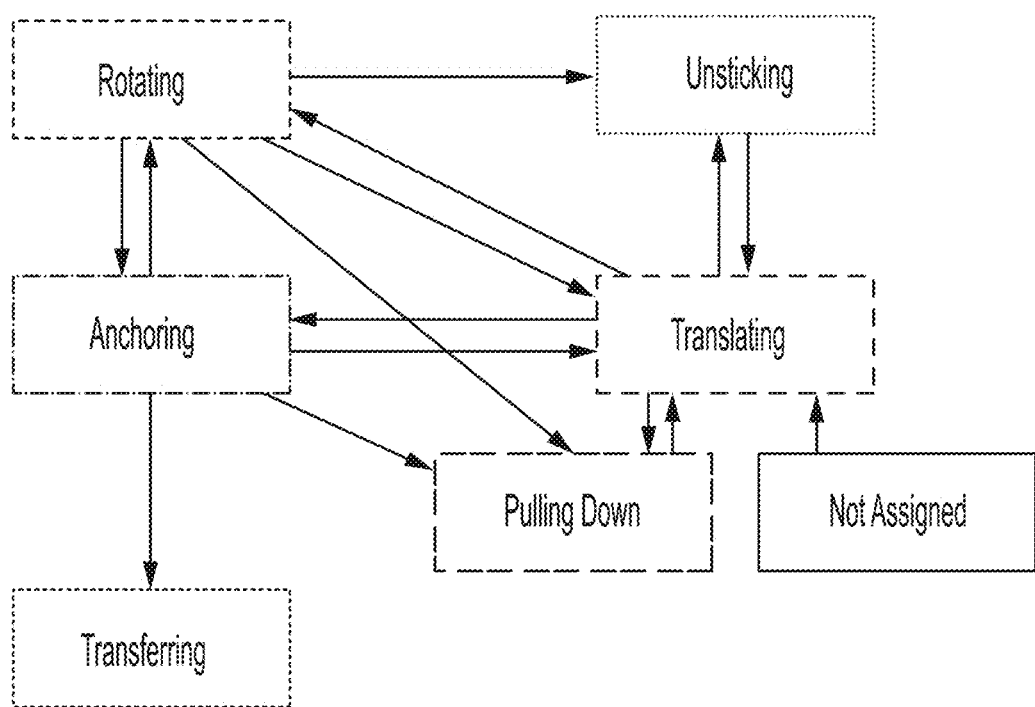
FIG. 46 is a diagram depicting example modes of operation for a control component, in accordance with some embodiments of the present disclosure.

FIG. 46 is a diagram depicting example modes of operation for a control component, in accordance with some embodiments of the present disclosure. The modes of operation may be referred to as control modes. As discussed above, a control component may manipulate micro-objects using one or more control patterns. The control component may operate in different modes. In one embodiment the different modes may include an unassigned (e.g., not assigned) mode, a translation mode, a rotating mode, an unsticking mode, a pulling down mode, an anchoring mode, and a transferring mode. In the unassigned mode (e.g., unassigned control mode), a micro-object is not assigned to a target location so the micro-object may not be controlled by the control component. In the translation mode (e.g., translation control mode), the micro-object may be tracked and/or analyzed to determine its current state. For example, the micro-object may be analyzed to determine its current position, orientation, etc. The micro-object may also be translated (e.g., moved) in translation mode. In the rotating mode (e.g., the rotation control mode), the orientation of the micro-object may be detected (e.g., via a camera or some other sensor). The micro-object may also be rotated if the micro-object is not in a desired orientation. In the unsticking mode (e.g., the unstick control mode), the micro-object may not be moving smoothly and different actions may be performed (e.g., applying agitating control patterns) to encourage movement of the micro-object. In the pulling down mode (e.g., the pulldown control), the micro-object is no longer detected by the sensor (e.g., no longer visible in an image) and may be moved back into the plane of focus of the sensor (e.g., the plane of focus of a camera). In the anchoring mode (e.g., the anchor control mode), the micro-object may be at the target position, or intermediate target position, etc., may be oriented correctly, and may be kept in place (e.g., held, anchored, etc.). In the transferring mode (e.g., the transfer control mode), the micro-object may be transferred off the micro-assembler. In other embodiments, the control component may use other modes to perform various other functions, operations, actions, tasks, etc.

Under closed-loop control, the control component may identify, select, and/or use different control patterns to manipulate micro-objects based on feedback received from a sensor (e.g., a camera). The control patterns may be from a control pattern library or may be dynamically generated (e.g., generated on the fly) based on the state and/or history of one or more micro-objects. For example, if a micro-object is close to its desired target position, it can be switched from a translation control mode to a rotation control mode. In the rotation control mode, different control patterns and different algorithms may be used to position and orient the micro-object relative to the target. In the rotation control mode, different control patterns and different algorithms may be used to orient the micro-object relative to the target. The feedback may be received by the control component while the control component is in any one of the control modes illustrated in FIG. 46. For example, the control component may request images from a camera or may cause a camera to capture images of the micro-object while the control component is in the translation mode in order to determine the best control pattern to move the micro-object closer to its assigned target. The control component may also request images from a camera or may cause a camera to capture images of the micro-object while the control component is in the rotation control mode in order to determine the best control pattern to orient the micro-object relative to its assigned target.

In each control mode, the control component may determine which control patterns to use as well as the placement of the control patterns. The choice of control mode and control patterns may depend on one or more of the current state of the micro-object, the history of states for the micro-object, and the history of the controls (such as for implementing control schemes involving dynamics, delay compensation, etc.), the target or desired state for the micro-object (e.g., a target location and/or orientation for the micro-object). Different types of control patterns are possible in each mode. For example, in rotation mode, control patterns might be employed with a slow rotation, which micro-objects will track, or a rapid rotation that will bump micro-objects in the correct rotation at every turn. The control in the translation mode might take into account obstacle avoidance. Additional control modes are also possible. For example, if the micro-objects have a distinct top and bottom, and one of these orientations is acceptable for assembly, a "flip" mode might be employed with control patterns designed to flip the micro-objects over.

In one embodiment, the control component may identify different sets of control patterns based on the current state of the micro-object and/or the control mode for the control component. For example, the control component may currently be in a rotation mode and may be applying a first set of control patterns to rotate a micro-object. The control component may determine that a micro-object has been rotated to the correct orientation (e.g., that the state of the micro-object is at a corrected or desired state) based on data received from a sensor, such as a camera.

Due to the pixelated nature of the micro-assembler, a control pattern may be tuned by the control component so that the application of the control patterns is aligned with discrete elements of the micro-assembler (e.g., with the electrodes or pixels of the micro-assembler). This may allow for better or more optimal performance of the control pattern. Tuning a control pattern may be akin to pixelating the patterns at a resolution corresponding to the elements (e.g., electrodes) of the micro-assembler. The tuning may be performed after the desired position and orientation of the control patterns are determined.

Figure 47:
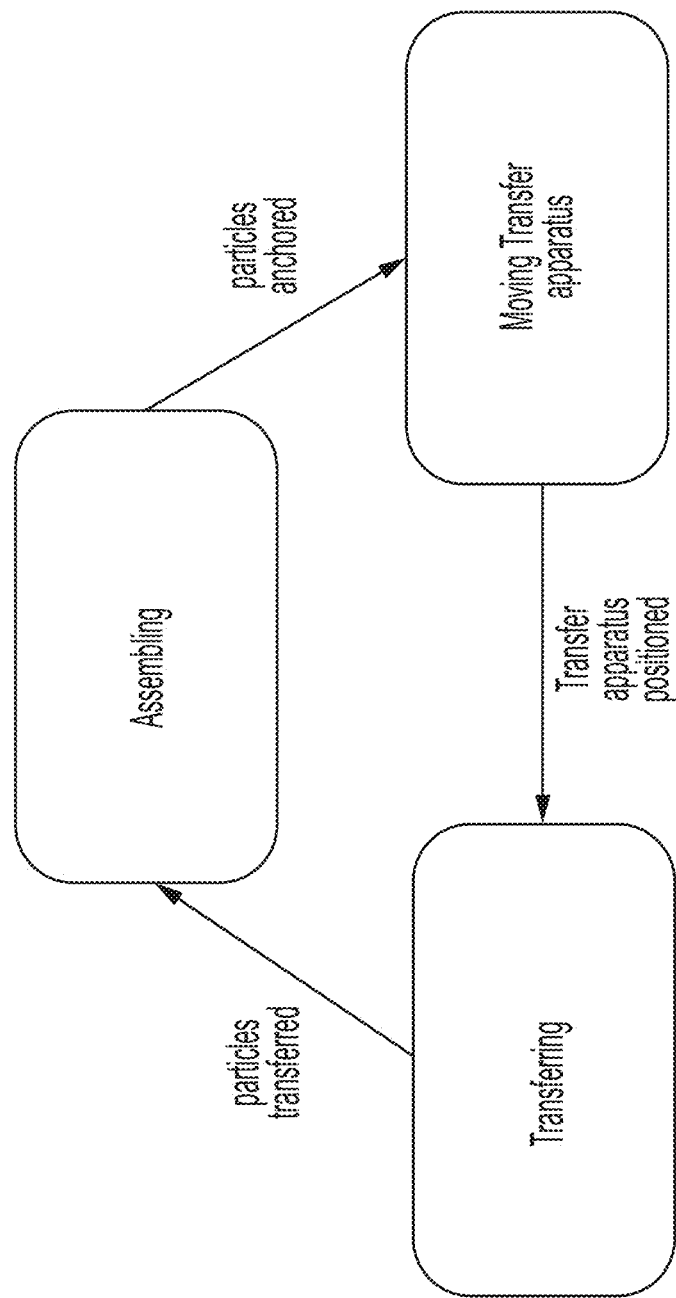
FIG. 47 illustrates different modes for a planner, in accordance with some embodiments of the present disclosure.

FIG. 47 illustrates different modes for a planner, in accordance with some embodiments of the present disclosure. In one embodiment, the planner may be a component (e.g., hardware, software, firmware, or a combination thereof) that may be separate from the control component. In another embodiment, the planner may be part of the control component. The planner may perform higher level operations or functions. For example, the planner may coordinate the movement/manipulation of the micro-objects and the transfer of the micro-objects off of the micro-assembler. For example, the planner may cause or instruct the control component to move micro-objects to target locations and may use a transfer apparatus (e.g., a conveyer belt, a platform, or some other device) to transfer the micro-objects off of the micro-assembler onto the transfer apparatus (e.g., onto a receiving substrate that may be on the transfer apparatus).

In order to coordinate assembly with transfer, speed up assembly, and enable the operation of multiple control pattern schemes controlled through feedback and open-loop (pre-programmed pattern sequences) at the same time, the planner may sit above the control component planner in a functional sense. The planner may switch between high-level operational modes that may indicate sets of patterns to be used, as well as other operational parameters. The control pattern sequence and control pattern position and orientation may be dynamically changed by the planner.

In the "Assembling" mode, the micro-objects may be moved to the target positions, may be oriented in target orientations, and may be anchored there. In the "Moving Transfer apparatus" mode, the particles continue to be anchored while the transfer substrate is positioned. In the "Transferring" mode, the special transfer control pattern is placed on each particle to assist in transfer. The planner modes may control types of patterns to be used for control as well as parameters, modes, or algorithms for control or target assignment. In one embodiment, some micro-objects may still be moved or translated to target positions while the planner is in the "Moving Transfer apparatus" mode or the "Transferring" mode. For example, a first set of micro-objects may not be anchored or may not be transferred because the first set of micro-objects is still being moved to their target locations. A second set of micro-objects may already be at their target locations and the second set of micro-objects may be anchored (in the "Moving Transfer apparatus" mode) and transferred to the transfer substrate (in the "Transferring" mode).

Figure 48:
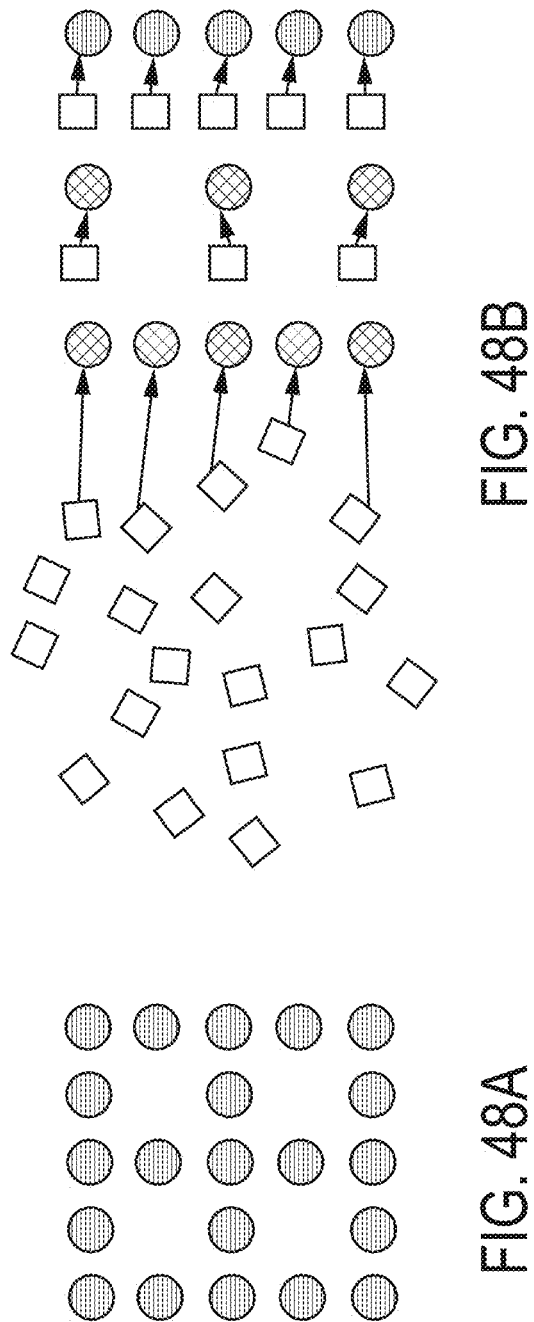
FIGS. 48A-48B illustrate example micro-objects and example target locations, in accordance with some embodiments of the present disclosure.

FIGS. 48A-48B illustrate example micro-objects and example target locations, in accordance with some embodiments of the present disclosure. The target areas may be represented by the circles and the micro-objects may be represented by the squares. As discussed above, the control component may use control patterns to move or direct micro-objects to one or more target locations. The control component (e.g., the target component of the control component) may use different target assignment algorithms to determine target locations (e.g., intermediate/staging target locations, final target locations, etc.). The control component may match micro-objects to target locations in a one-to-one fashion (e.g., one micro-object to one target location). The control component may also determine whether particular types of micro-objects should be directed to different target locations. For example, a target location may be for a specific type of particle (e.g., a dielectric particle, a glass based/amorphous solid particle, a metallic particle, an ellipse shaped particle, a square shaped particle, etc.).

In one embodiment, the control component may also take into account path planning of the micro-objects to avoid having micro-objects cross paths at close points in time. If micro-objects are lost or stuck, the target locations may be reassigned to other micro-objects. In addition, if some micro-objects are identified as being unusable (e.g., defective micro-objects or micro-objects that are not oriented correctly or flipped upside-down), some target locations may be generated in a "recycling" area. The unusable micro-objects may be moved to the target locations in the recycling area so that they may be moved out of the assembly area where the other micro-objects are being assembled and may eventually be removed from the micro-assembler.

The control component may also use different batches, groups, or sets of target locations and staging locations. This may be useful for continuous assembly of micro-objects into patterns. For example, this may allow a supply of micro-objects to be fed to the micro-assembler, assembled into patterns, and removed from the micro-assembler continuously (e.g., non-stop). The target locations may be introduced in sets, or batches, with each new batch being activated or used at some predefined point (such as when the previous batch of target locations are all filled with anchored micro-objects, or when the previous batch's particles have been transferred).

As discussed above, it may be useful to "stage" micro-objects that are not assigned to moving into their final target location, at staging target locations or intermediate target locations. For example, consider a target pattern such as that shown in portion A being assembled from left to right (e.g., transferred off of the micro-assembler occurs at the right hand side). As the rightmost column of the array of micro-objects is transferred, the next column of micro-objects will need to move to the right to position itself under the transfer mechanism, so these micro-objects will be ready and waiting at staging target locations to the left of the final target locations. As these micro-objects begin to move to the final target locations, the next set of micro-objects should be assigned to staging target locations and then into the final target locations, and so on. This example is illustrated in portion B of FIG. 48 with two sets of staging target locations.

Figure 49:
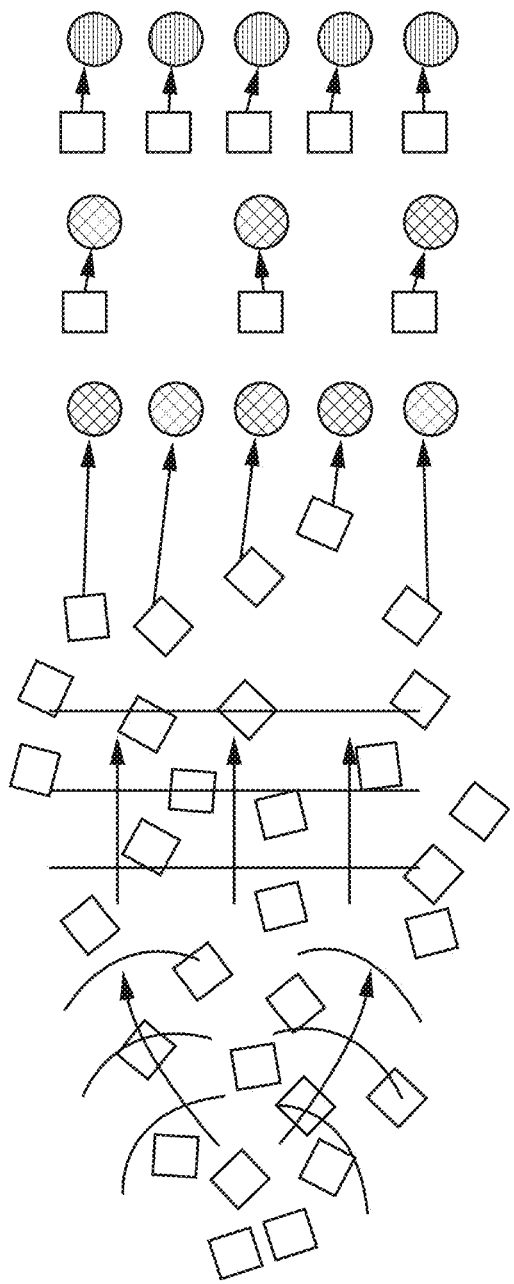
FIG. 49 is a diagram illustrating example micro-objects and example target locations, in accordance with some embodiments of the present disclosure.

FIG. 49 is a diagram illustrating example micro-objects and example target locations, in accordance with some embodiments of the present disclosure. The target areas may be represented by the circles and the micro-objects may be represented by the squares. As discussed above, the staging capability may help to speed up and scale up assembly of micro-objects even without transfer. In this case a line of final target locations may be added to the assembly pattern at each stage. This staging approach can be combined with one or more open-loop repeating control patterns to distribute incoming micro-objects, so that in the steady state micro-objects are spread and placed into the pool at one side of the micro-assembler in parallel with final assembly and transfer taking place at the other end of the micro-assembler.

For example, as illustrated in FIG. 49, the micro-objects on the left may be controlled using one or more control patterns to distribute the micro-objects to the intermediate staging areas (the two leftmost columns of circles), and finally to the final target locations (e.g., the rightmost column of circles). Although various operations may be described in a certain order, the order of the operations may vary in other embodiments. In particular, these operations need not be performed in the order indicated in the present disclosure. In addition, some operations may be added or removed in other embodiments.

Figure 50A:
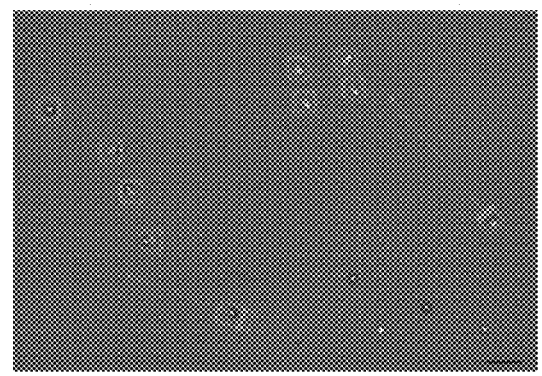
FIG. 50A is a diagram illustrating micro-objects of different types on a surface of a micro-assembler.

FIG. 50A is a diagram illustrating micro-objects of different types on a surface of a micro-assembler. Micro-objects of different types may be referred to as heterogeneous micro-objects. The green dots may represent Ag-coated glass beads that are 10 μm in size. The white dots may represent AlOx beads that are 10 μm in size. Different sets of control patterns may be used to manipulate the different types of micro-objects. For example, a first set of control patterns may be used to manipulate the AlOx beads and a second set of control patterns may be used to manipulate the Ag-coated glass beads. The different sets of control patterns may be used simultaneously or sequentially.

Figure 50B:
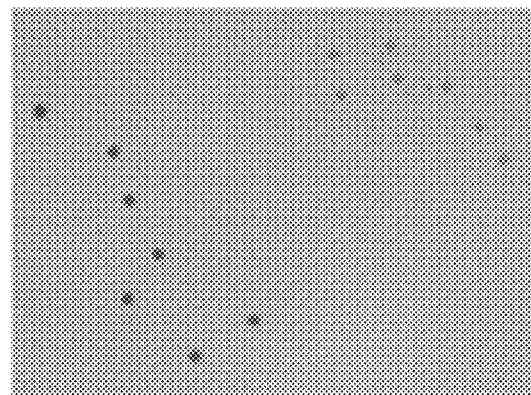
FIG. 50B is a diagram illustrating the micro-objects of FIG. 50A after the micro-objects have been moved to their respective target locations.

FIG. 50B is a diagram illustrating the micro-objects of FIG. 50A after the micro-objects have been moved to their respective target locations. As discussed above, there may be two types of micro-objects. The dark grey dots may represent Ag-coated glass beads that are 10 μm in size. The light grey dots may represent AlOx beads that are 10 μm in size. After moving the micro-objects to their respective target locations or positions, anchoring control patterns may be used to hold the micro-objects in place.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Embodiments of the claimed subject matter include, but are not limited to, various operations described herein.

These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims. The claims may encompass embodiments in hardware, software, or a combination thereof.

What is claimed is:

1. A method, comprising:
   depositing a set of micro-objects onto a surface of a micro-assembler, wherein the micro-assembler comprises a two-dimensional array of force generating pixels; and
   manipulating the set of micro-objects individually on the surface of the micro-assembler using a set of control patterns simultaneously, wherein each control pattern of the set of control patterns indicates a force pattern on a portion of the two-dimensional array of force generating pixels, and wherein manipulating the set of micro-objects comprises controlling orientations of the set of micro-objects in three dimensions relative to the surface of the micro-assembler.

2. The method of claim 1, wherein each control pattern of the set of control patterns further indicates a center position and an orientation for a respective force pattern.

3. The method of claim 1, wherein each control pattern of the set of control patterns is determined based on one or more of:
   user input provided by a user of the micro-assembler;
   an analysis of the set of micro-objects performed by a computing device; and
   a pre-determined order or timing for the set of control patterns.

4. The method of claim 1, wherein manipulating the set of micro-objects on the surface of the micro-assembler comprises:
   moving the set of micro-objects across the surface of the micro-assembler relative to one or more of a reference structure or a second set of micro-objects, using the set of control patterns.

5. The method of claim 1, wherein manipulating the set of micro-objects on the surface of the micro-assembler comprises:
   rotating the set of micro-objects with respect to the surface of the micro-assembler or relative to one or more of a reference structure or a second set of micro-objects, using the set of control patterns.

6. The method of claim 1, wherein manipulating the set of micro-objects on the surface of the micro-assembler comprises:
   distributing the set of micro-objects to random locations on the surface of the micro-assembler, using the set of control patterns.

7. The method of claim 1, wherein manipulating the set of micro-objects on the surface of the micro-assembler comprises:
   concentrating the set of micro-objects in an area on the surface of the micro-assembler, using the set of control patterns.

8. The method of claim 1, wherein manipulating the set of micro-objects on the surface of the micro-assembler comprises:
   deconcentrating the set of micro-objects from an area on the surface of the micro-assembler, using the set of control patterns.

9. The method of claim 1, wherein manipulating the set of micro-objects on the surface of the micro-assembler comprises:
   holding the set of micro-objects in an area of the surface of the micro-assembler to resist one or more forces which may include one or more of shear forces, drag forces, electrophoretic forces or dielectrophoretic forces, electroosmotic forces, using the set of control patterns.

10. The method of claim 1, further comprising:
    manipulating a second set of micro-objects on the surface of the micro-assembler using a second set of control patterns, wherein manipulating the set of micro-objects and manipulating the second set of micro-objects occur simultaneously.

11. The method of claim 1, wherein manipulating the set of micro-objects on the surface of the micro-assembler comprises:
    forming the set of micro-objects into a pattern on the surface of the micro-assembler.

12. The method of claim 1, wherein manipulating the set of micro-objects on the surface of the micro-assembler comprises:

manipulating a first subset of the set of micro-objects and a second subset of set of micro-objects simultaneously.

13. The method of claim 1, wherein manipulating the set of micro-objects on the surface of the micro-assembler comprises:
 manipulating the set of micro-objects using different subsets of the set of control patterns over different periods of time, wherein each subset of the set of control patterns is used during a respective period of time.

* * * * *